(12) United States Patent
Shin et al.

(10) Patent No.: US 12,137,613 B2
(45) Date of Patent: Nov. 5, 2024

(54) POLYCYCLIC COMPOUND AND ORGANOELECTRO LUMINESCENT DEVICE USING SAME

(71) Applicant: SFC CO., LTD, Cheongju-si (KR)

(72) Inventors: Bong-ki Shin, Cheongju-si (KR);
Sung-hoon Joo, Cheongju-si (KR);
Byung-sun Yang, Cheongju-si (KR);
Ji-hwan Kim, Cheongju-si (KR);
Hyeon-jun Jo, Cheongju-si (KR);
Sung-eun Choi, Cheongju-si (KR)

(73) Assignee: SFC Co., Ltd., Cheongju-si (KR)

( * ) Notice: Subject to any disclaimer, the term of this patent is extended or adjusted under 35 U.S.C. 154(b) by 100 days.

(21) Appl. No.: 17/767,819

(22) PCT Filed: Oct. 12, 2020

(86) PCT No.: PCT/KR2020/013884
§ 371 (c)(1),
(2) Date: Apr. 8, 2022

(87) PCT Pub. No.: WO2021/071345
PCT Pub. Date: Apr. 15, 2021

(65) Prior Publication Data
US 2024/0122070 A1 Apr. 11, 2024

(30) Foreign Application Priority Data

Oct. 10, 2019 (KR) .................. 10-2019-0125323

(51) Int. Cl.
*H10K 85/60* (2023.01)
*C09K 11/06* (2006.01)
*H10K 85/40* (2023.01)

(52) U.S. Cl.
CPC ............ *H10K 85/658* (2023.02); *C09K 11/06* (2013.01); *H10K 85/40* (2023.02); *H10K 85/615* (2023.02); *H10K 85/631* (2023.02); *H10K 85/6572* (2023.02); *H10K 85/6574* (2023.02); *H10K 85/6576* (2023.02); *C07B 2200/05* (2013.01)

(58) Field of Classification Search
CPC ..... H10K 85/658; H10K 85/615; C09K 11/06
See application file for complete search history.

(56) References Cited

U.S. PATENT DOCUMENTS

| | | | |
|---|---|---|---|
| 11,495,751 B2 * | 11/2022 | Parham | H10K 85/615 |
| 2018/0069182 A1 | 3/2018 | Hatakeyama et al. | |
| 2020/0395548 A1 * | 12/2020 | Eickhoff | H10K 85/6576 |
| 2021/0167288 A1 * | 6/2021 | Hatakeyama | C09K 11/06 |
| 2022/0006012 A1 * | 1/2022 | Hatakeyama | H10K 85/615 |
| 2022/0069231 A1 * | 3/2022 | Parham | C07D 401/04 |
| 2022/0332724 A1 * | 10/2022 | Parham | H10K 85/6574 |
| 2023/0083303 A1 | 3/2023 | Schaefer et al. | |

FOREIGN PATENT DOCUMENTS

| | | |
|---|---|---|
| CN | 114026101 A | 2/2022 |
| JP | 2012-234873 A | 11/2012 |
| JP | 2018-43984 A | 3/2018 |
| KR | 10-2015-0033272 A | 4/2015 |
| KR | 10-2017-0011947 A | 2/2017 |
| KR | 10-2019-0113861 A | 10/2019 |
| KR | 10-2020-0065174 A | 6/2020 |
| KR | 10-2020-0099107 A | 8/2020 |
| KR | 10-2020-0121228 A | 10/2020 |
| WO | WO 2015/144133 | 10/2015 |

OTHER PUBLICATIONS

Chinese Office Action issued on Apr. 27, 2023, in counterpart Chinese Patent Application No. 202080084977.X (12 pages in English, 10 pages in Chinese).
International Search Report issued on Mar. 16, 2021, in counterpart PCT Patent Application No. PCT/KR2020/013884 (3 pages in Korean).

* cited by examiner

*Primary Examiner* — Thao P Le
(74) *Attorney, Agent, or Firm* — NSIP Law

(57) ABSTRACT

The present invention relates to a novel polycyclic compound employed in an organic layer of an organoelectro luminescent device, wherein the organoelectro luminescent device employing the compound according to the present invention has remarkably improved luminous efficiency and a long lifespan. According to the present invention, it is possible to implement a highly efficient and long-life organoelectro luminescent device that can be effectively applied to various display devices.

20 Claims, No Drawings

POLYCYCLIC COMPOUND AND ORGANOELECTRO LUMINESCENT DEVICE USING SAME

CROSS REFERENCE TO RELATED APPLICATIONS

This application is a U.S. National Stage Application of International Application No. PCT/KR2020/013884, filed on Oct. 12, 2020, which claims the benefit under 35 USC 119 (a) and 365 (b) of Korean Patent Application No. 10-2019-0125323, filed on Oct. 10, 2019 in the Korean Intellectual Property Office, the entire disclosure of which is incorporated herein by reference for all purposes.

TECHNICAL FIELD

The present invention relates to a polycyclic compound and a highly efficient and long-lasting organic electroluminescent device with significantly improved luminous efficiency using the polycyclic compound.

BACKGROUND ART

Organic electroluminescent devices are self-luminous devices in which electrons injected from an electron injecting electrode (cathode) recombine with holes injected from a hole injecting electrode (anode) in a light emitting layer to form excitons, which emit light while releasing energy. Such organic electroluminescent devices have the advantages of low driving voltage, high luminance, large viewing angle, and short response time and can be applied to full-color light emitting flat panel displays. Due to these advantages, organic electroluminescent devices have received attention as next-generation light sources.

The above characteristics of organic electroluminescent devices are achieved by structural optimization of organic layers of the devices and are supported by stable and efficient materials for the organic layers, such as hole injecting materials, hole transport materials, light emitting materials, electron transport materials, electron injecting materials, and electron blocking materials. However, more research still needs to be done to develop structurally optimized organic layers for organic electroluminescent devices and stable and efficient materials for organic layers of organic electroluminescent devices.

As such, there is a continued need to develop structures of organic electroluminescent devices optimized to improve their luminescent properties and new materials capable of supporting the optimized structures of organic electroluminescent devices.

DETAILED DESCRIPTION OF THE INVENTION

Problems to be Solved by the Invention

Accordingly, the present invention intends to provide an organic electroluminescent compound that is employed in an organic layer of an organic electroluminescent device to achieve high efficiency and long lifetime of the device, and a highly efficient and long-lasting organic electroluminescent device including the organic electroluminescent compound.

Means for Solving the Problems

One aspect of the present invention provides an organic electroluminescent compound represented by Formula A:

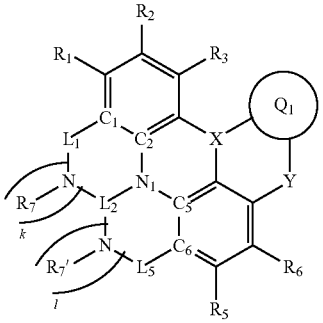

[Formula A]

or Formula B:

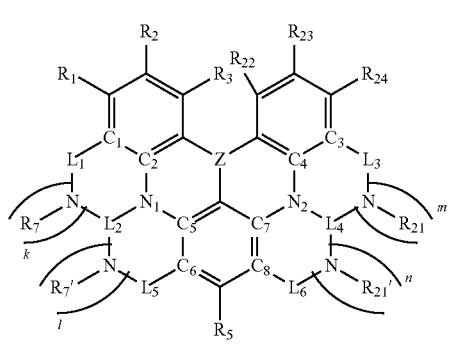

[Formula B]

More specific structures of Formulae A and B, definitions of the substituents in Formulae A and B, and specific polycyclic compounds that can be represented by Formulae A and B are described below.

A further aspect of the present invention provides an organic electroluminescent device including a first electrode, a second electrode opposite to the first electrode, and one or more organic layers interposed between the first and second electrodes wherein one of the organic layers includes at least one of the specific polycyclic compounds that can be represented by Formula A or B.

Effects of the Invention

The polycyclic compound of the present invention can be employed in an organic layer of an organic electroluminescent device to achieve high efficiency and long lifetime of the device.

Best Mode for Carrying out the Invention

The present invention will now be described in more detail.

The present invention is directed to a polycyclic compound represented by Formula A:

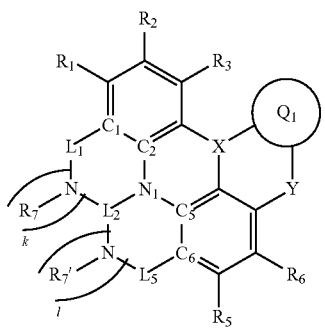

[Formula A]

wherein X is selected from B, N, CR$_8$, SiR$_9$, P, P=O, and P=S,

Y is a single bond or a divalent group selected from the following structures Y-1 to Y-11:

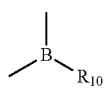 (Y-1)

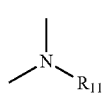 (Y-2)

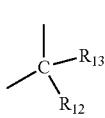 (Y-3)

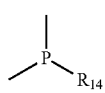 (Y-4)

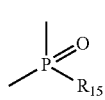 (Y-5)

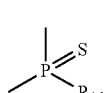 (Y-6)

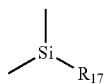 (Y-7)

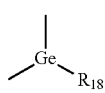 (Y-8)

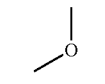 (Y-9)

 (Y-10)

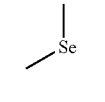 (Y-11)

$Q_1$ is a 3- to 8-membered monocyclic or polycyclic aliphatic, aromatic or non-aromatic ring optionally containing at least one hydrocarbon or heteroatom, $C_1$, $C_2$, $C_5$, and $C_6$ are carbon atoms (C), $N_1$ is a nitrogen atom (N), $L_1$, $L_2$, and $L_5$ are identical to or different from each other and are single bonds or substituted or unsubstituted aliphatic linkers connecting $C_1$ to N—R$_7$, $N_1$ to N—R$_7$ and N—R$_7$', and $C_6$ to N—R$_7$', respectively, that optionally contain at least one hydrocarbon or heteroatom, each of k and l is an integer of 0 or 1, with the proviso that k and l are not simultaneously zero, and $R_1$ to $R_{18}$ and $R_7$' are identical to or different from each other and are each independently selected from hydrogen, deuterium, substituted or unsubstituted $C_1$-$C_{30}$ alkyl, $C_2$-$C_{24}$ alkenyl, $C_2$-$C_{24}$ alkynyl, substituted or unsubstituted $C_6$-$C_{50}$ aryl, substituted or unsubstituted $C_3$-$C_{30}$ cycloalkyl, substituted or unsubstituted $C_1$-$C_{30}$ heterocycloalkyl, substituted or unsubstituted $C_1$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, substituted or unsubstituted $C_6$-$C_{30}$ arylsilyl, nitro, cyano, halogen, and substituted or unsubstituted $C_1$-$C_{30}$ non-aromatic rings, with the proviso that each of $R_1$ to $R_{18}$, $R_7$', $L_1$, $L_2$, $L_5$, $Q_1$, and their substituents optionally forms a substituted or unsubstituted ring with an adjacent substituent; or Formula B:

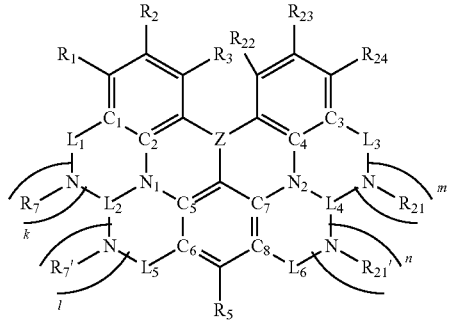

[Formula B]

wherein Z is selected from B, P, P=O, and P=S, $C_1$, $C_2$, $C_3$, $C_4$, $C_5$, $C_6$, $C_7$, and $C_8$ are carbon atoms (C), $N_1$ and $N_2$ are nitrogen atoms (N), $L_1$, $L_2$, and $L_5$ are identical to or different from each other and are single bonds or substituted or unsubstituted aliphatic linkers connecting $C_1$ to N—R$_7$, $N_1$ to N—R$_7$ and N—R$_7$', and $C_6$ to N—R$_7$', respectively, that optionally contain at least one hydrocarbon or heteroatom, $L_3$, $L_4$, and $L_6$ are identical to or different from each other and are single bonds or substituted or unsubstituted aliphatic linkers connecting $C_3$ to N—R$_{21}$, $N_2$ to N—R$_{21}$ and N—R$_{21}$', and Cs to N—R$_{21}$', respectively, that optionally contain at least one hydrocarbon or heteroatom, each of k, l, m, and n is an integer of 0 or 1, with the proviso that k, l, m, and n are not simultaneously zero, and R$_1$ to R$_7$, R$_7'$, R$_{21}'$, and R$_{21}$ to R$_{24}$ are identical to or different from each other and are each independently selected from hydrogen, deuterium, substituted or unsubstituted C$_1$-C$_{30}$ alkyl, C$_2$-C$_{24}$ alkenyl, C$_2$-C$_{24}$ alkynyl, substituted or unsubstituted C$_6$-C$_{50}$ aryl, substituted or unsubstituted C$_3$-C$_{30}$ cycloalkyl, substituted or unsubstituted C$_1$-C$_{30}$ heterocycloalkyl, substituted or unsubstituted C$_1$-C$_{50}$ heteroaryl, substituted or unsubstituted C$_1$-C$_{30}$ alkoxy, substituted or unsubstituted C$_6$-C$_{30}$ aryloxy, substituted or unsubstituted C$_1$-C$_{30}$ alkylthioxy, substituted or unsubstituted C$_6$-C$_{30}$ arylthioxy, substituted or unsubstituted C$_1$-C$_{30}$ alkylamine, substituted or unsubstituted C$_6$-C$_{30}$ arylamine, substituted or unsubstituted C$_1$-C$_{30}$ alkylsilyl, substituted or unsubstituted C$_6$-C$_{30}$ arylsilyl, nitro, cyano, halogen, and substituted or unsubstituted C$_1$-C$_{30}$ non-aromatic rings, with the proviso that each of R$_1$ to R$_7$, R$_7'$, R$_{21}'$, R$_{21}$ to R$_{24}$, L$_1$, L$_2$, L$_3$, L$_4$, L$_5$, L$_6$, and their substituents optionally forms a substituted or unsubstituted ring with an adjacent substituent.

In Formula A, Q$_1$ is optionally further substituted with one or more substituents.

In Formula A, L$_1$, L$_2$, and L$_5$ are optionally further substituted with one or more substituents. The aliphatic linkers refer to saturated or unsaturated linking groups selected from alkylene, alkenylene, alkynylene, and combinations thereof. When the aliphatic linkers are alkenylene groups, R$_7$ in N—R$_7$ and R$_7'$ in N—R$_7'$ may be undefined, that is, R$_7$ and R$_7'$ may be excluded from Formula A, considering the chemical bond of N in N—R$_7$ and N—R$_7'$.

Specifically, each of R$_1$ to R$_{18}$, R$_7'$, L$_1$, L$_2$, L$_5$, Q$_1$, and their substituents may optionally form a substituted or unsubstituted aliphatic, aromatic or non-aromatic ring containing at least one hydrocarbon or heteroatom. Preferably, R$_3$, Q$_1$, and their substituents are optionally bonded together to form a substituted or unsubstituted aliphatic, aromatic or non-aromatic ring containing at least one hydrocarbon or heteroatom. These specific structures can be found in the specific compounds that are exemplified below.

In Formula B, L$_1$, L$_2$, and L$_5$ are optionally further substituted with one or more substituents and L$_3$, L$_4$, and L$_6$ are optionally further substituted with one or more substituents. The aliphatic linkers refer to saturated or unsaturated linking groups selected from alkylene, alkenylene, alkynylene, and combinations thereof. When the aliphatic linkers are alkenylene groups, R$_7'$ in N—R$_7'$, R$_7$ in N—R$_7$, R$_{21}'$ in N—R$_{21}'$, and R$_{21}$ in N—R$_{21}$ may be undefined, that is, R$_7'$, R$_7$, R$_{21}'$, and R$_{21}$ may be excluded from Formula B, considering the chemical bond of N in N—R$_7'$, N—R$_7$, N—R$_{21}'$, and N—R$_{21}$. Specifically, each of R$_1$ to R$_7$, R$_7'$, R$_{21}'$, R$_{21}$ to R$_{24}$, L$_1$, L$_2$, L$_3$, L$_4$, L$_5$, L$_6$, and their substituents may optionally form a substituted or unsubstituted aliphatic, aromatic or non-aromatic ring containing at least one hydrocarbon or heteroatom. Preferably, R$_3$, R$_{22}$, and their substituents are optionally bonded together to form a substituted or unsubstituted aliphatic, aromatic or non-aromatic ring containing at least one hydrocarbon or heteroatom. These specific structures can be found in the specific compounds that are exemplified below.

The polycyclic compound of the present invention can be used to fabricate a highly efficient and long-lasting organic electroluminescent device.

As used herein, the term "substituted" and "further substituted with substituents" indicates substitution with one or more substituents selected from deuterium, cyano, halogen, hydroxyl, nitro, C$_1$-C$_{24}$ alkyl, C$_3$-C$_{24}$ cycloalkyl, C$_1$-C$_{24}$ haloalkyl, C$_1$-C$_{24}$ alkenyl, C$_1$-C$_{24}$ alkynyl, C$_1$-C$_{24}$ heteroalkyl, C$_1$-C$_{24}$ heterocycloalkyl, C$_6$-C$_{24}$ aryl, C$_1$-C$_{24}$ arylalkyl, C$_2$-C$_{24}$ heteroaryl, C$_2$-C$_{24}$ heteroarylalkyl, C$_1$-C$_{24}$ alkoxy, C$_1$-C$_{24}$ alkylamino, C$_1$-C$_{24}$ arylamino, C$_1$-C$_{24}$ heteroarylamino, C$_1$-C$_{24}$ alkylsilyl, C$_1$-C$_{24}$ arylsilyl, and C$_1$-C$_{24}$ aryloxy, or a combination thereof. As used herein, the term "unsubstituted" indicates having no substituent.

In the "substituted or unsubstituted C$_1$-C$_{30}$ alkyl", "substituted or unsubstituted C$_6$-C$_{50}$ aryl", etc., the number of carbon atoms in the alkyl or aryl group indicates the number of carbon atoms constituting the unsubstituted alkyl or aryl moiety without considering the number of carbon atoms in the substituent(s). For example, a phenyl group substituted with a butyl group at the para-position corresponds to a C$_6$ aryl group substituted with a C$_4$ butyl group.

As used herein, the expression "form a ring with an adjacent substituent" means that the corresponding substituent combines with an adjacent substituent to form a substituted or unsubstituted aliphatic, aromatic or non-aromatic ring containing at least one hydrocarbon or heteroatom and the term "adjacent substituent" may mean a substituent on an atom directly attached to an atom substituted with the corresponding substituent, a substituent disposed sterically closest to the corresponding substituent or another substituent on an atom substituted with the corresponding substituent. For example, two substituents substituted at the ortho position of a benzene ring or two substituents on the same carbon in an aliphatic ring may be considered "adjacent" to each other.

The definitions of the terms "aliphatic ring", "aliphatic linker", "aromatic ring", and "non-aromatic ring" are as follows.

The aliphatic ring refers to a saturated or unsaturated ring consisting of alkylene, alkenylene, and/or alkynylene and optionally containing at least one hydrocarbon or heteroatom. The aliphatic linker also refers to a saturated or unsaturated linking group selected from alkylene, alkenylene, alkynylene, and combinations thereof.

Specifically, the aromatic ring may be, for example, naphthalene, anthracene, benzanthracene, benzopyrene, acenaphthylene, 1,2-dihydro acenaphthylene, phenanthrene, chrysene, indenopyrene, fluorene, fluoranthene, benzacephenanthrylene, benzoperylene, pyrene, benzofluoranthene or dibenzanthracene.

Specific examples of non-aromatic rings include, but are not limited to, the following structures:

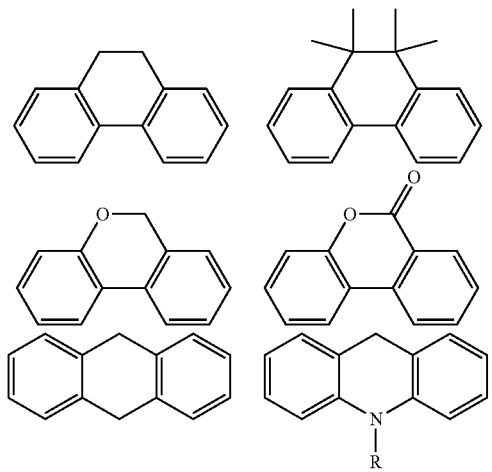

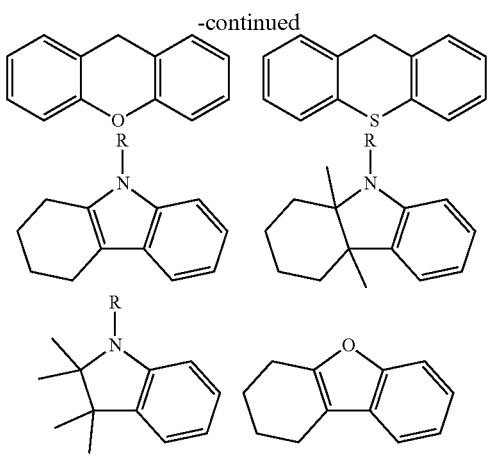

The other substituents are known to those skilled in the art to which the present invention pertains. The alkyl groups may be straight or branched, and the numbers of carbon atoms therein are not particularly limited but are preferably 1 to 20. Specific examples of the alkyl groups include, but are not limited to, methyl, ethyl, propyl, n-propyl, isopropyl, butyl, n-butyl, isobutyl, tert-butyl, sec-butyl, 1-methylbutyl, 1-ethylbutyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethylpropyl, isohexyl, 2-methylpentyl, 4-methylhexyl, and 5-methylhexyl groups.

The alkenyl group is intended to include straight and branched ones and may be optionally substituted with one or more other substituents. The alkenyl group may be specifically a vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, stilbenyl or styrenyl group but is not limited thereto.

The alkynyl group is intended to include straight and branched ones and may be optionally substituted with one or more other substituents. The alkynyl group may be, for example, ethynyl or 2-propynyl but is not limited thereto.

The cycloalkyl group is intended to include monocyclic and polycyclic ones and may be optionally substituted with one or more other substituents. As used herein, the term "polycyclic" means that the cycloalkyl group may be directly attached or fused to one or more other cyclic groups. The other cyclic groups may be cycloalkyl groups and other examples thereof include heterocycloalkyl, aryl, and heteroaryl groups. The cycloalkyl group may be specifically a cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl or cyclooctyl group but is not limited thereto.

The heterocycloalkyl group is intended to include monocyclic and polycyclic ones interrupted by a heteroatom such as O, S, Se, N or Si and may be optionally substituted with one or more other substituents. As used herein, the term "polycyclic" means that the heterocycloalkyl group may be directly attached or fused to one or more other cyclic groups.

The other cyclic groups may be heterocycloalkyl groups and other examples thereof include cycloalkyl, aryl, and heteroaryl groups.

The aryl groups may be monocyclic or polycyclic ones. Examples of the monocyclic aryl groups include, but are not limited to, phenyl, biphenyl, terphenyl, and stilbenyl groups. Examples of the polycyclic aryl groups include naphthyl, anthracenyl, phenanthrenyl, pyrenyl, perylenyl, tetracenyl, chrysenyl, fluorenyl, acenaphathcenyl, triphenylene, and fluoranthrene groups but the scope of the present invention is not limited thereto.

The heteroaryl groups refer to heterocyclic groups interrupted by one or more heteroatoms. Examples of the heteroaryl groups include, but are not limited to, thiophene, furan, pyrrole, imidazole, triazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phthalazinyl, pyridopyrimidinyl, pyridopyrazinyl, pyrazinopyrazinyl, isoquinoline, indole, carbazole, benzoxazole, benzimidazole, benzothiazole, benzocarbazole, benzothiophene, dibenzothiophene, benzofuranyl, dibenzofuranyl, phenanthroline, thiazolyl, isoxazolyl, oxadiazolyl, thiadiazolyl, benzothiazolyl, and phenothiazinyl groups.

The alkoxy group may be specifically a methoxy, ethoxy, propoxy, isobutyloxy, sec-butyloxy, pentyloxy, iso-amyloxy or hexyloxy group but is not limited thereto.

The silyl group is intended to include alkyl-substituted silyl groups and aryl-substituted silyl groups. Specific examples of such silyl groups include trimethylsilyl, triethylsilyl, triphenylsilyl, trimethoxysilyl, dimethoxyphenylsilyl, diphenylmethylsilyl, diphenylvinylsilyl, methylcyclobutylsilyl, and dimethylfurylsilyl.

The amine groups may be, for example, —NH$_2$, alkylamine groups, arylamine groups, and arylheteroarylamine groups. The arylamine groups are aryl-substituted amine groups, the alkylamine groups are alkyl-substituted amine groups, and the arylheteroarylamine groups are aryl- and heteroaryl-substituted amine groups. Examples of the arylamine groups include substituted or unsubstituted monoarylamine groups, substituted or unsubstituted diarylamine groups, and substituted or unsubstituted triarylamine groups. The aryl moieties in the arylamine groups and the aryl and heteroaryl moieties in the arylheteroarylamine groups may be monocyclic or polycyclic ones. The arylamine groups may include two or more aryl moieties. In this case, the aryl moieties may be monocyclic aryl moieties, monocyclic heteroaryl moieties, polycyclic aryl moieties or polycyclic heteroaryl moieties. Alternatively, the aryl moieties may consist of a monocyclic aryl (or heteroaryl) moiety and a polycyclic aryl (or heteroaryl) moiety. The aryl moieties in the arylamine groups and the aryl and heteroaryl moieties in the arylheteroarylamine groups may be selected from those exemplified above.

The aryl moieties in the aryloxy group and the arylthioxy group are the same as those described above for the aryl groups. Specific examples of the aryloxy groups include, but are not limited to, phenoxy, p-tolyloxy, m-tolyloxy, 3,5-dimethylphenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, and 9-phenanthryloxy groups. The arylthioxy group may be, for example, a phenylthioxy, 2-methylphenylthioxy or 4-tert-butylphenylthioxy group but is not limited thereto.

The halogen group may be, for example, fluorine, chlorine, bromine or iodine. More specifically, the polycyclic compound represented by Formula A or B according to the present invention may be selected from, but not limited to, the following compounds 1 to 156:
1
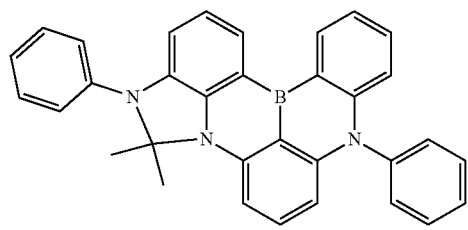
2
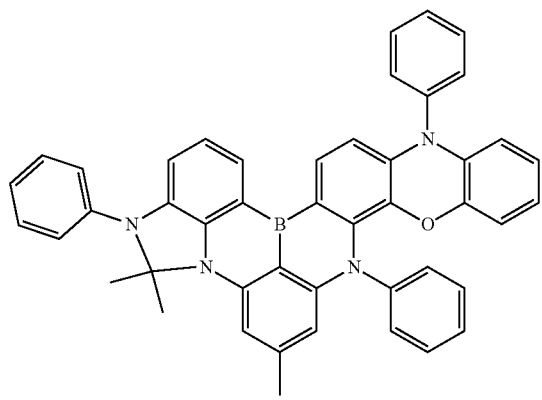
3
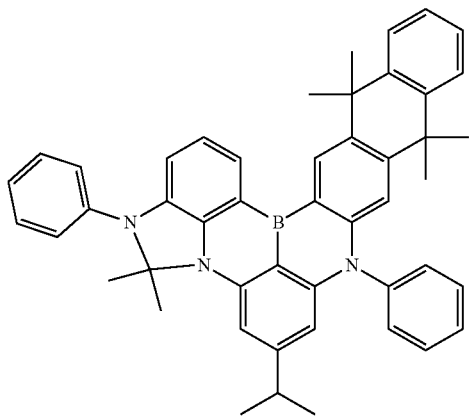
4
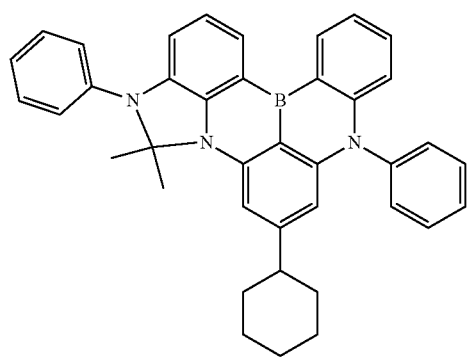
-continued
5
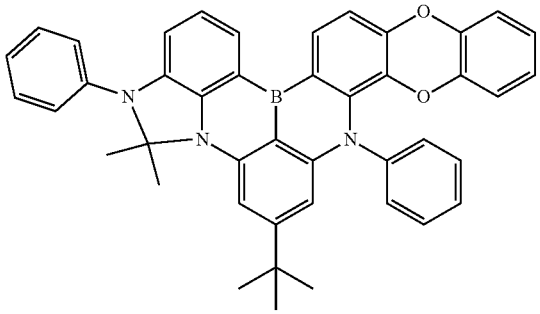
6
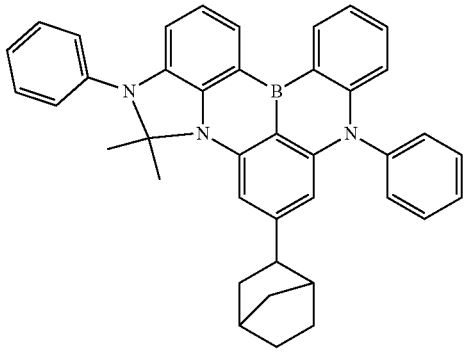
7
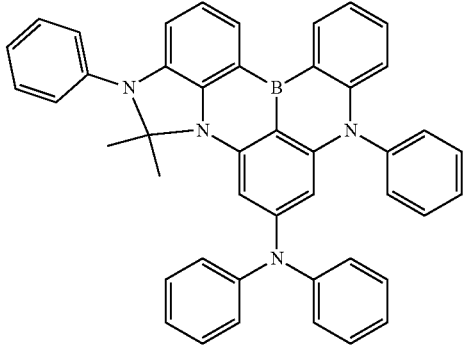
8
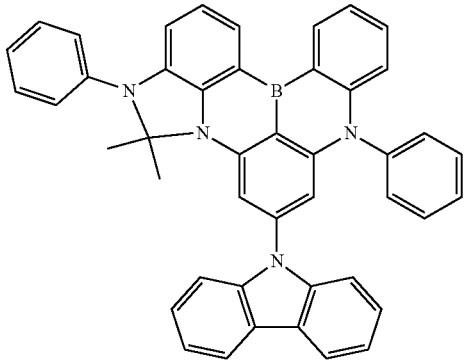

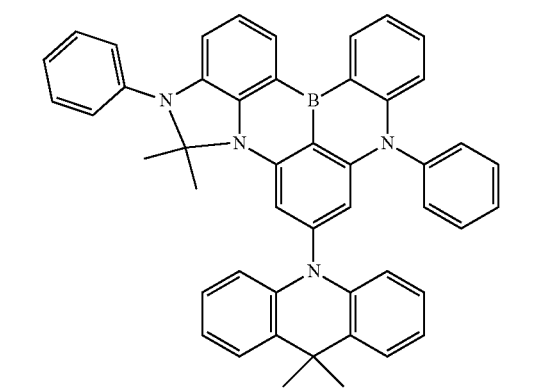
9
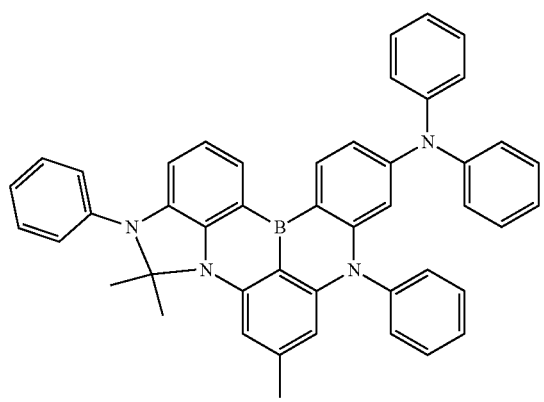
10
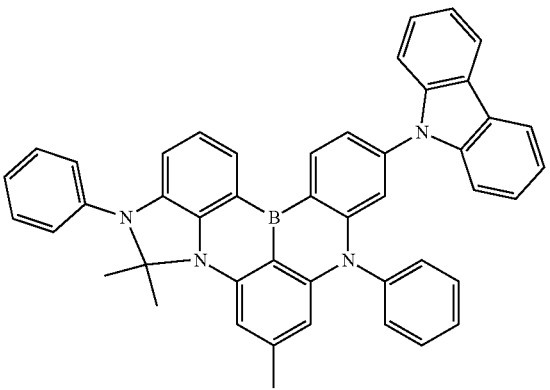
11
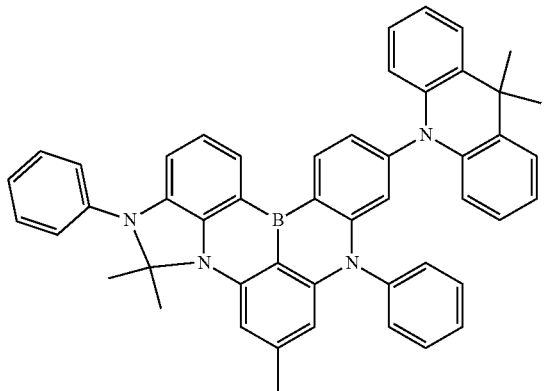
12
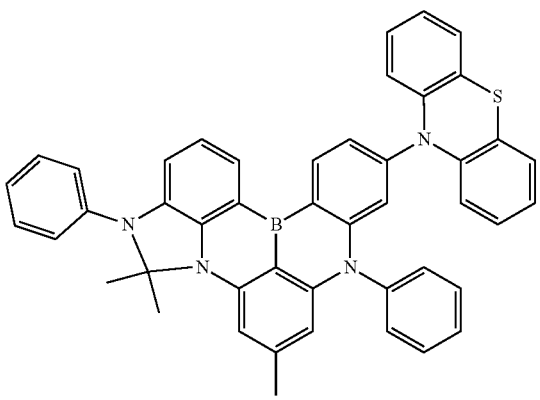
13
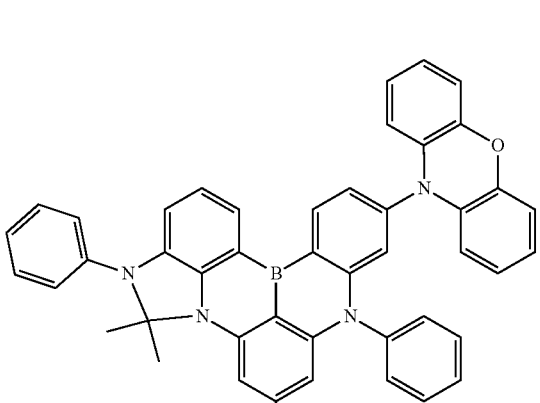
14
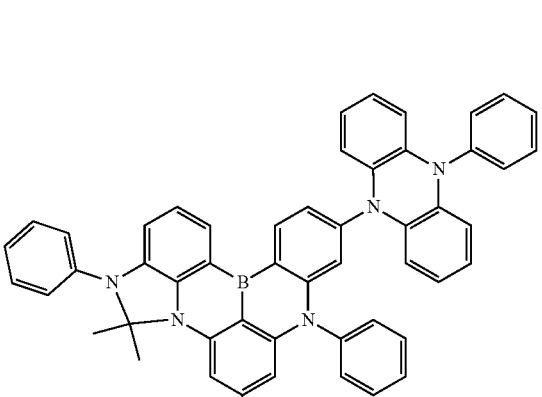
15
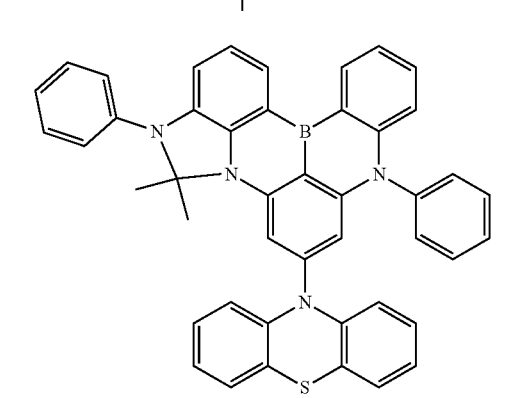
16

17
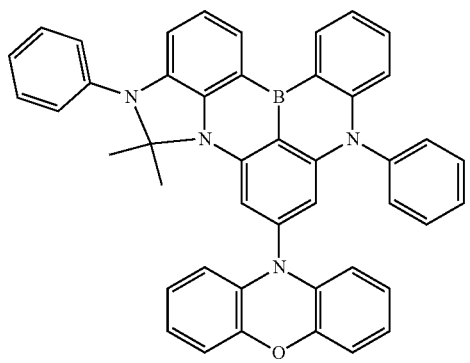
18
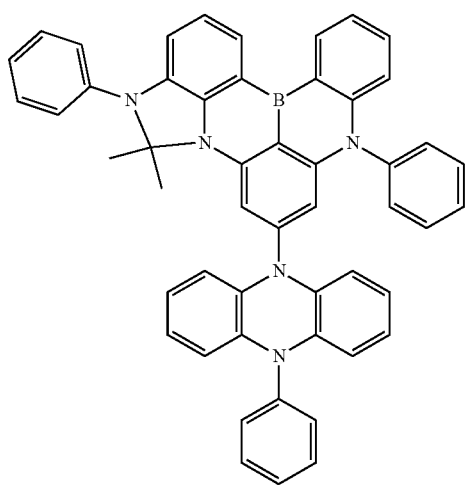
19
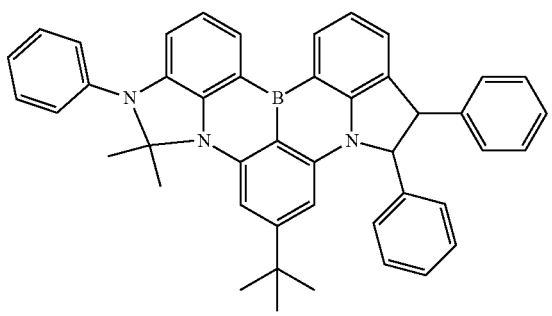
20
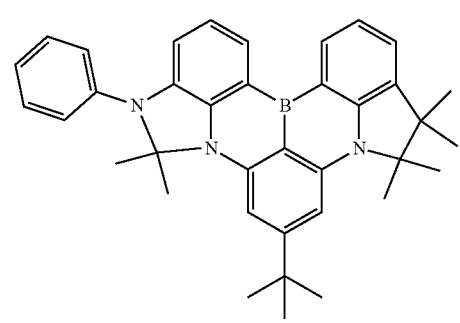
21
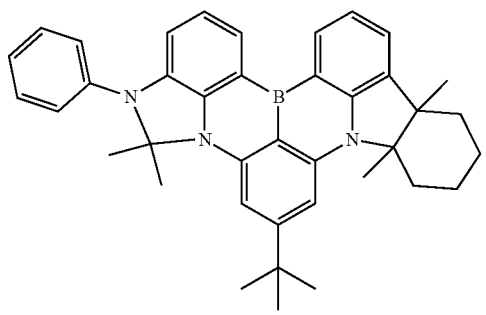
22
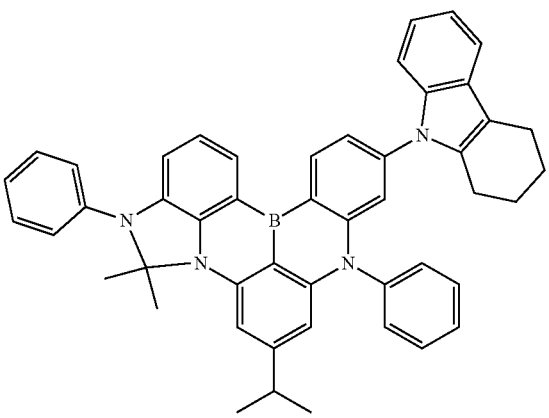
23
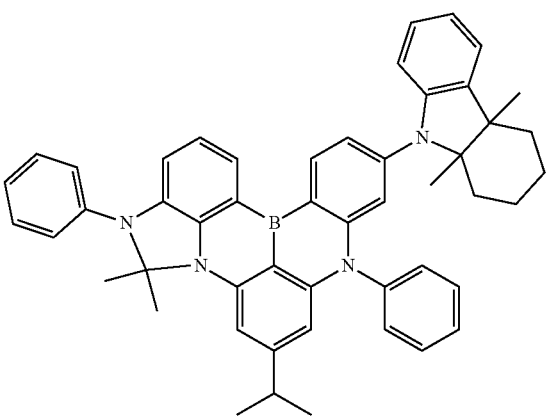
24
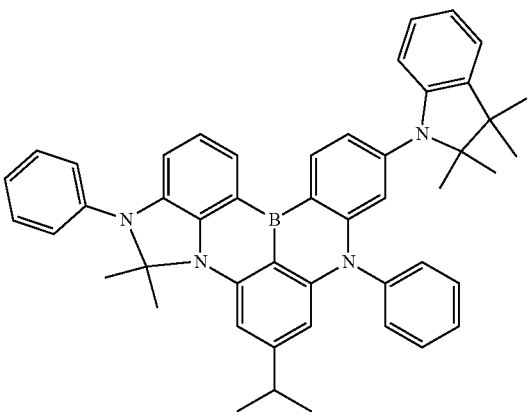

25
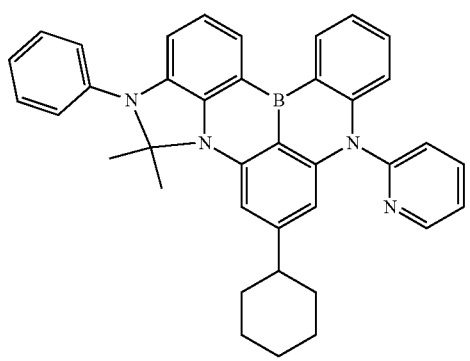
26
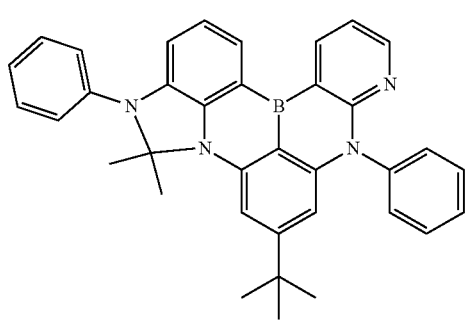
27
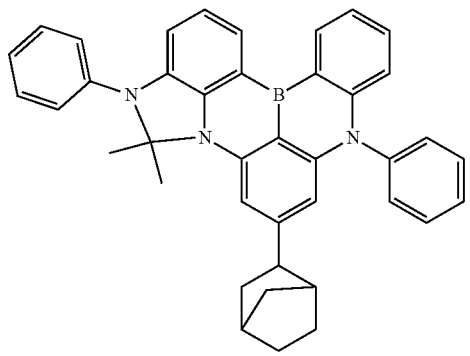
28
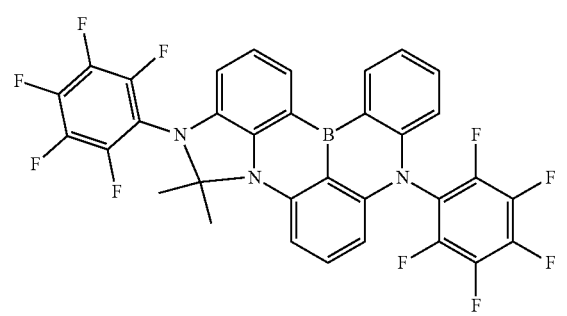
29
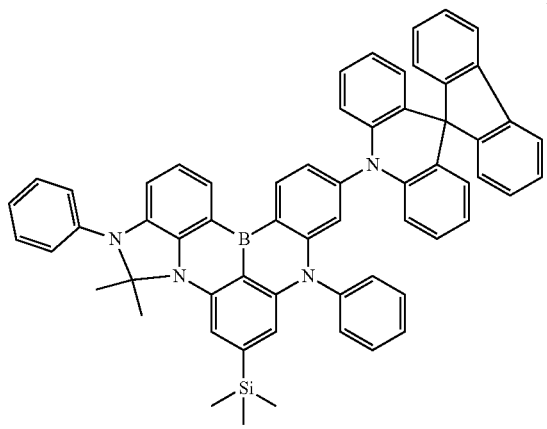
30
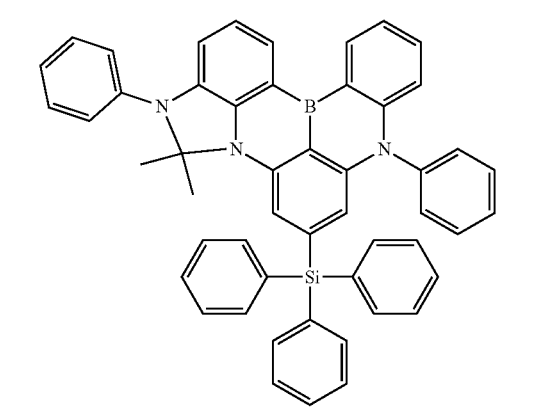
31
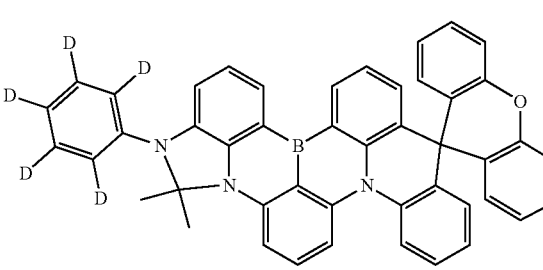
32
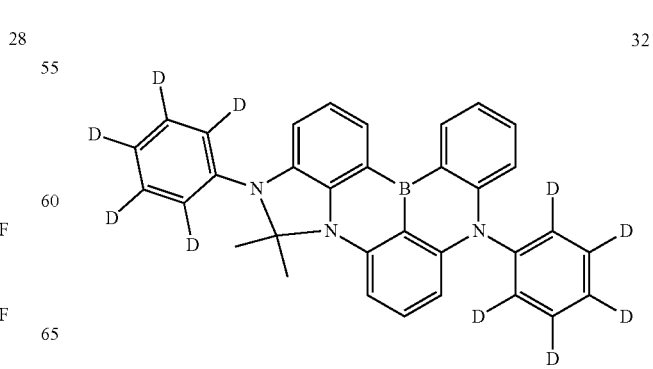

33
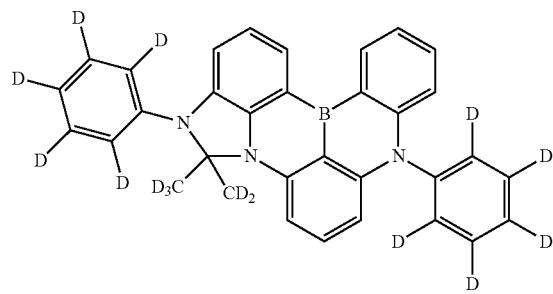
34
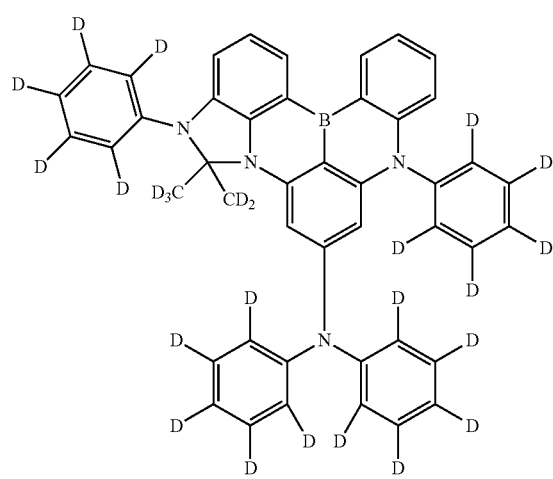
35
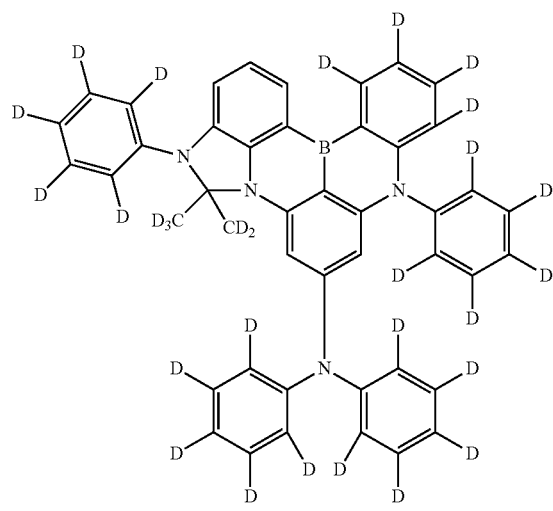
36
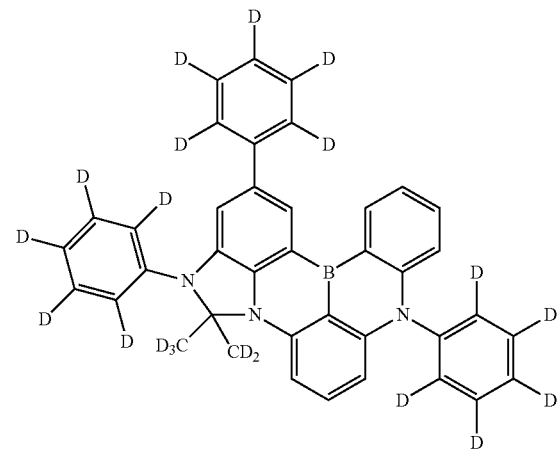
37
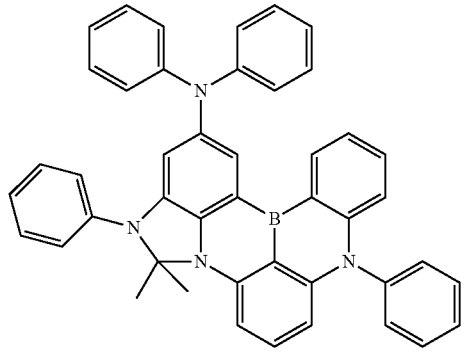
38
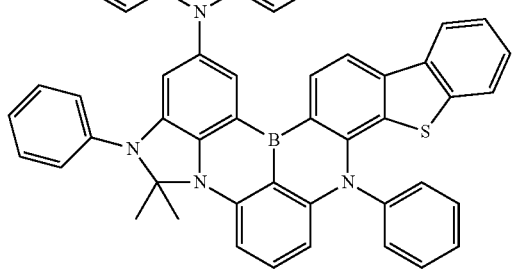
39
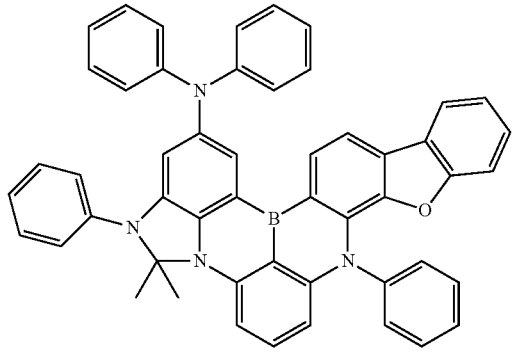

40
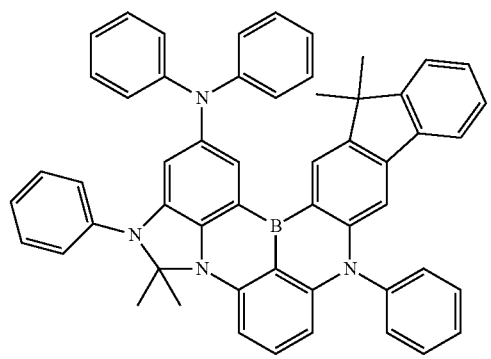
41
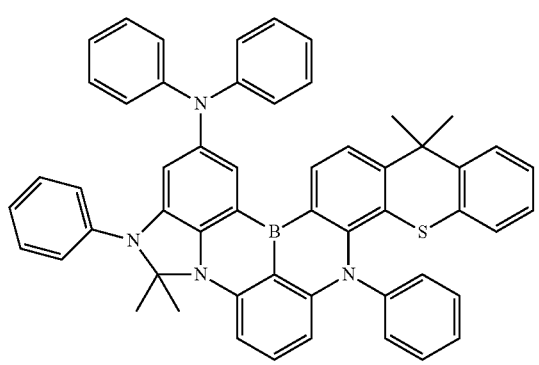
42
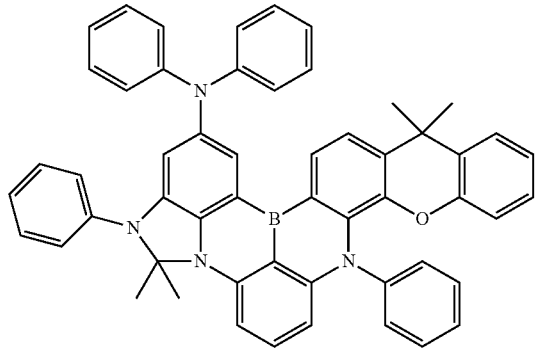
43
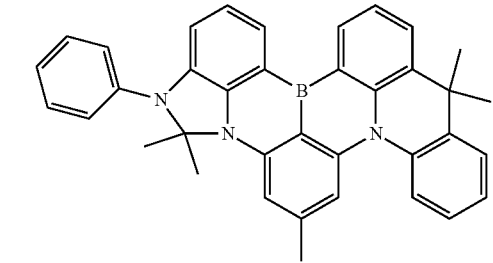
44
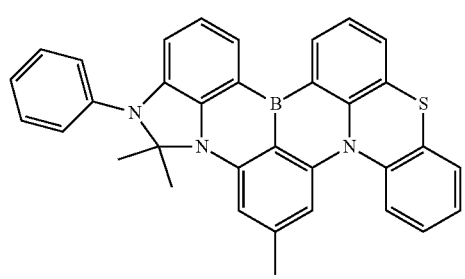
45
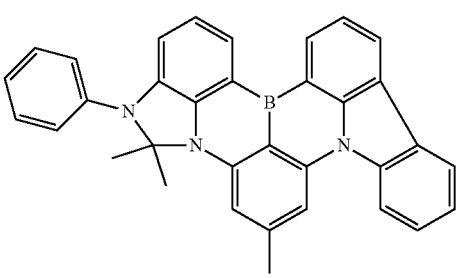
46
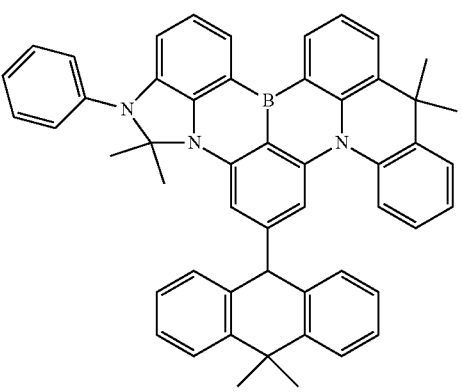
47
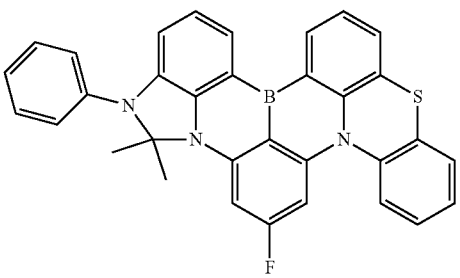
48
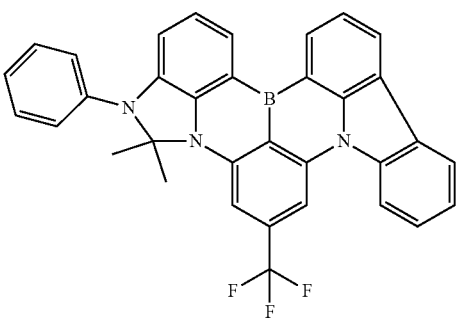
49
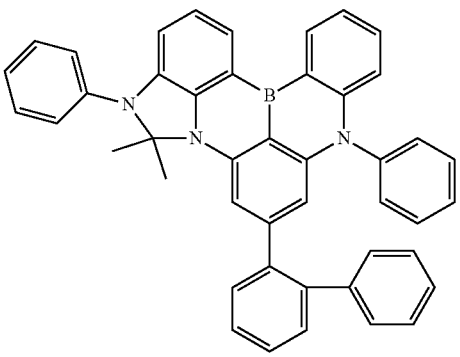

50
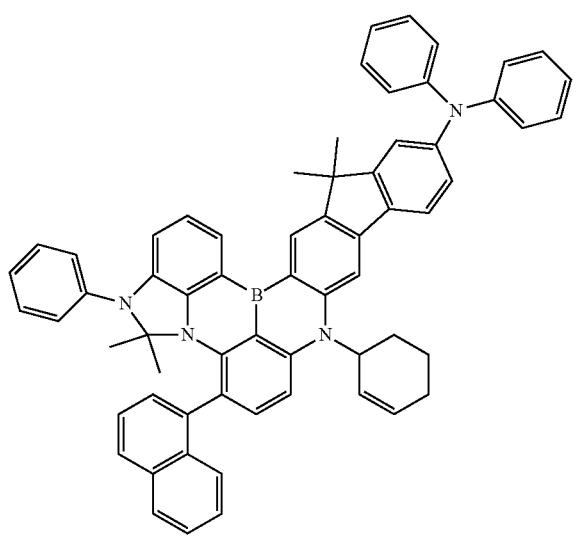
51
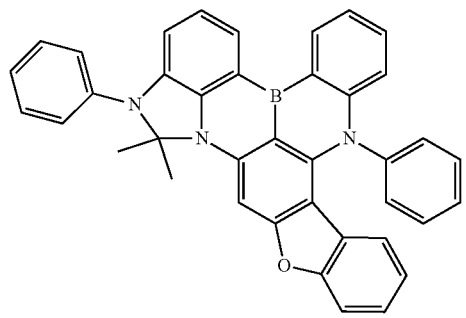
52
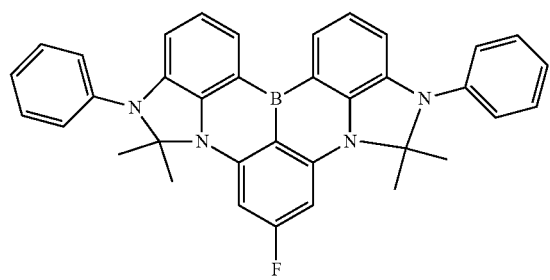
53
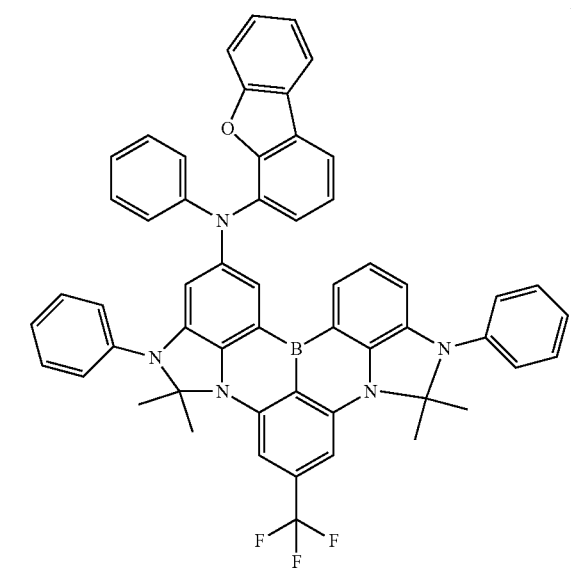
54
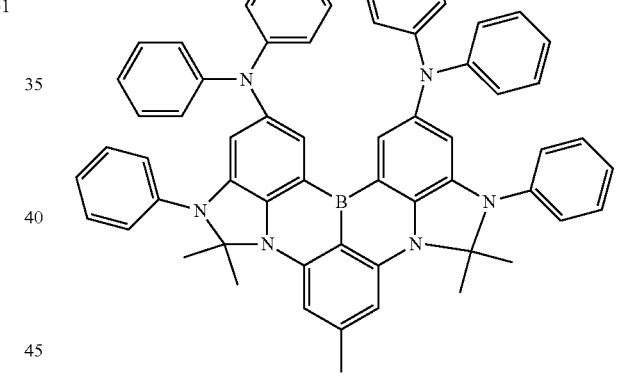
55
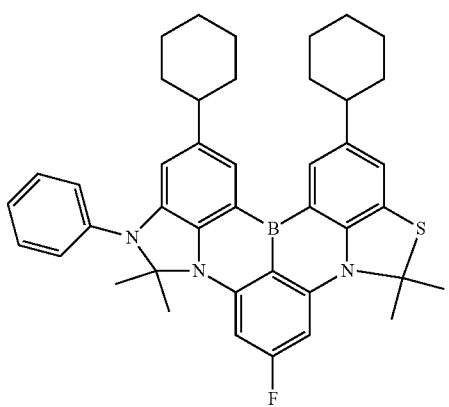

56
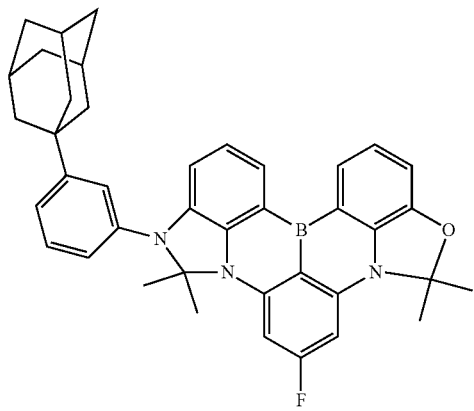
57
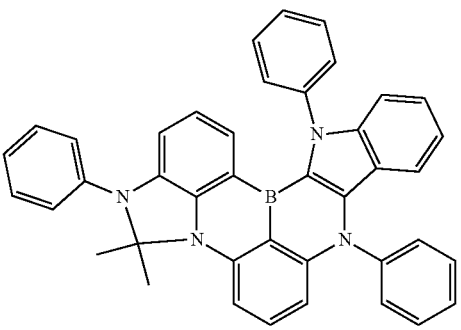
58
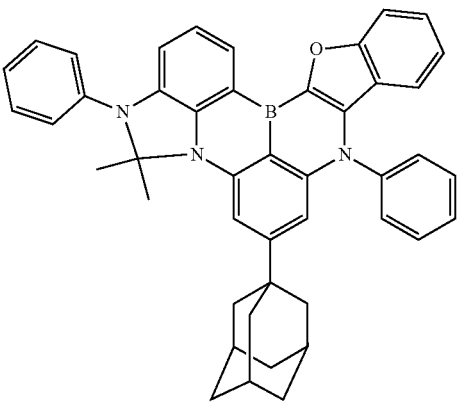
59
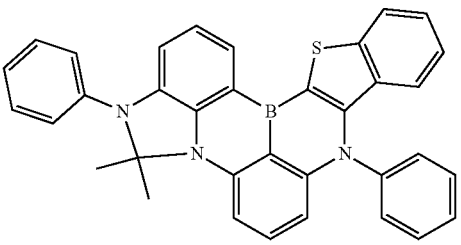
60
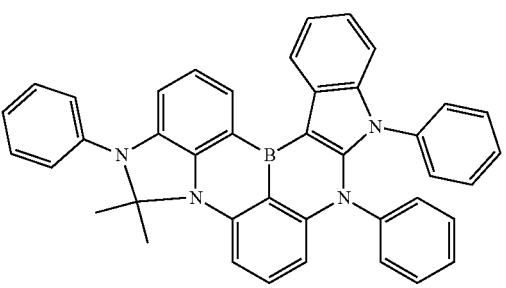
61
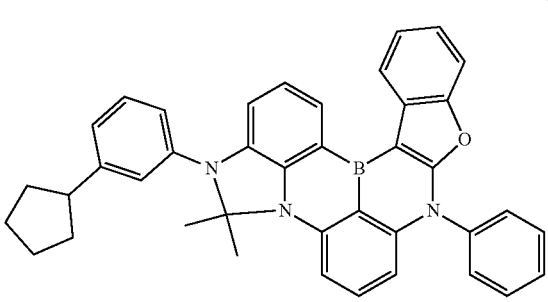
62
63
64
65

-continued
66
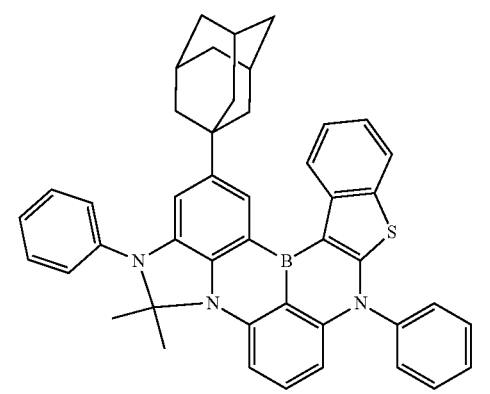
67
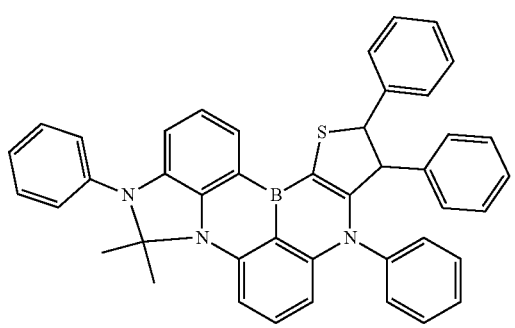
68
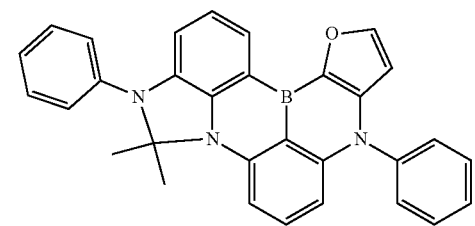
69
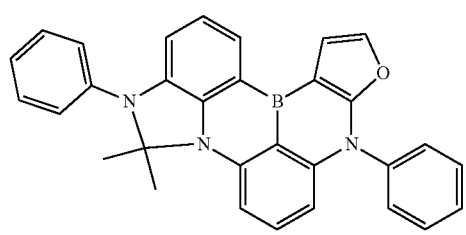
70
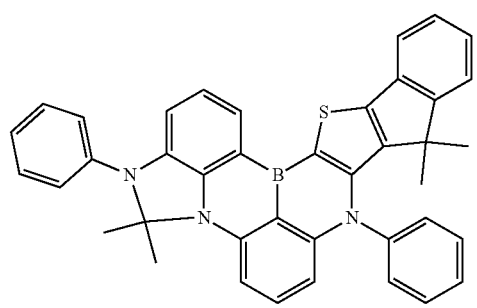
-continued
71
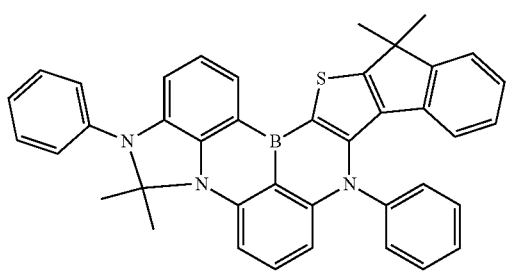
72
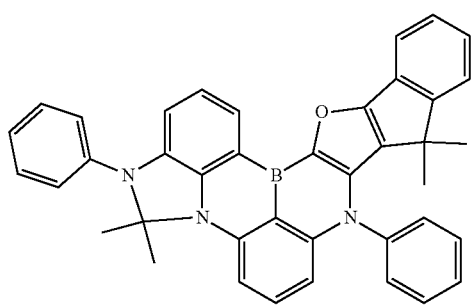
73
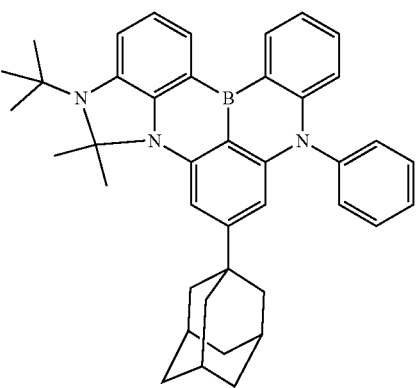
74
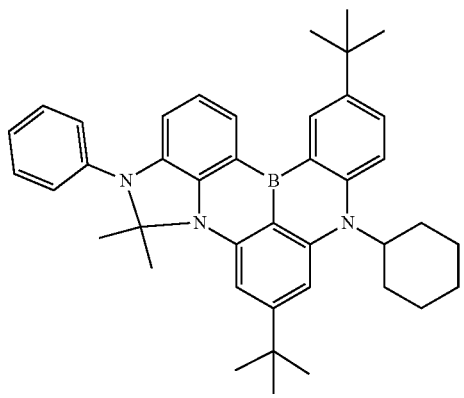

27
-continued
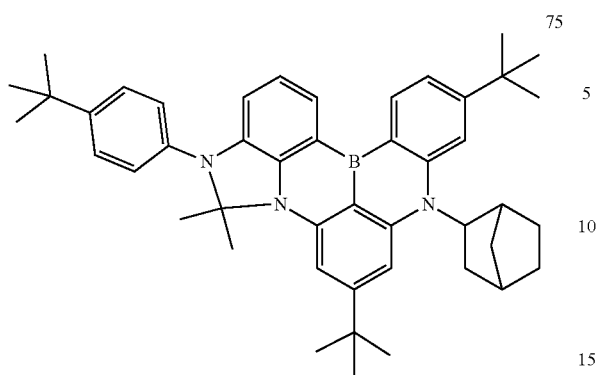
75
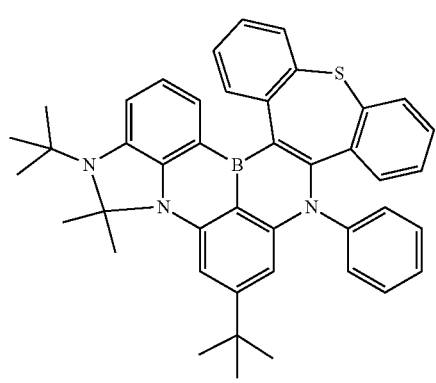
76
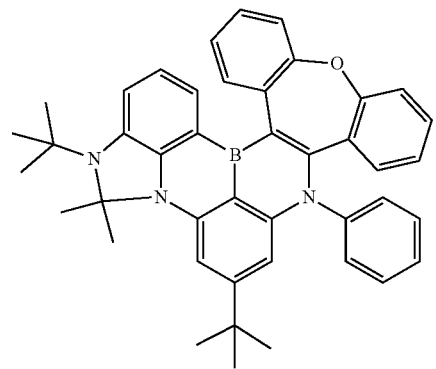
77
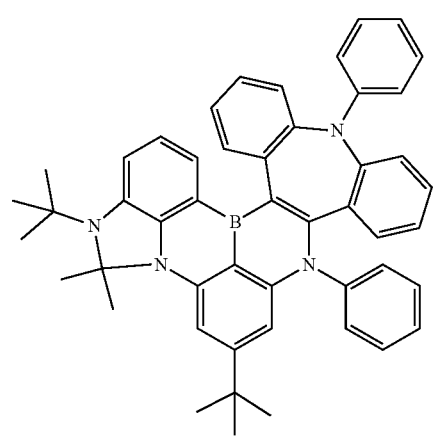
78
28
-continued
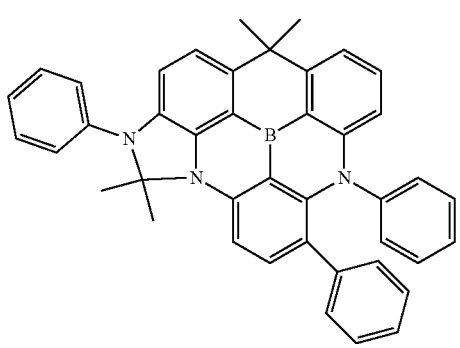
79
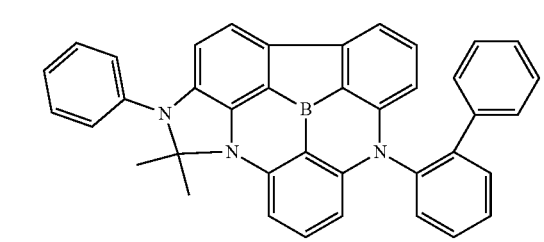
80
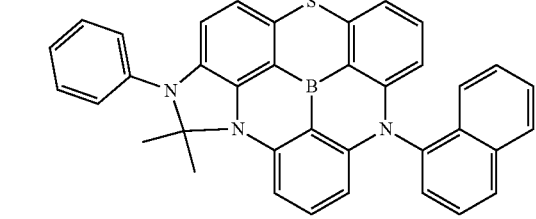
81
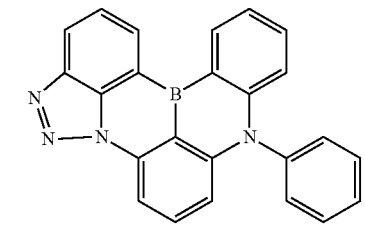
82
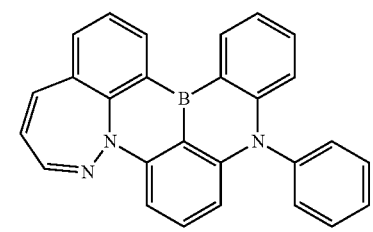
83
84

85
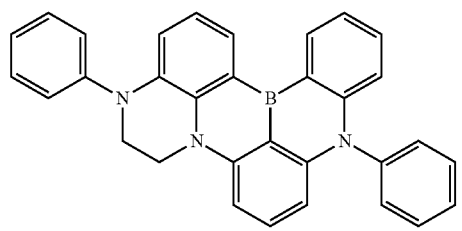
86
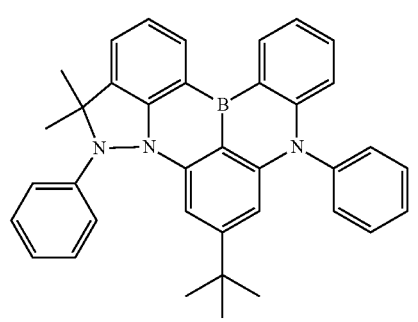
87
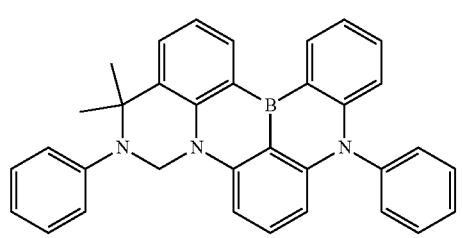
88
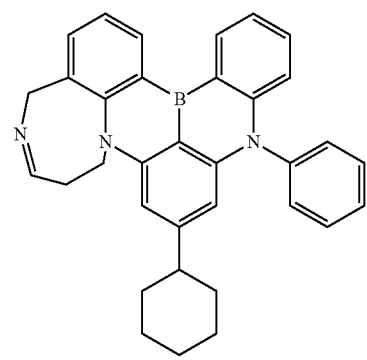
89
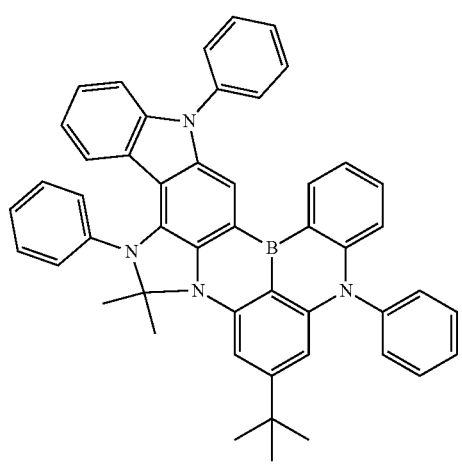
90
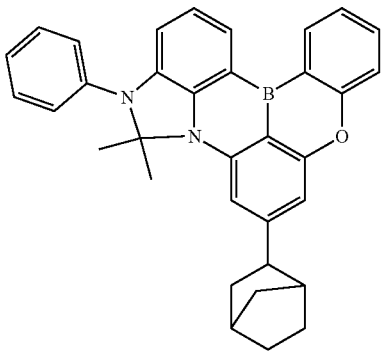
91
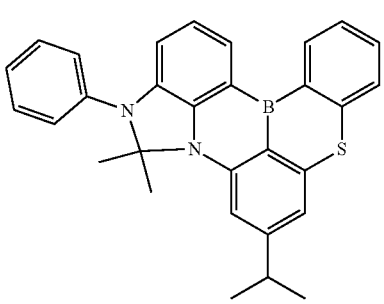
92
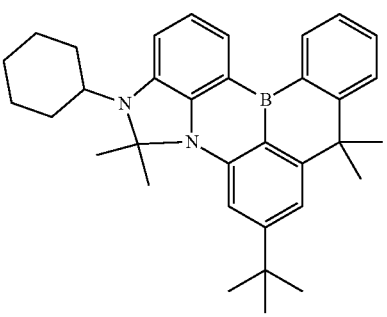
93
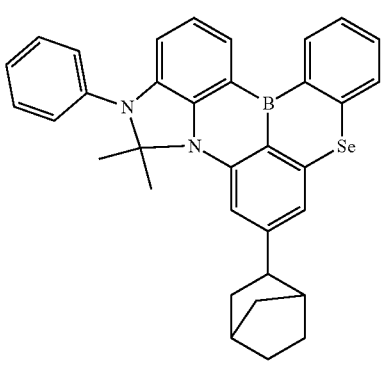
94
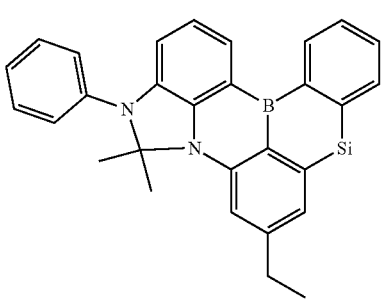

95
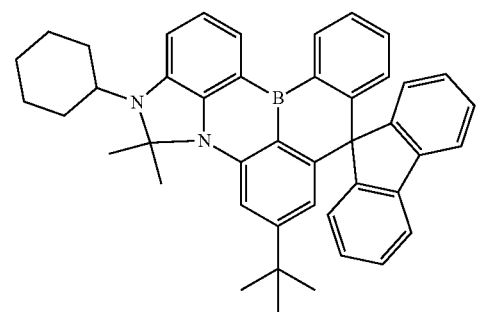
96
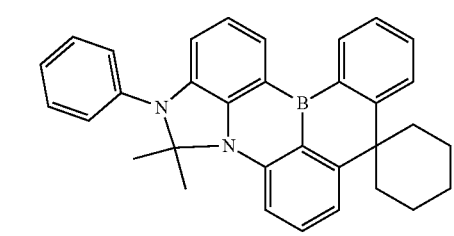
97
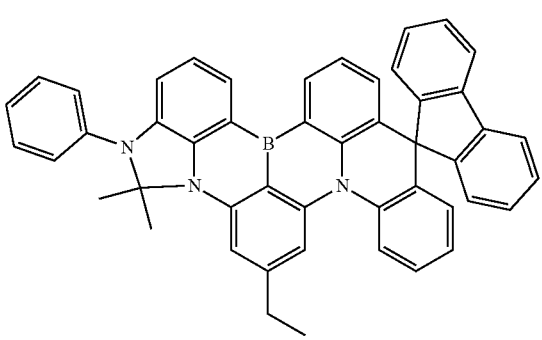
98
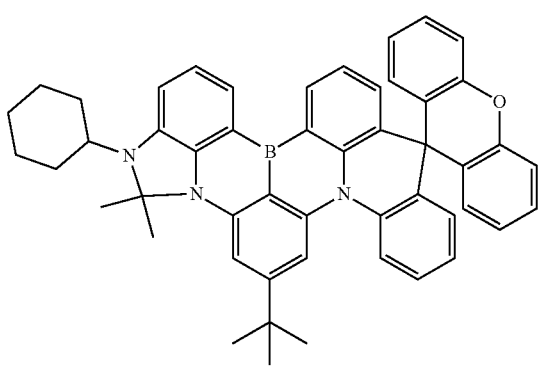
99
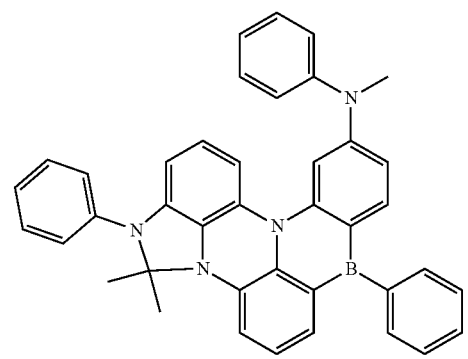
100
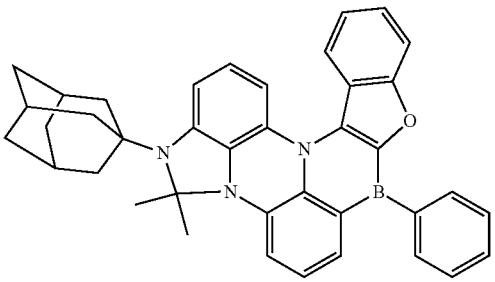
101
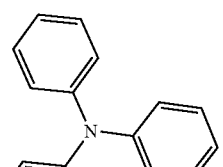
102
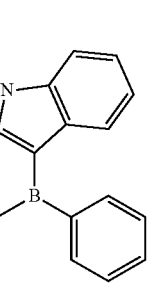
103
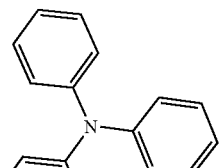
104
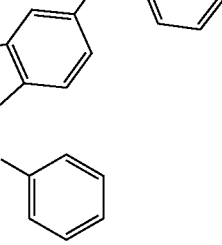

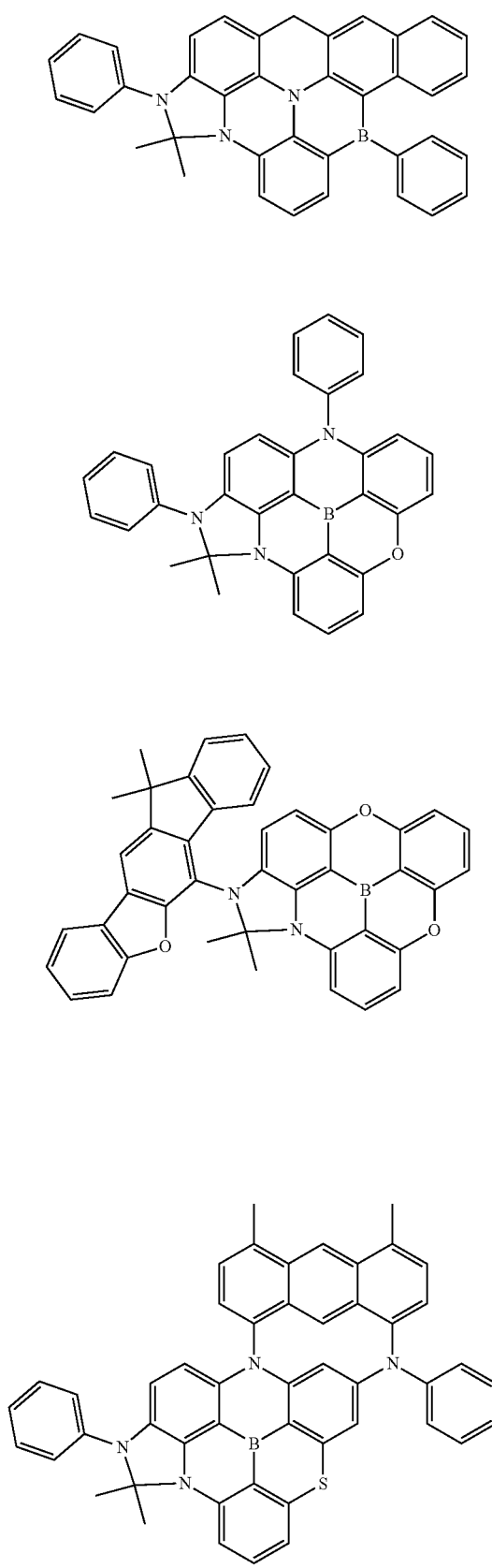
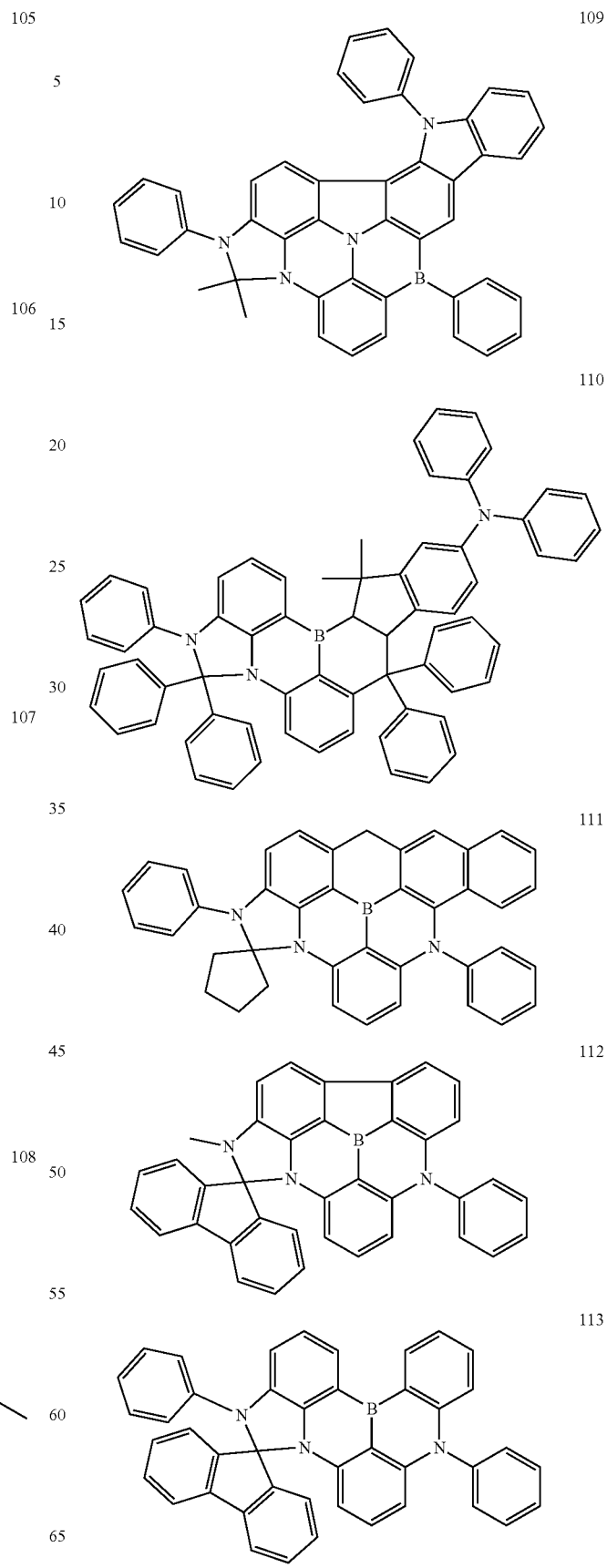

-continued
114
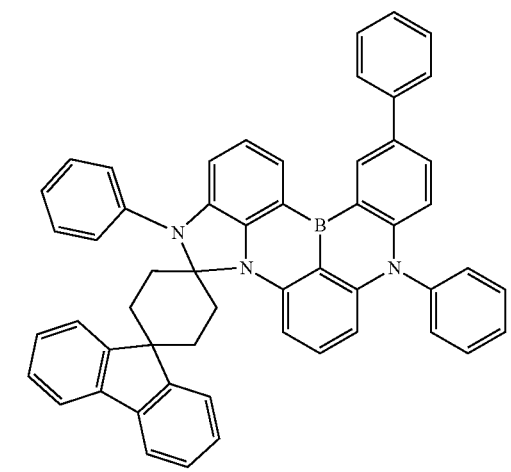
115
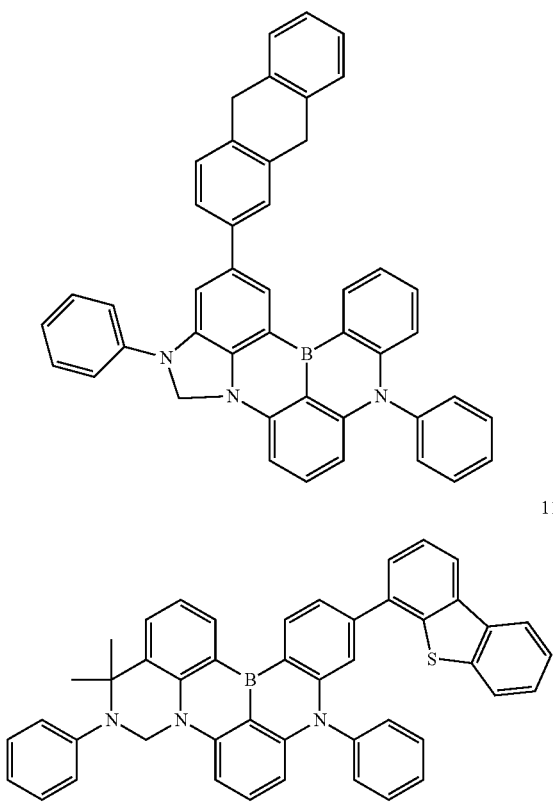
116
117
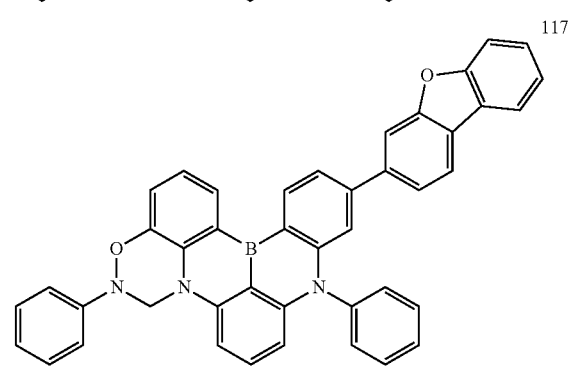
-continued
118
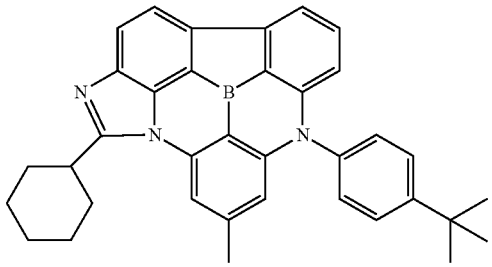
119
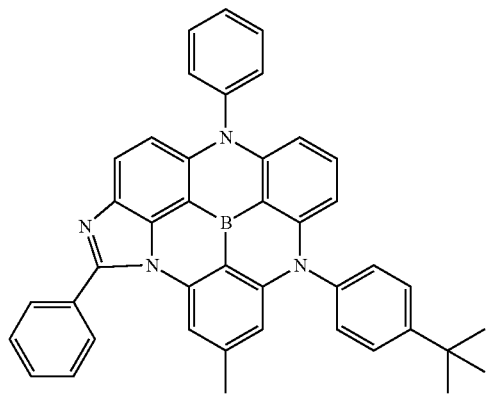
120
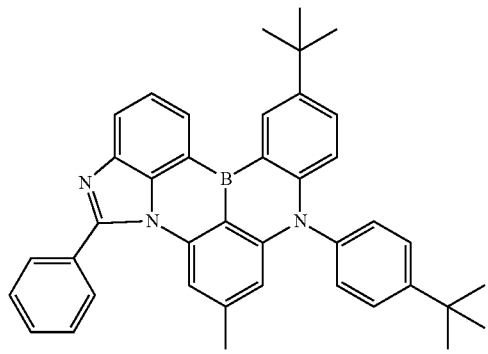
121
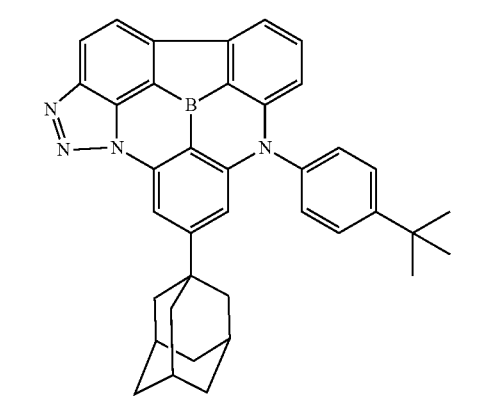

122 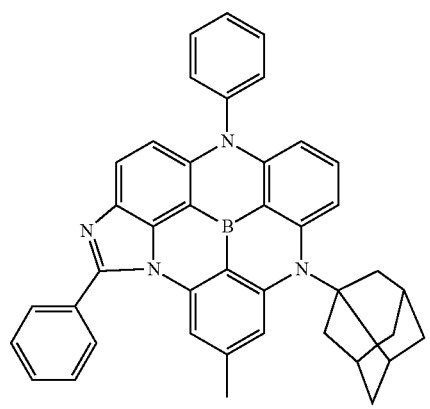
123 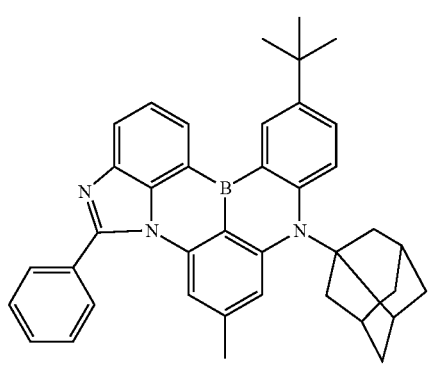
124 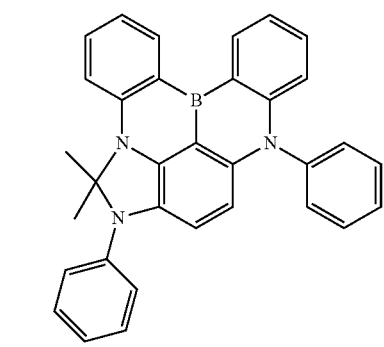
125 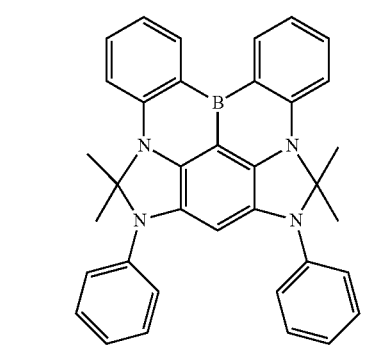
126 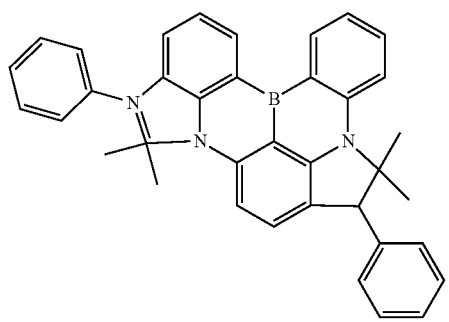
127 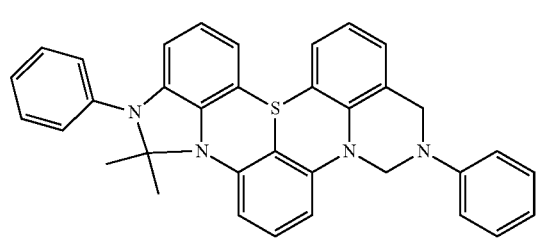
128 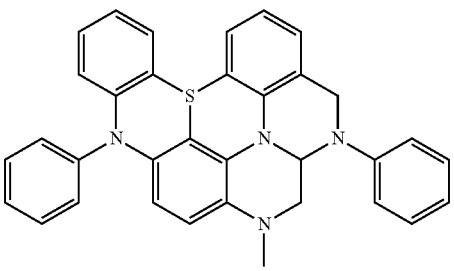
129 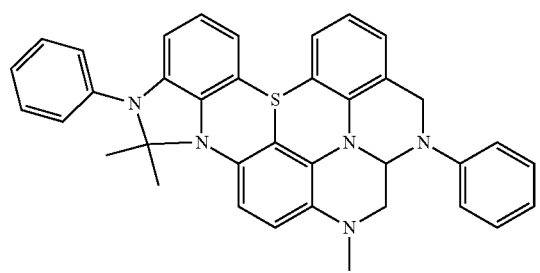

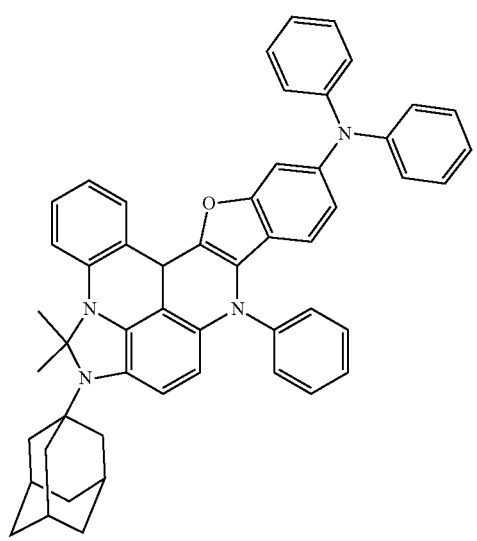
130
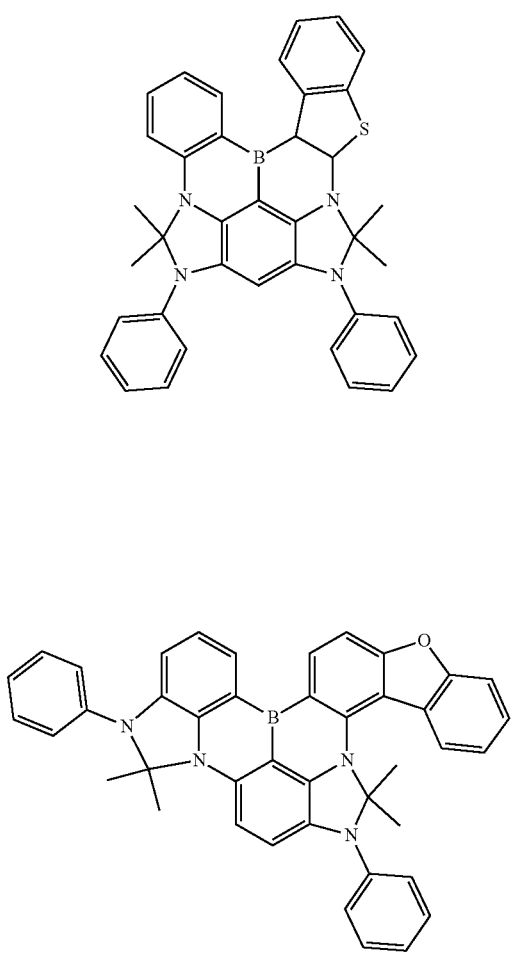
131
132
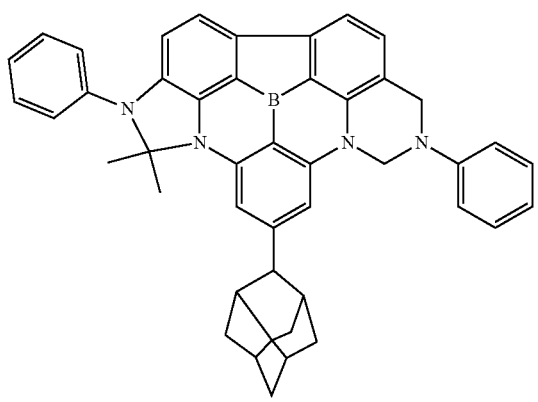
133
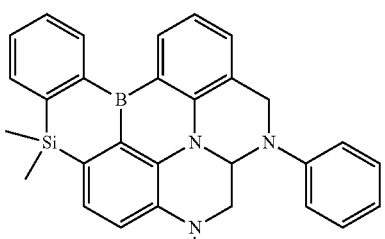
134
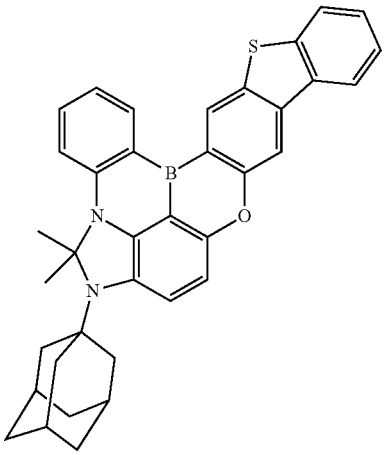
135
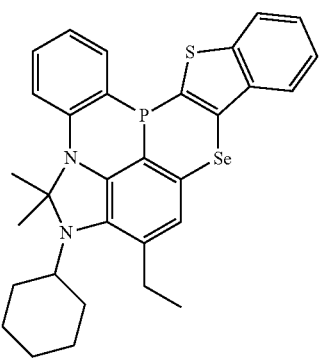
136

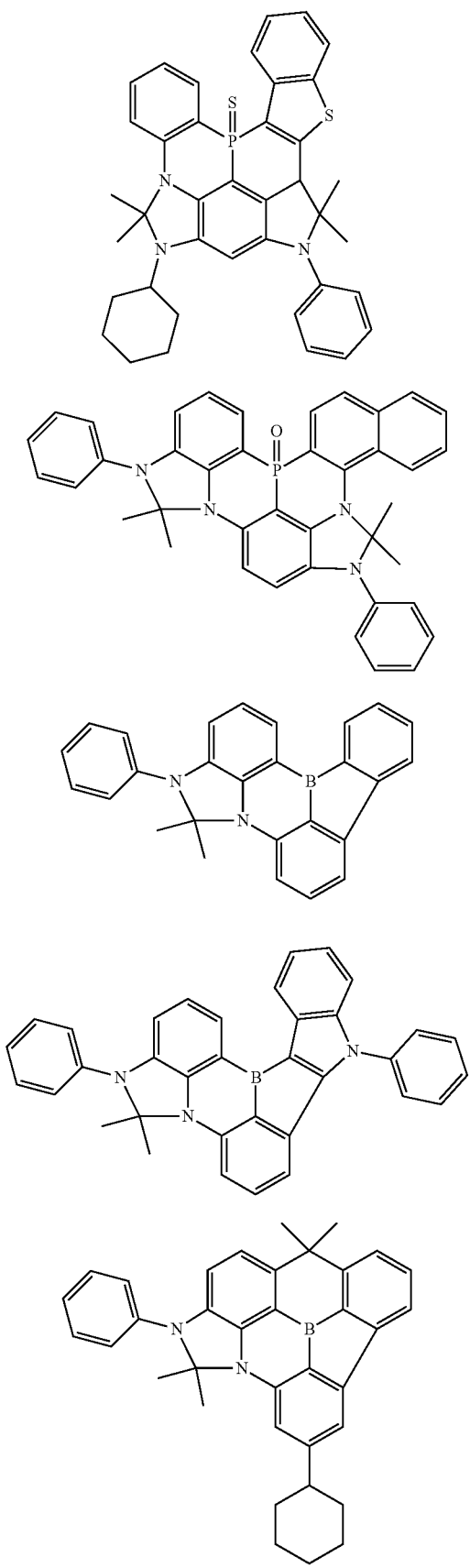

147
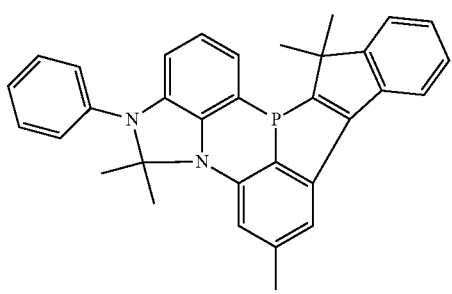
148
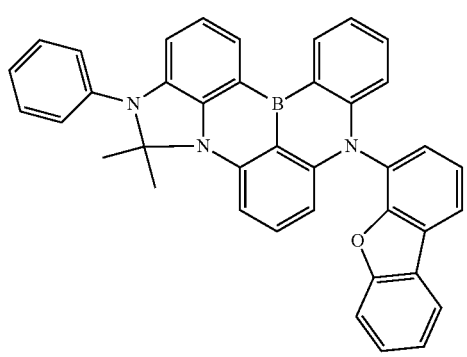
149
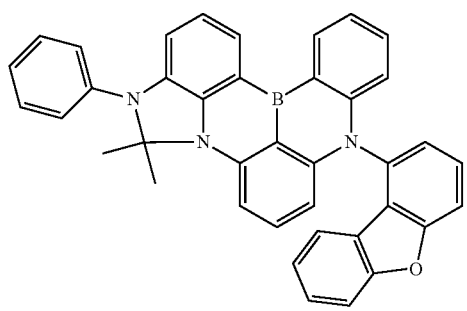
150
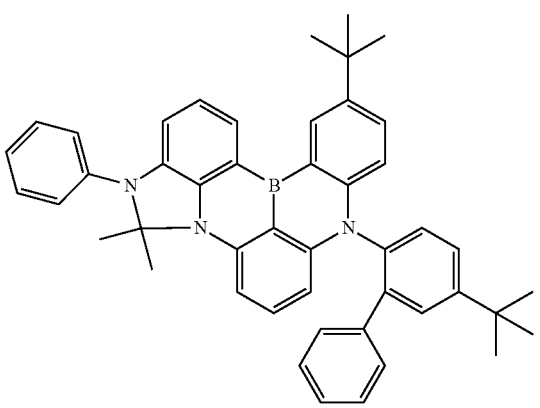
151
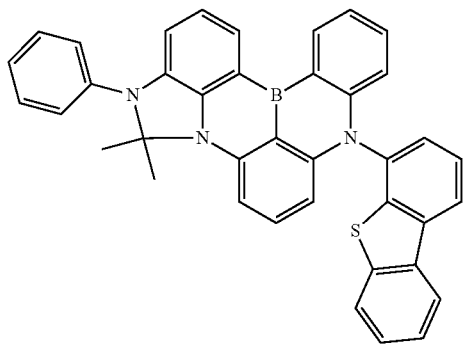
152
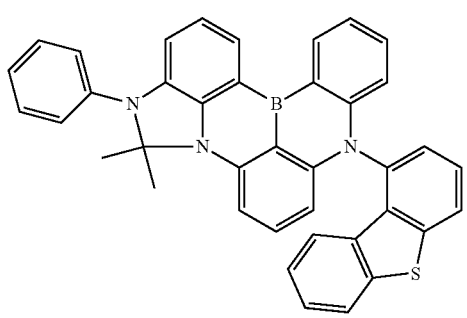
153
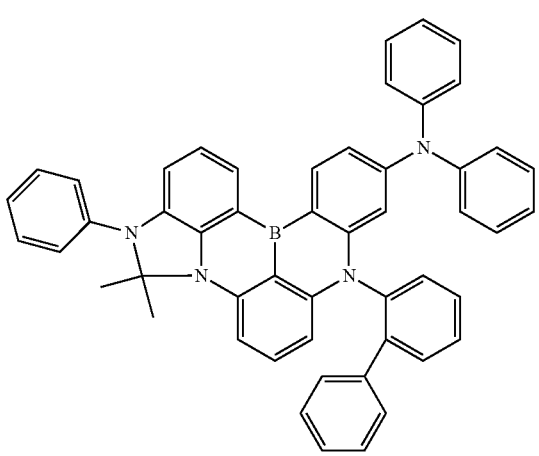
154
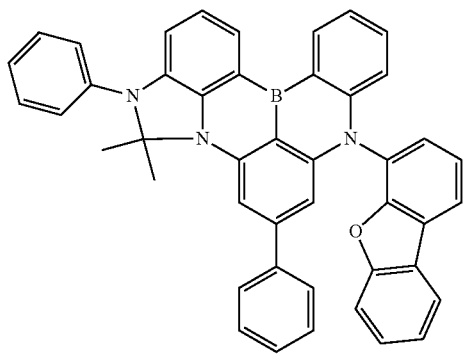

-continued

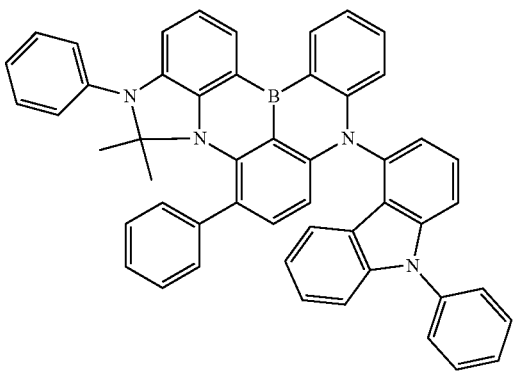

155

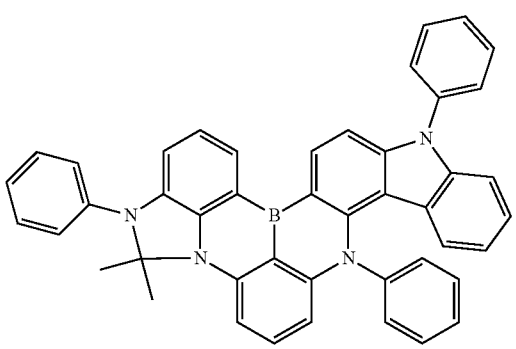

156

The specific substituents in Formula A or B can be clearly seen from the structures of the compounds 1 to 156 but are not intended to limit the scope of the compound represented by Formula A or B.

As can be seen from the above specific compounds, the polycyclic compound of the present invention contains B, N, CR, SiR, P, P=O, and P=S and has a polycyclic ring structure. The introduction of substituents into the polycyclic ring structure enables the synthesis of organic light emitting materials with inherent characteristics of the backbone structure and the substituents. For example, the backbone structure and the substituents are designed for use in a hole injecting layer, a hole transport layer, a light emitting layer, an electron transport layer, an electron injecting layer, an electron blocking layer, and a hole blocking layer of an organic electroluminescent device. This introduction meets the requirements of the organic layers and enables the fabrication of a high efficiency organic electroluminescent device. The compound of the present invention may be used alone or in combination with other compounds to form various organic layers. The compound of the present invention may also be used as a material for a capping layer (CPL).

A further aspect of the present invention is directed to an organic electroluminescent device including a first electrode, a second electrode, and one or more organic layers interposed between the first and second electrodes wherein one of the organic layers includes at least one of the organic electroluminescent compounds that can be represented by Formula A or B.

That is, according to one embodiment of the present invention, the organic electroluminescent device has a structure in which one or more organic layers are arranged between a first electrode and a second electrode. The organic electroluminescent device of the present invention may be fabricated by a suitable method known in the art using suitable materials known in the art, except that the organic electroluminescent compound of Formula A or B is used to form the corresponding organic layer.

The organic layers of the organic electroluminescent device according to the present invention may form a monolayer structure. Alternatively, the organic layers may have a multilayer stack structure. For example, the organic layers may have a structure including a hole injecting layer, a hole transport layer, a hole blocking layer, a light emitting layer, an electron blocking layer, an electron transport layer, and an electron injecting layer but is not limited to this structure. The number of the organic layers is not limited and may be increased or decreased. Preferred structures of the organic layers of the organic electroluminescent device according to the present invention will be explained in more detail in the Examples section that follows.

The organic electroluminescent device of the present invention will be described in more detail with reference to exemplary embodiments.

The organic electroluminescent device of the present invention includes an anode, a hole transport layer, a light emitting layer, an electron transport layer, and a cathode. The organic electroluminescent device of the present invention may optionally further include a hole injecting layer between the anode and the hole transport layer and an electron injecting layer between the electron transport layer and the cathode. If necessary, the organic electroluminescent device of the present invention may further include one or two intermediate layers such as a hole blocking layer or an electron blocking layer. The organic electroluminescent device of the present invention may further include one or more organic layers such as a capping layer that have various functions depending on the desired characteristics of the device.

The light emitting layer of the organic electroluminescent device according to the present invention includes, as a host compound, an anthracene derivative represented by Formula C:

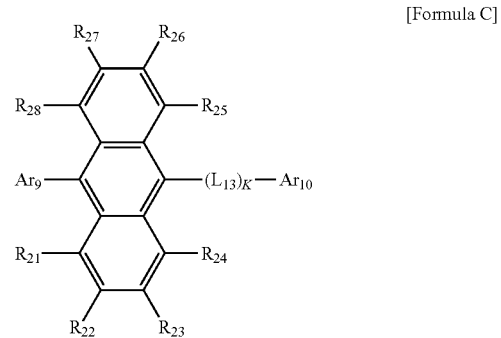

[Formula C]

wherein $R_{21}$ to $R_{28}$ are identical to or different from each other and are as defined for $R_1$ to $R_{17}$ in Formula A, $Ar_9$ and $Ar_{10}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, $L_{13}$ is a single bond or is selected from substituted or unsubstituted $C_6$-$C_{20}$ arylene and substituted or unsubstituted $C_2$-$C_{20}$ heteroarylene, preferably a single bond or substituted or unsubstituted $C_6$-$C_{20}$ arylene, and k is an integer from 1 to 3, provided that when k is 2 or more, the linkers $L_{13}$ are identical to or different from each other.

$Ar_9$ in Formula C is represented by Formula C-1:

[Formula C-1]

wherein $R_{31}$ to $R_{35}$ are identical to or different from each other and are as defined for $R_1$ to $R_{18}$ in Formula A, and each of $R_{31}$ to $R_{35}$ is optionally bonded to an adjacent substituent to form a saturated or unsaturated ring.

The compound of Formula C employed in the organic electroluminescent device of the present invention may be specifically selected from the compounds of Formulae C1 to C48:

C1

C2

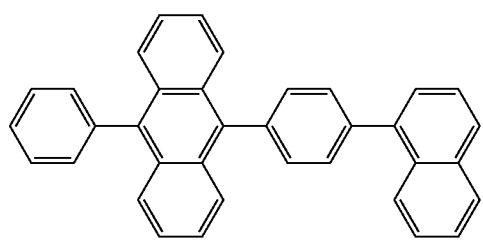

C3

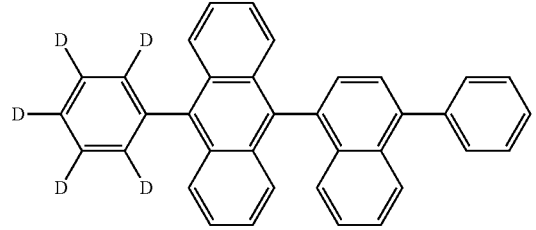

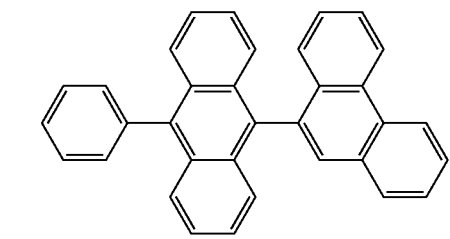

-continued

C4

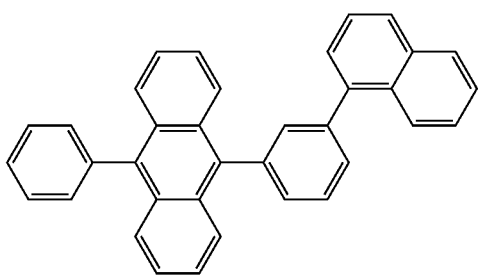

C5

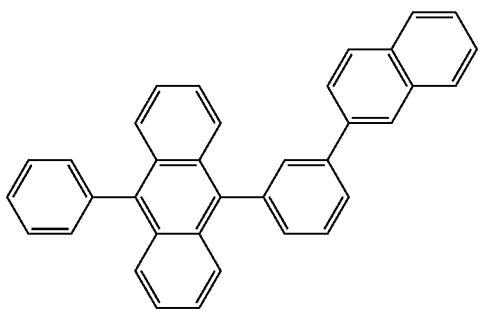

C6

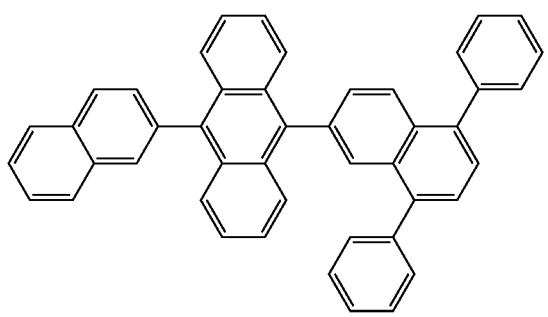

C7

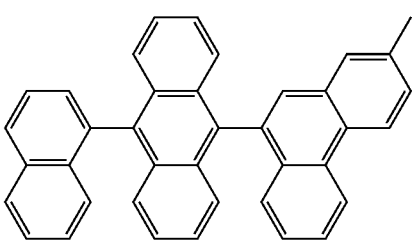

C8

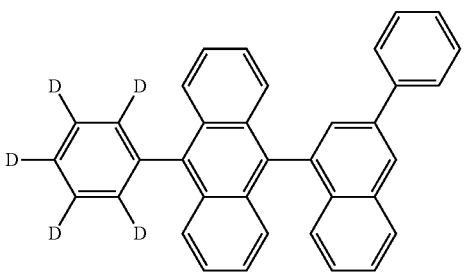

C9
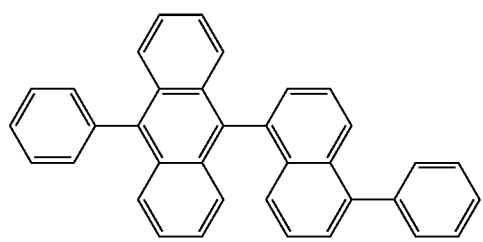
C10
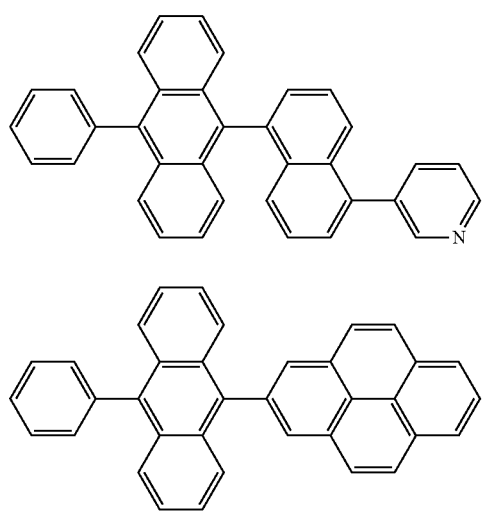
C11
C12
C13
C14
C15
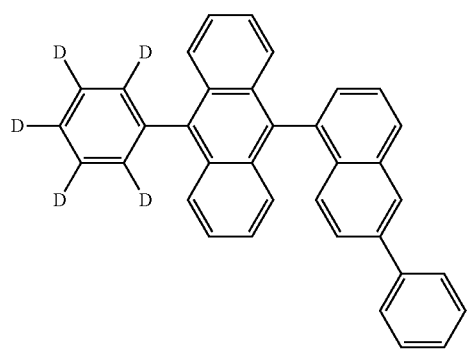
C16
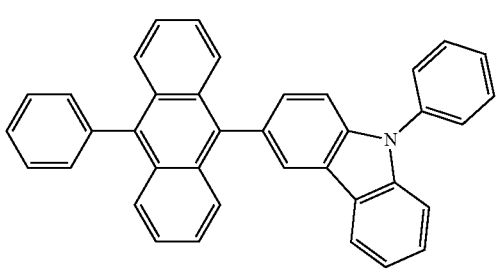
C17
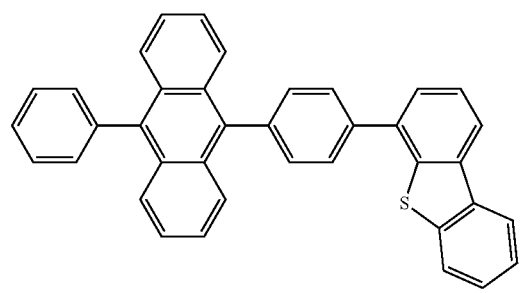
C18
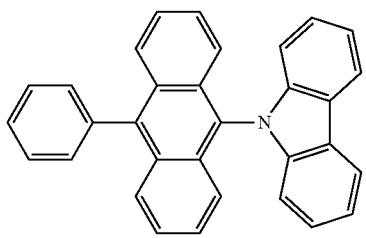
C19
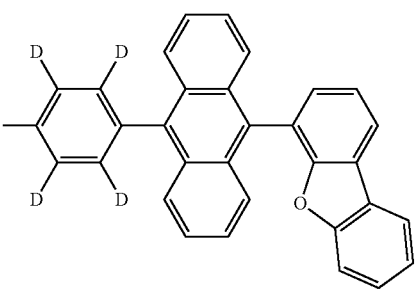

-continued
C20
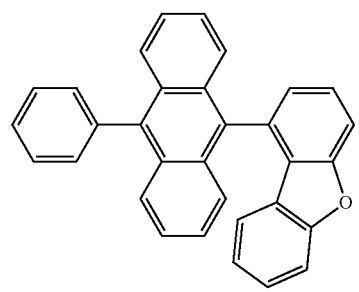
C21
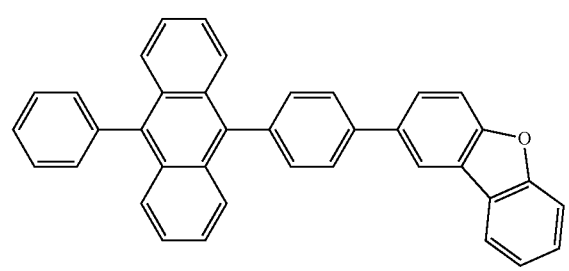
C22
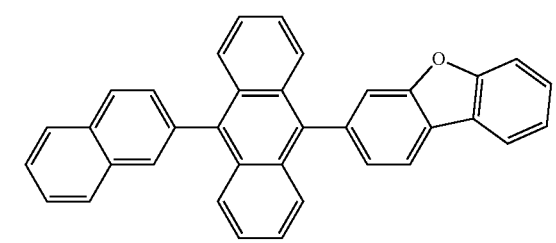
C23
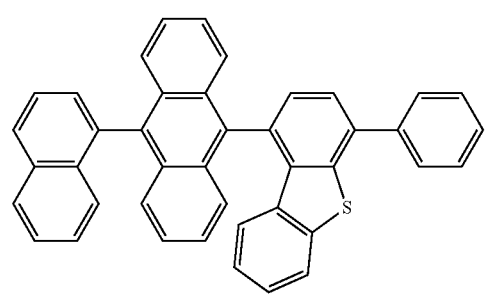
C24
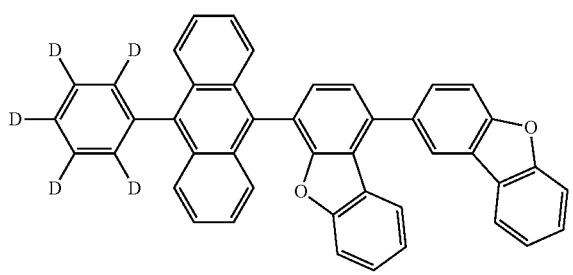
-continued
C25
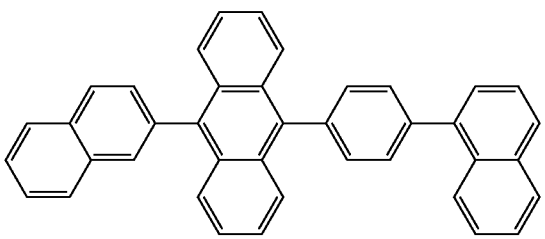
C26
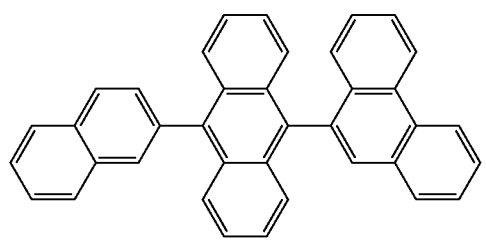
C27
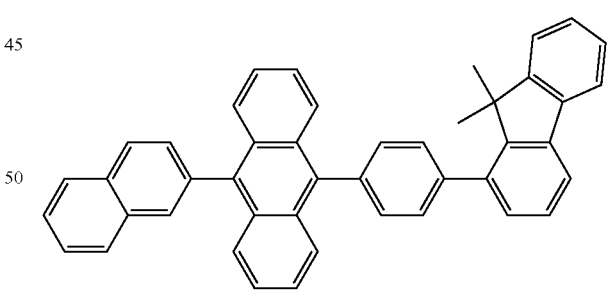
C28
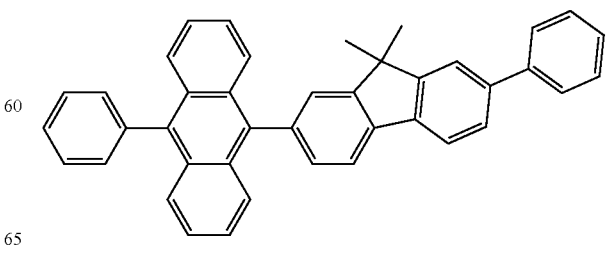
C29

C30
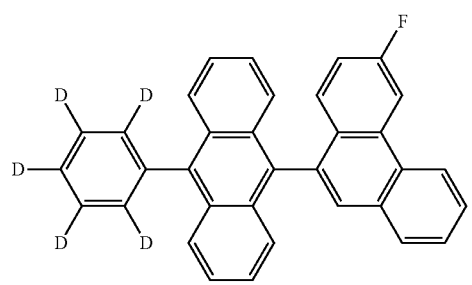
C31
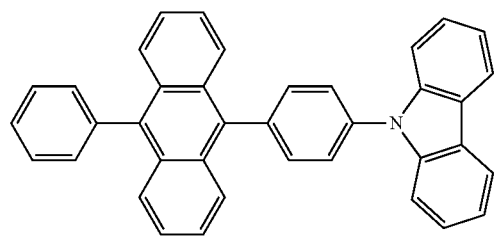
C32
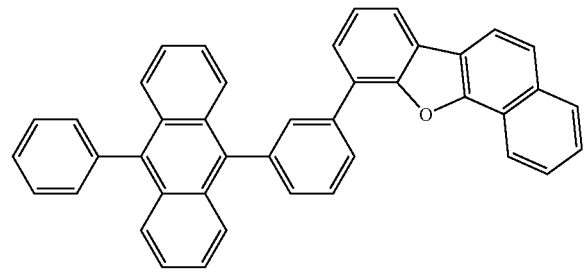
C33
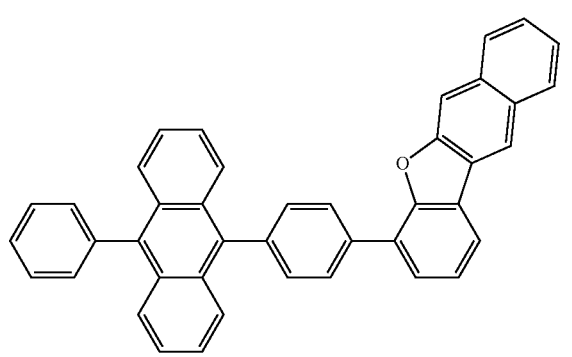
C34
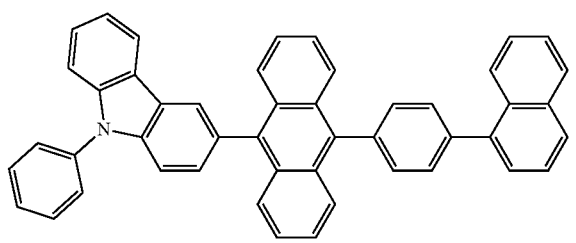
C35
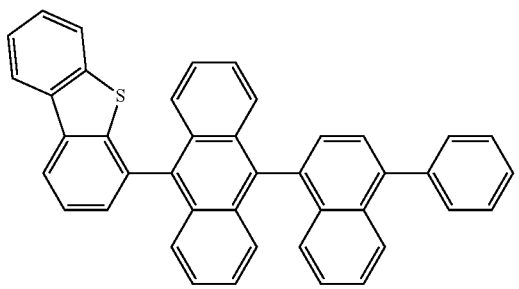
C36
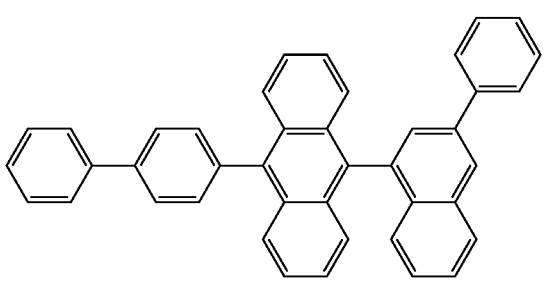
C37
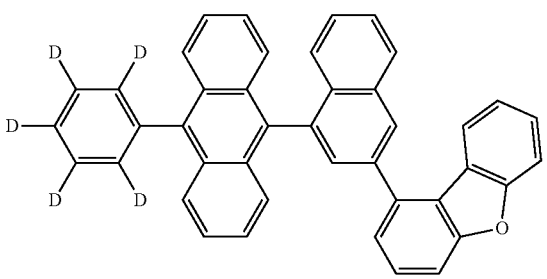
C38
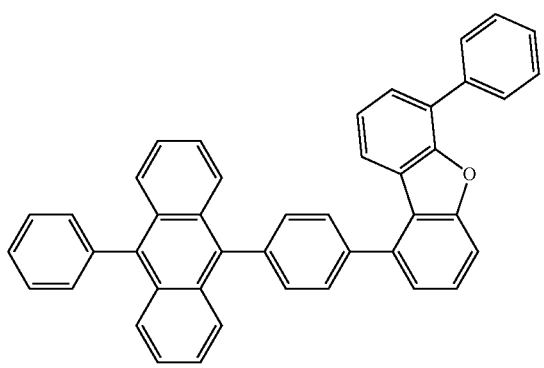
C39
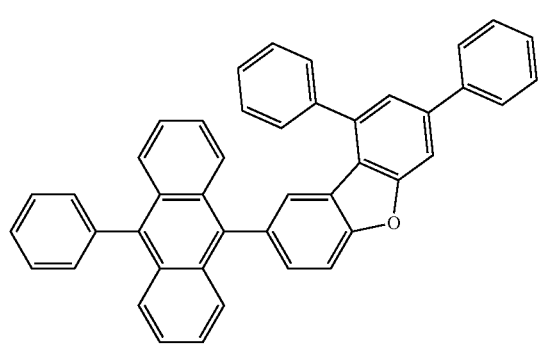

C40
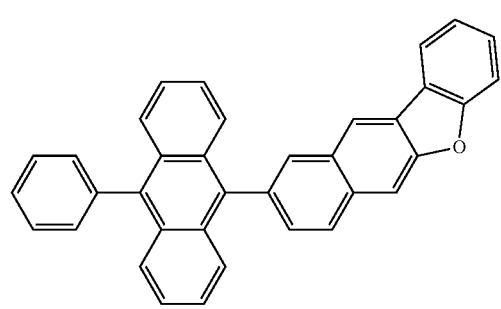
C41
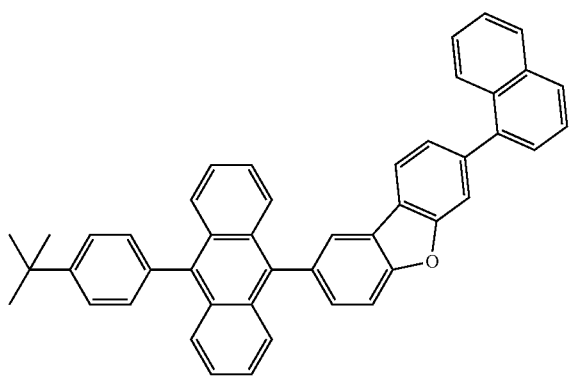
C42
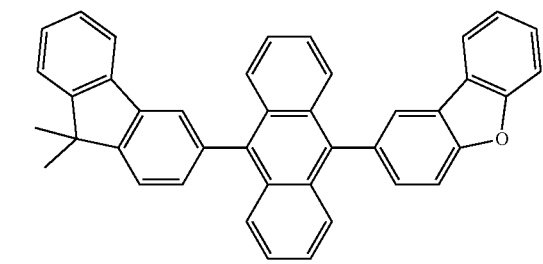
C43
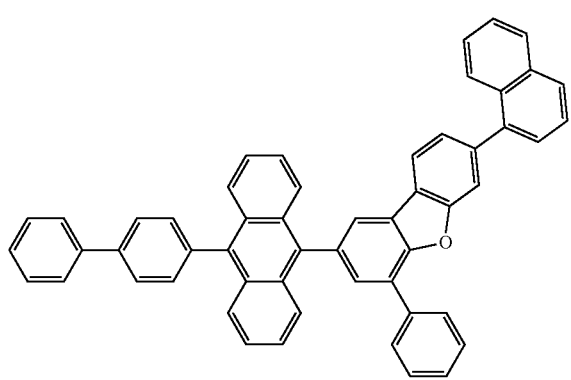
C44
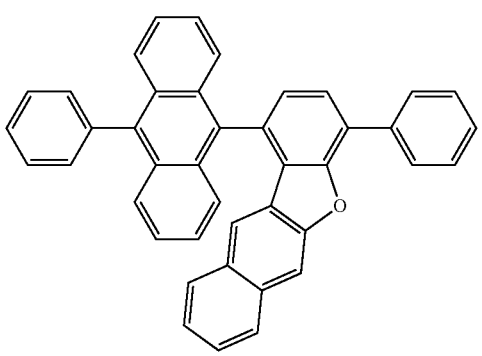
C45
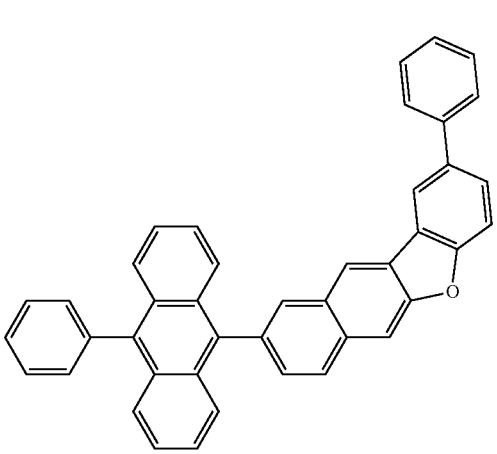
C46
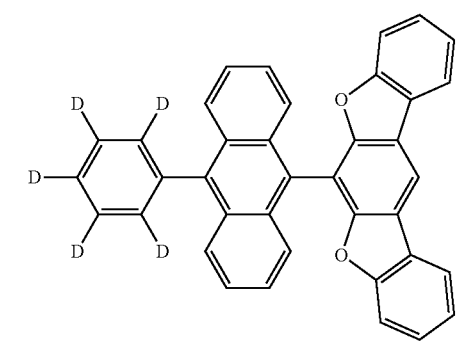
C47
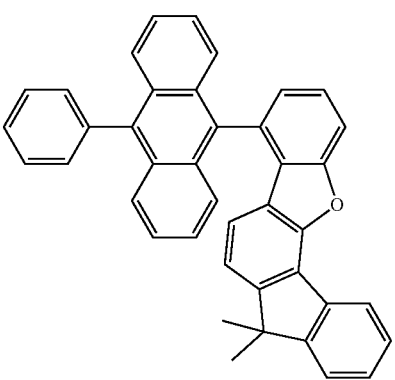

-continued

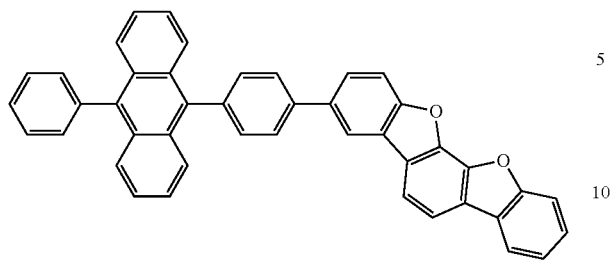

C48

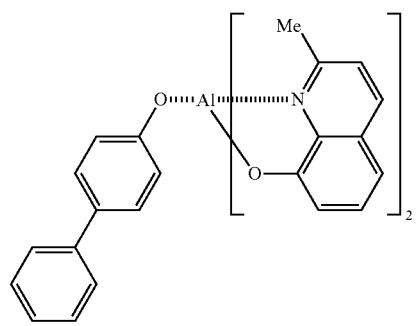

BAlq

A specific structure of the organic electroluminescent device according to one embodiment of the present invention and a method for fabricating the device are as follows.

First, an anode material is coated on a substrate to form an anode. The substrate may be any of those used in general electroluminescent devices. The substrate is preferably an organic substrate or a transparent plastic substrate that is excellent in transparency, surface smoothness, ease of handling, and waterproofness. A highly transparent and conductive metal oxide such as indium tin oxide (ITO), indium zinc oxide (IZO), tin oxide (SnO2) or zinc oxide (ZnO) is used as the anode material.

A hole injecting material is coated on the anode by vacuum thermal evaporation or spin coating to form a hole injecting layer. Then, a hole transport material is coated on the hole injecting layer by vacuum thermal evaporation or spin coating to form a hole transport layer.

The hole injecting material is not specially limited so long as it is usually used in the art. Specific examples of such materials include 4,4',4"-tris(2-naphthylphenyl-phenylamino)triphenylamine (2-TNATA), N,N'-di(1-naphthyl)-N,N'-diphenylbenzidine (NPD), N,N'-diphenyl-N,N'-bis(3-methylphenyl)-1,1'-biphenyl-4,4'-diamine (TPD), N,N'-diphenyl-N,N'-bis(4-(phenyl-m-tolylamino)phenyl) biphenyl-4,4'-diamine (DNTPD), and 1,4,5,8,9,11-hexaazatriphenylenehexac arbonitrile (HAT-CN).

The hole transport material is not specially limited so long as it is commonly used in the art. Examples of such materials include N,N'-bis(3-methylphenyl)-N,N'-diphenyl-(1,1-biphenyl)-4,4'-diamine (TPD) and N,N'-di(naphthalen-1-yl)-N,N'-diphenylbenzidine (α-NPD).

Subsequently, a hole auxiliary layer and a light emitting layer are sequentially laminated on the hole transport layer. A hole blocking layer may be optionally formed on the light emitting layer by vacuum thermal evaporation or spin coating. The hole blocking layer is formed as a thin film and blocks holes from entering a cathode through the organic light emitting layer. This role of the hole blocking layer prevents the lifetime and efficiency of the device from deteriorating. A material having a very low highest occupied molecular orbital (HOMO) energy level is used for the hole blocking layer. The hole blocking material is not particularly limited so long as it can transport electrons and has a higher ionization potential than the light emitting compound. Representative examples of suitable hole blocking materials include BAlq, BCP, and TPBI.

Examples of materials for the hole blocking layer include, but are not limited to, BAlq, BCP, Bphen, TPBI, NTAZ, BeBq2, OXD-7, Liq, and the compounds 501 to 507:

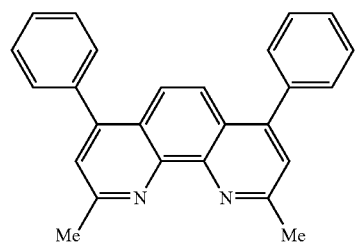

BCP

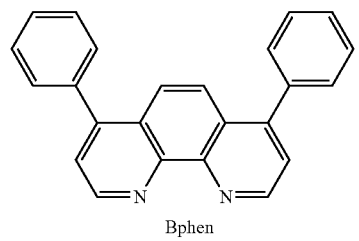

Bphen

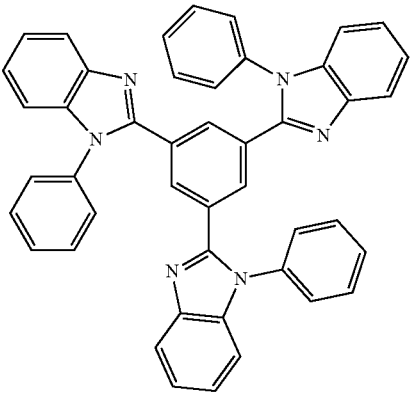

TPBI

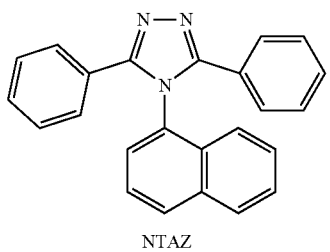

NTAZ

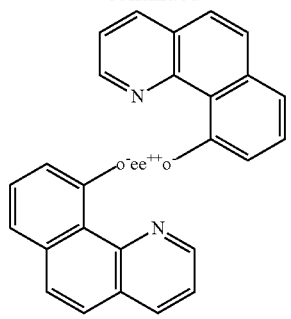
BeBq2
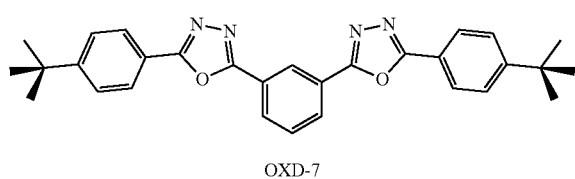
OXD-7
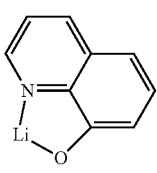
Liq
[Compound 501]
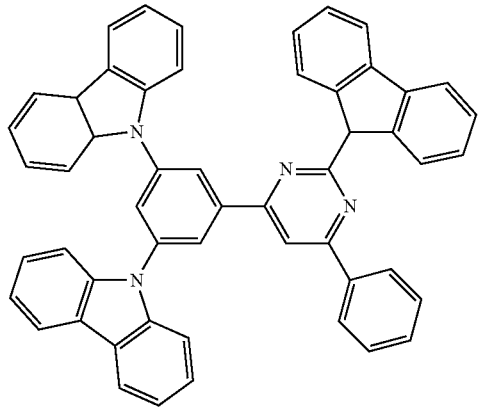
[Compound 502]
[Compound 503]
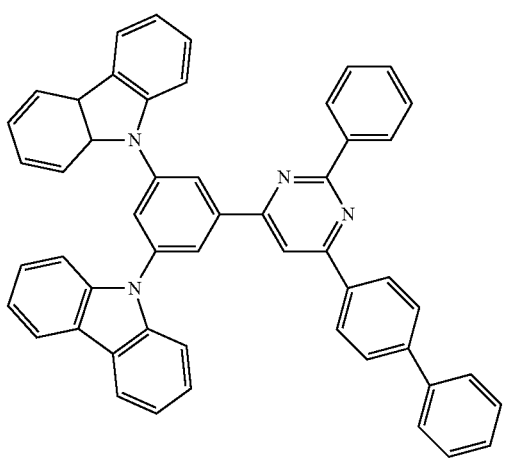
[Compound 504]
[Compound 505]
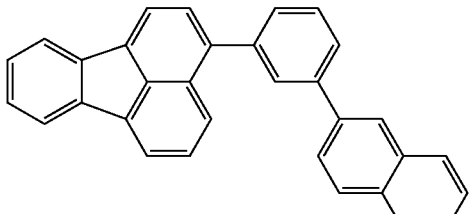
[Compound 506]
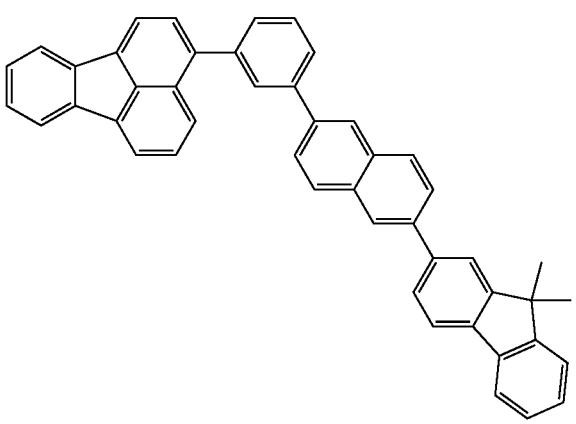

[Compound 507]

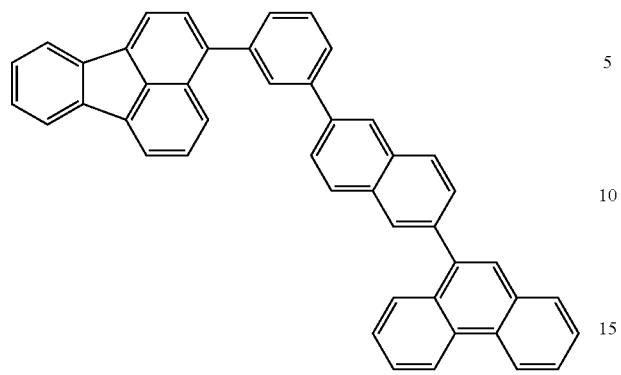

An electron transport layer is deposited on the hole blocking layer by vacuum thermal evaporation or spin coating, and an electron injecting layer is formed thereon. A cathode metal is deposited on the electron injecting layer by vacuum thermal evaporation to form a cathode, completing the fabrication of the organic electroluminescent device.

For example, lithium (Li), magnesium (Mg), aluminum (Al), aluminum-lithium (Al—Li), calcium (Ca), magnesium-indium (Mg—In) or magnesium-silver (Mg—Ag) may be used as the metal for the formation of the cathode. The organic electroluminescent device may be of top emission type. In this case, a transmissive material such as ITO or IZO may be used to form the cathode.

A material for the electron transport layer functions to stably transport electrons injected from the cathode. The electron transport material may be any of those known in the art and examples thereof include, but are not limited to, quinoline derivatives, particularly tris(8-quinolinolate) aluminum (Alq3), TAZ, Balq, beryllium bis(benzoquinolin-10-olate (Bebq2), ADN, the compounds 401 and 420, and oxadiazole derivatives such as PBD, BMD, and BND:

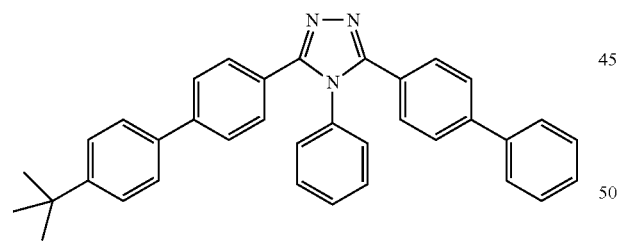

TAZ

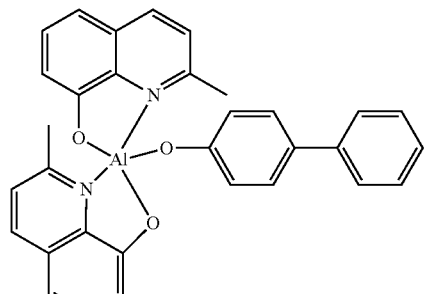

BAlq

[Compound 401]

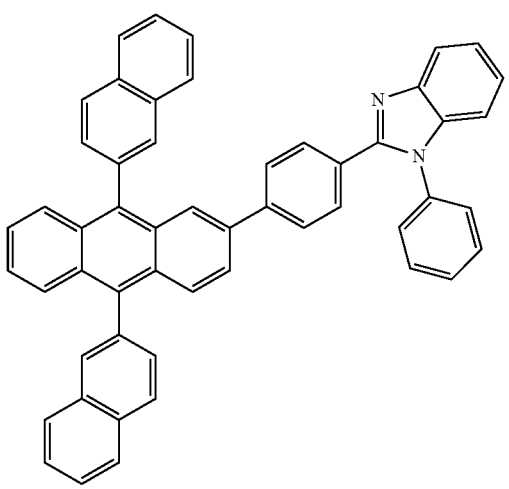

[Compound 402]

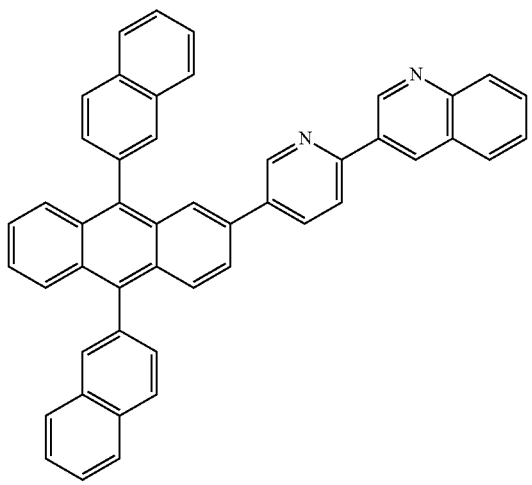

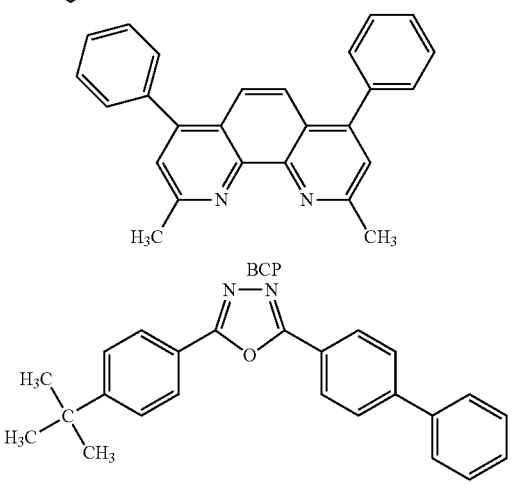

BCP

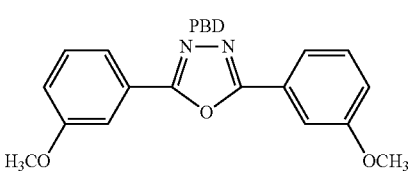

PBD

BMD

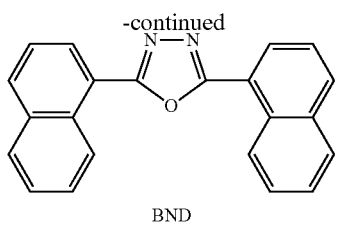

BND

Each of the organic layers can be formed by a monomolecular deposition or solution process. According to the monomolecular deposition process, the material for each layer is evaporated into a thin film under heat and vacuum or reduced pressure. According to the solution process, the material for each layer is mixed with a suitable solvent, and then the mixture is formed into a thin film by a suitable method, such as ink-jet printing, roll-to-roll coating, screen printing, spray coating, dip coating or spin coating.

The organic electroluminescent device of the present invention can be used in a display or lighting system selected from flat panel displays, flexible displays, monochromatic flat panel lighting systems, white flat panel lighting systems, flexible monochromatic lighting systems, and flexible white lighting systems.

Mode for Carrying out the Invention

The present invention will be explained more specifically with reference to the following examples. However, it will be obvious to those skilled in the art that these examples are in no way intended to limit the scope of the invention.

Synthesis Example 1: Synthesis of Compound 1

(1) Synthesis of Intermediate 3

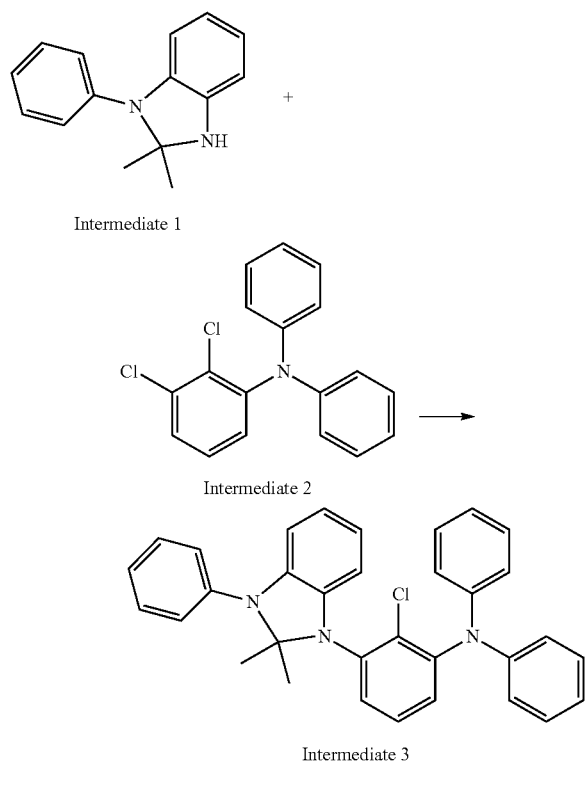

20.0 g of Intermediate 1 (see Chinese Patent Publication No. 107759527 for synthesis), 28.0 g of Intermediate 2 (see Chinese Patent Publication No. 105431439), 0.91 g of bis(tri-tert-butylphosphine)palladium(0), 17.1 g of sodium tert-butoxide, and 200 mL of toluene were placed in a reactor. The mixture was stirred under reflux for 12 h. The reaction mixture was cooled to room temperature and ethyl acetate and water were added thereto. The organic layer was separated and purified by silica gel chromatography to afford Intermediate 3 (32.3 g, 72.2%).

MS (ESI) calcd. for Chemical Formula: $C_{33}H_{29}ClN_3$ (Pos)502.20, found 502.2

(2) Synthesis of Compound 1

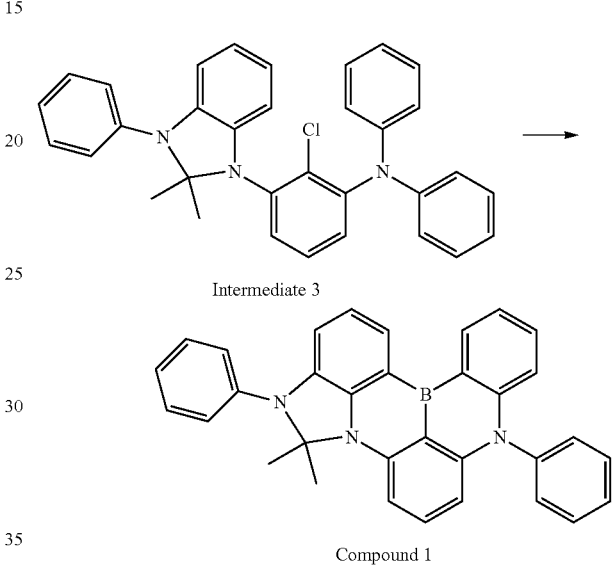

32.3 g of Intermediate 3 and 323 mL of tert-butylbenzene were placed in a reactor, and then 76 mL of 1.7 M tert-butyllithium was added dropwise thereto at −78° C. The mixture was heated to 60° C., followed by stirring for 3 h. Then, nitrogen at 60° C. was blown into the mixture to remove pentane. After cooling to −78° C., 12.2 mL of boron tribromide was added dropwise. The resulting mixture was allowed to warm to room temperature, followed by stirring for 2 h. After cooling to 0° C., 22.4 mL of N,N-diisopropylethylamine was added dropwise. The mixture was heated to 120° C., followed by stirring for 12 h. The reaction mixture was cooled to room temperature and 106 mL of a 10% aqueous solution of sodium acetate and ethyl acetate were added thereto. The organic layer was separated and purified by silica gel chromatography to afford Compound 1 (6.1 g, 19.9%).

MS (ESI) calcd. for Chemical Formula: $C_{33}H_{27}BN_3$ (Pos)476.22, found 476.2

Synthesis Example 2: Synthesis of Compound 8

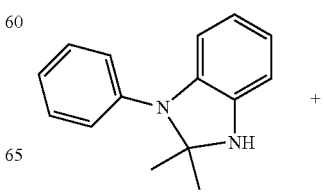

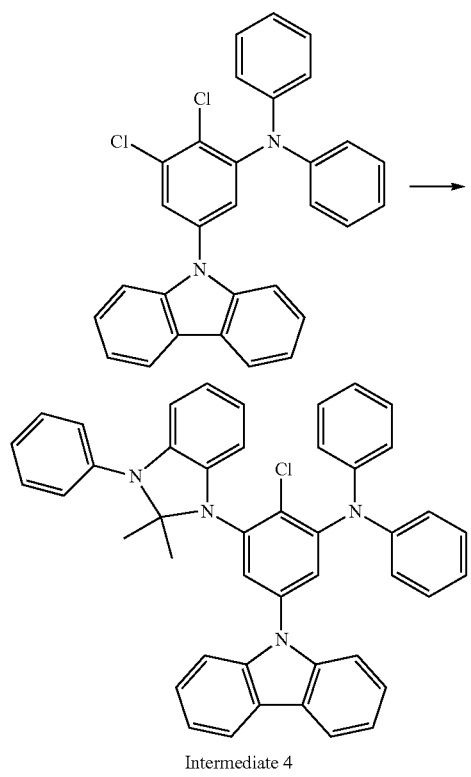

Intermediate 4

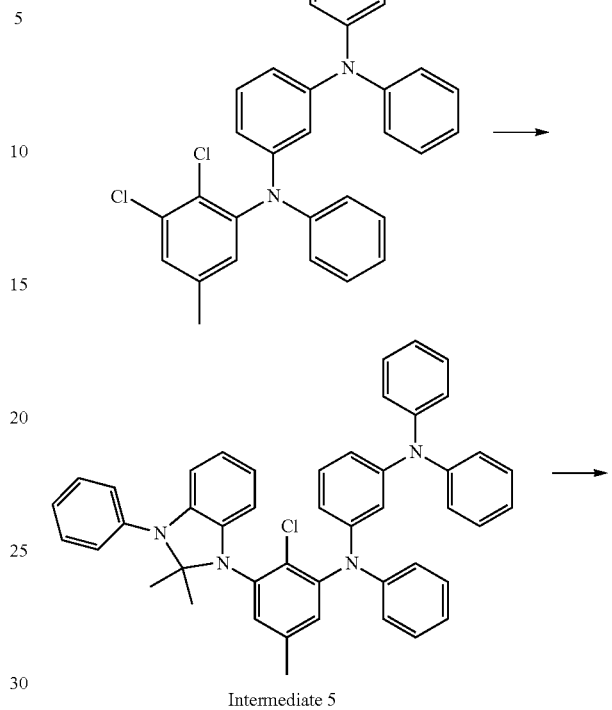

Intermediate 5

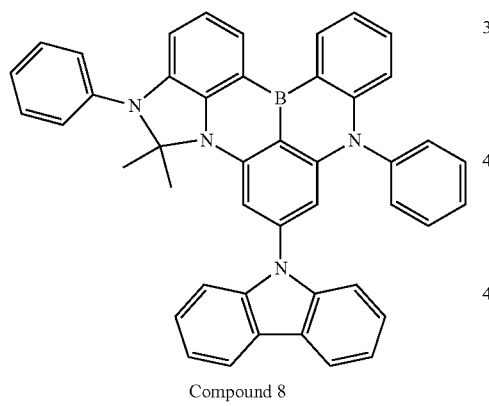

Compound 8

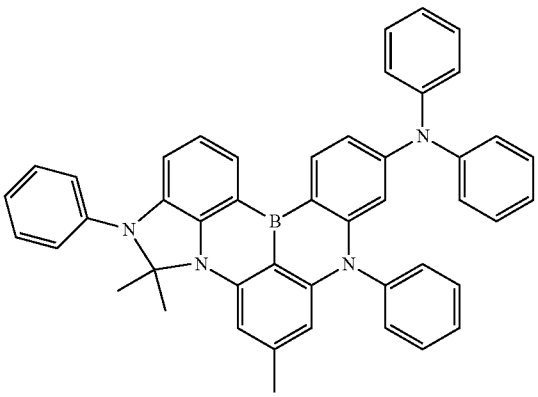

Compound 10

Compound 8 (7.0 g, 26.3%) was obtained from Intermediate 4 in the same manner as in Synthesis Example 1.

MS (ESI) calcd. for Chemical Formula: $C_{45}H_{34}BN_4$ (Pos) 641.29, found 641.2

Synthesis Example 3: Synthesis of Compound 10

Compound 10 (5.9 g, 15.3%) was obtained from Intermediate 5 in the same manner as in Synthesis Example 1.

MS (ESI) calcd. for Chemical Formula: $C_{46}H38BN_4$ (Pos)657.32, found 657.3

Synthesis Example 4: Synthesis of Compound 11

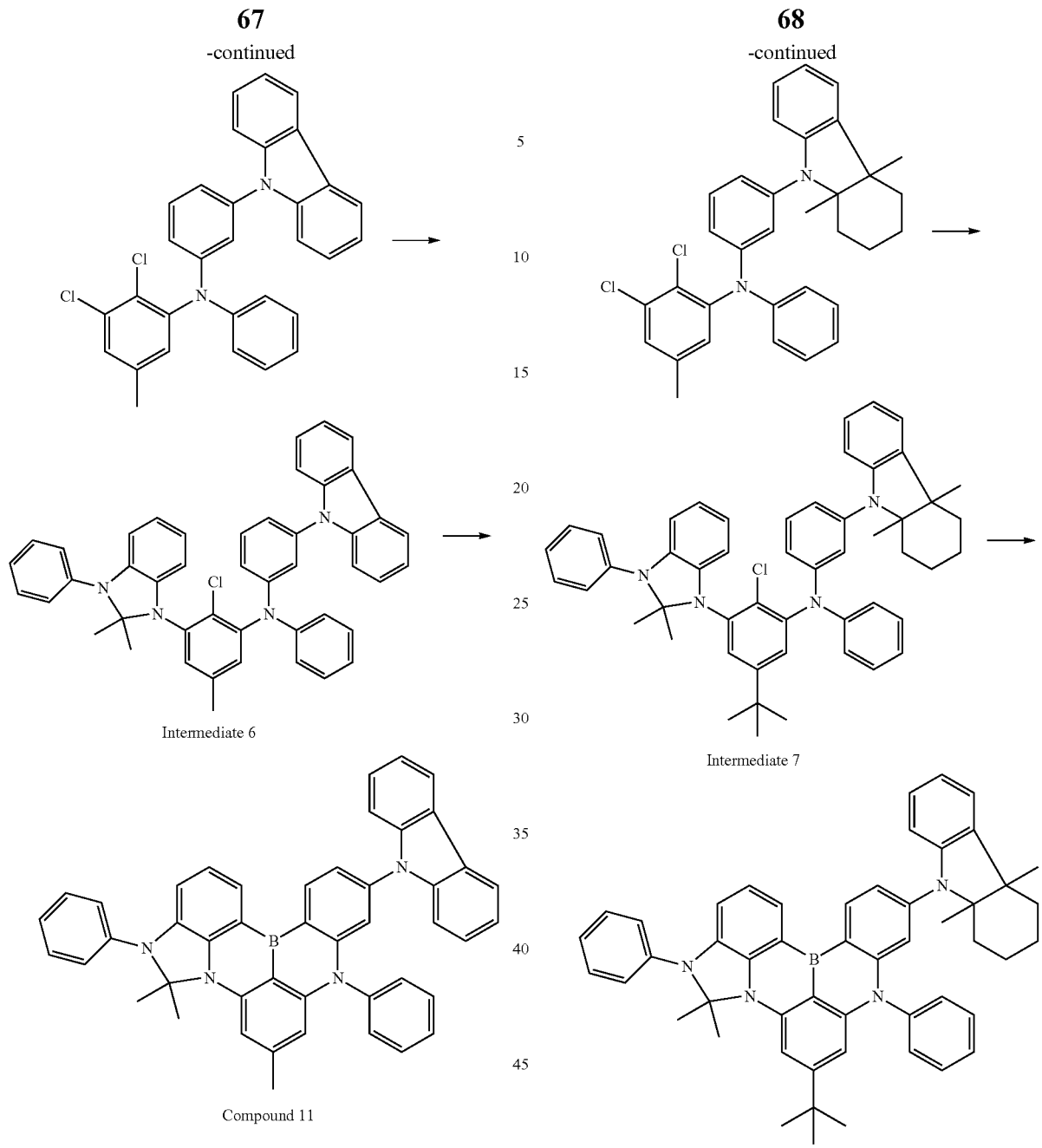
Compound 11 (5.5 g, 12.6%) was obtained from Intermediate 6 in the same manner as in Synthesis Example 1.
MS (ESI) calcd. for Chemical Formula: $C_{46}H_{36}BN_4$ (Pos)655.31, found 655.3
Synthesis Example 5: Synthesis of Compound 21
Compound 21 (3.3 g, 14.1%) was obtained from Intermediate 7 in the same manner as in Synthesis Example 1.
MS (ESI) calcd. for Chemical Formula: $C_{51}H_{52}BN_4$ (Pos)731.43, found 731.4
Synthesis Example 6: Synthesis of Compound 30

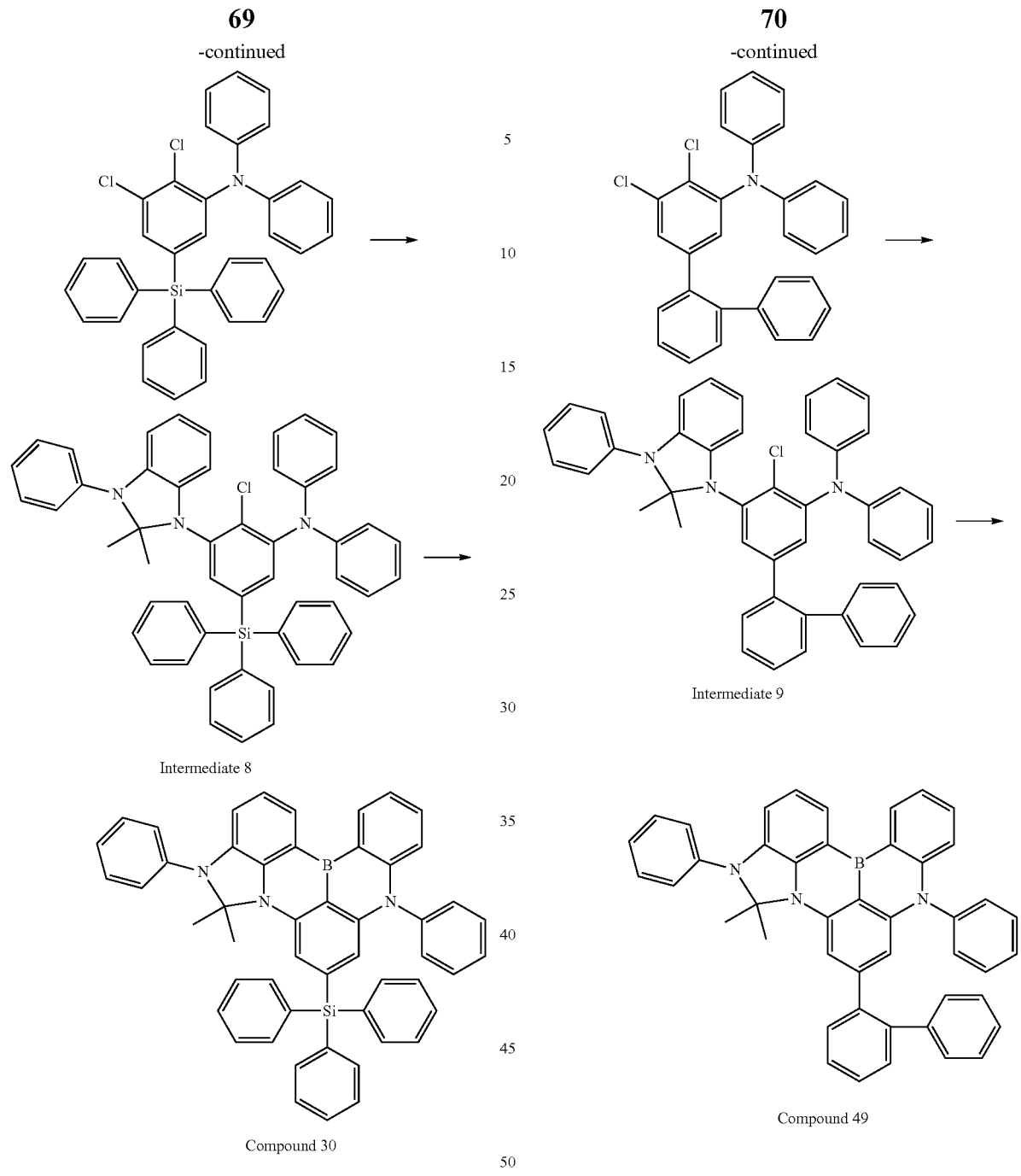

Intermediate 8

Compound 30

Intermediate 9

Compound 49

Compound 30 (2.7 g, 9.5%) was obtained from Intermediate 8 in the same manner as in Synthesis Example 1.

MS (ESI) calcd. for Chemical Formula: $C_{51}H_{41}BN_3Si$ (Pos)734.32, found 734.3

Synthesis Example 7: Synthesis of Compound 49

Compound 49 (5.5 g, 11.4%) was obtained from Intermediate 9 in the same manner as in Synthesis Example 1.

MS (ESI) calcd. for Chemical Formula: $C_{45}H_{35}BN_3$ (Pos)628.38, found 628.3

Synthesis Example 8: Synthesis of Compound 60

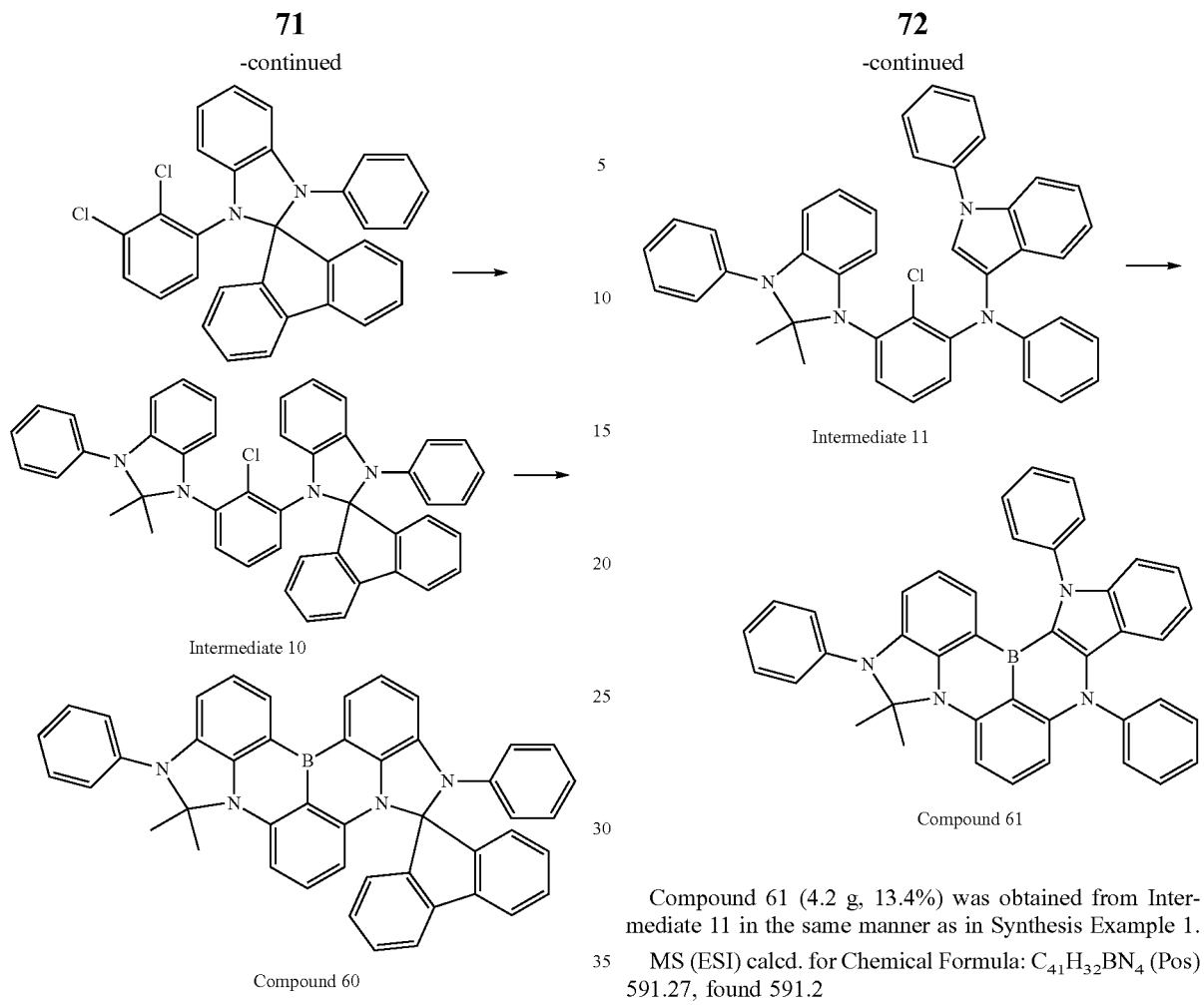

Intermediate 10

Compound 60

Compound 60 (5.5 g, 11.4%) was obtained from Intermediate 10 in the same manner as in Synthesis Example 1.

MS (ESI) calcd. for Chemical Formula: $C_{46}H34BN_4$ (Pos) 653.38, found 653.3

Synthesis Example 9: Synthesis of Compound 61

Intermediate 11

Compound 61

Compound 61 (4.2 g, 13.4%) was obtained from Intermediate 11 in the same manner as in Synthesis Example 1.

MS (ESI) calcd. for Chemical Formula: $C_{41}H_{32}BN_4$ (Pos) 591.27, found 591.2

Synthesis Example 10: Synthesis of Compound 63

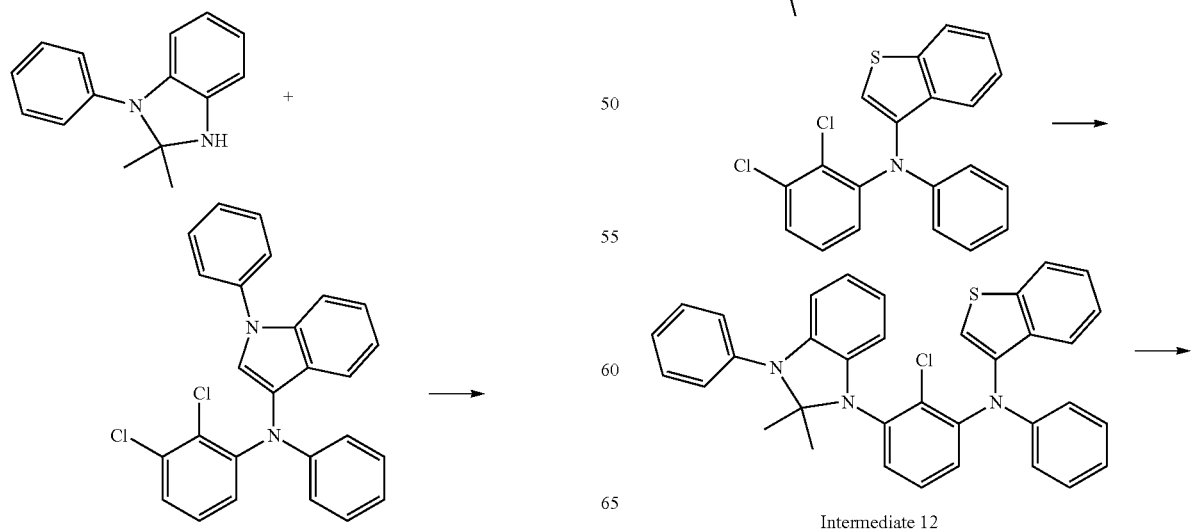

Intermediate 12

-continued

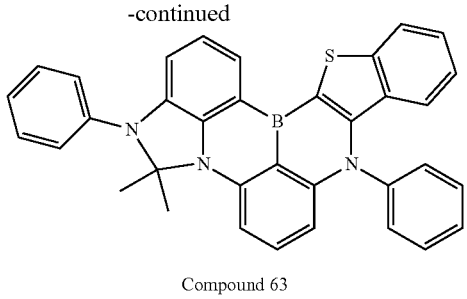

Compound 63

Compound 63 (7.1 g, 12.2%) was obtained from Intermediate 12 in the same manner as in Synthesis Example 1.

MS (ESI) calcd. for Chemical Formula: $C_{35}H_{27}BN_3S$ (Pos)532.20, found 532.2

Synthesis Example 11: Synthesis of Compound 64

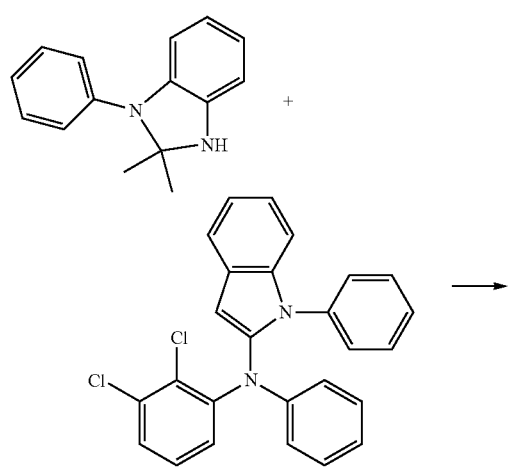

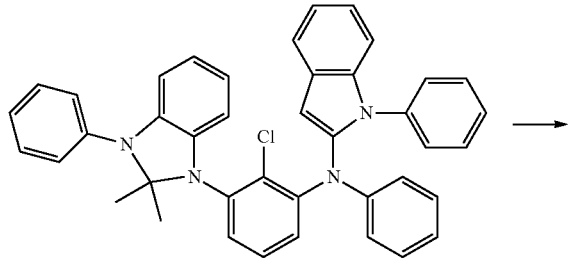

Intermediate 13

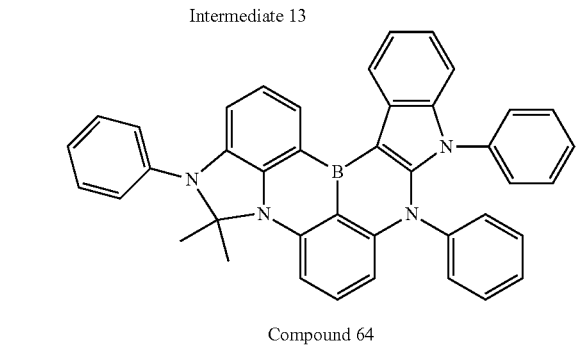

Compound 64

Compound 64 (9.3 g, 17.1%) was obtained from Intermediate 13 in the same manner as in Synthesis Example 1.

MS (ESI) calcd. for Chemical Formula: $C_{41}H_{32}BN_4$ (Pos) 591.27, found 591.2

Synthesis Example 12: Synthesis of Compound 70

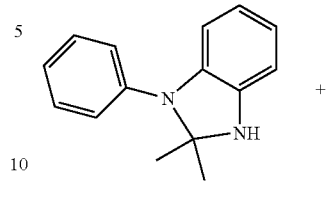

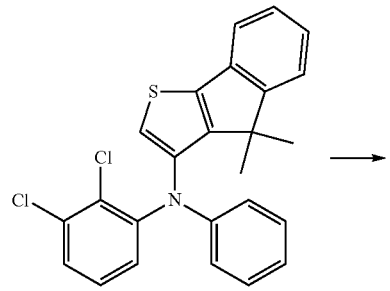

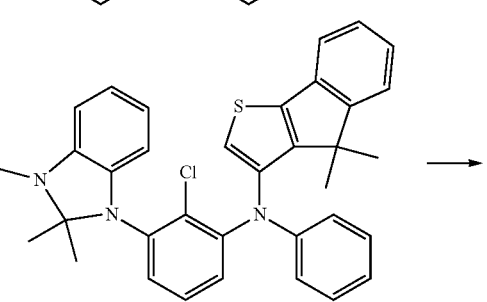

Intermediate 14

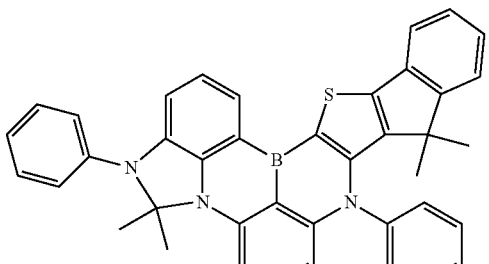

Compound 70

Compound 70 (2.6 g, 8.3%) was obtained from Intermediate 14 in the same manner as in Synthesis Example 1.

MS (ESI) calcd. for Chemical Formula: $C_{40}H_{133}BN_3S$ (Pos)598.25, found 598.2

Synthesis Example 13: Synthesis of Compound 82

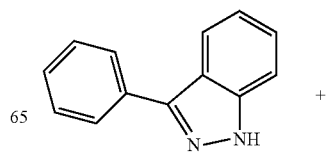

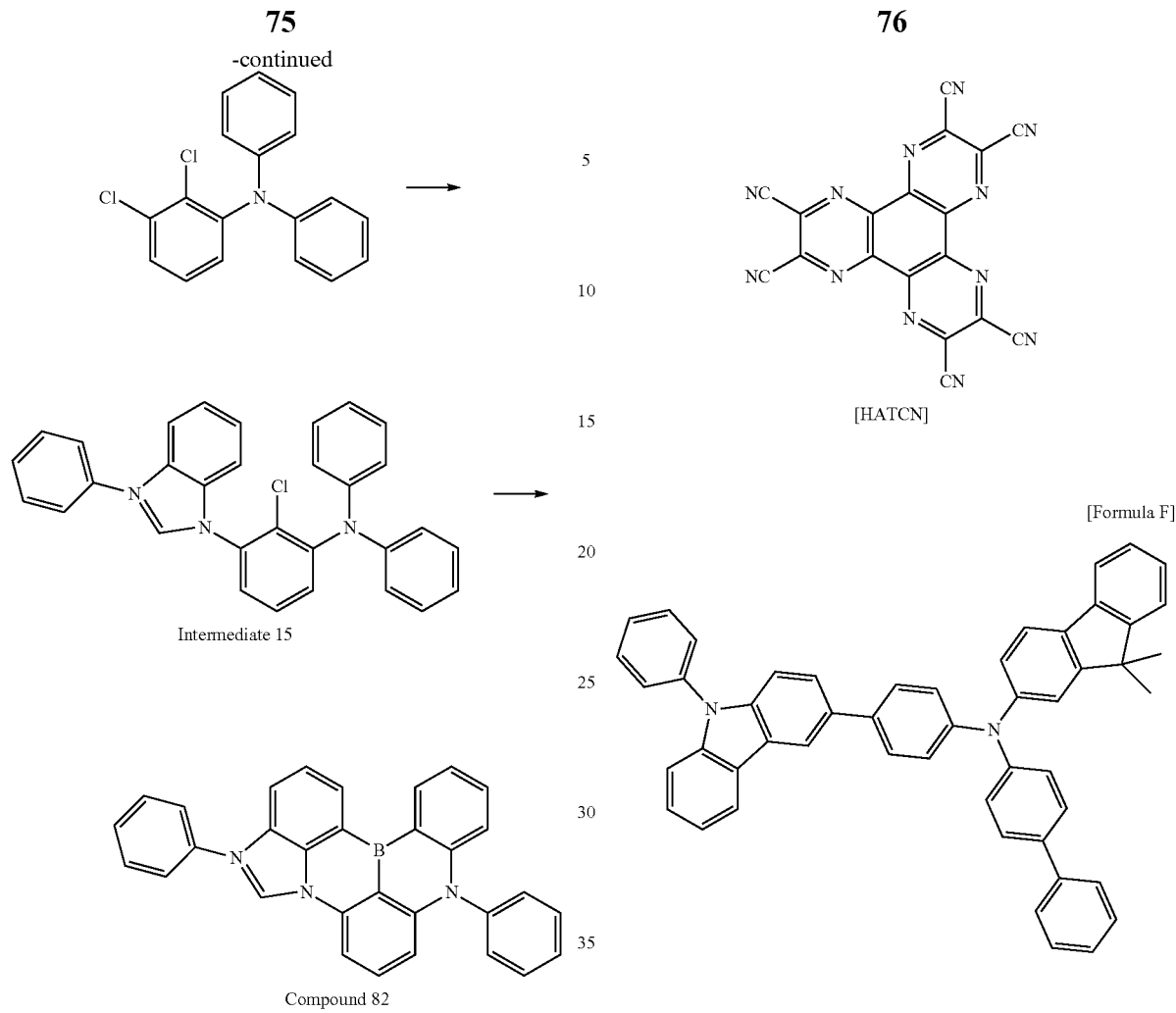

Intermediate 15

Compound 82

Compound 82 (2.5 g, 8.9%) was obtained from Intermediate 15 in the same manner as in Synthesis Example 1.

MS (ESI) calcd. for Chemical Formula: $C_{31}H_{21}BN_3$ (Pos) 446.19, found 446.1

Examples 1-10: Fabrication of Organic Electroluminescent Devices

ITO glass was patterned to have a light emitting area of 2 mm×2 mm, followed by cleaning. After the cleaned ITO glass was mounted in a vacuum chamber, the base pressure was adjusted to $1\times10^{-7}$ torr. HATCN (700 Å) and the compound represented by Formula F (250 Å) were deposited in this order on the ITO. A mixture of the host represented by BH1 and the inventive compound (3 wt %) shown in Table 1 was used to form a 250 Å thick light emitting layer. Thereafter, a mixture of the compound represented by Formula E-1 and the compound represented by Formula E-2 in a ratio of 1:1 was used to form a 300 Å thick electron transport layer on the light emitting layer. The compound represented by Formula E-1 was used to form a 5 Å thick electron injecting layer on the electron transport layer. Al was used to form a 1000 Å thick Al electrode on the electron injecting layer, completing the fabrication of an organic electroluminescent device. The luminescent properties of the organic electroluminescent device were measured at 0.4 mA.

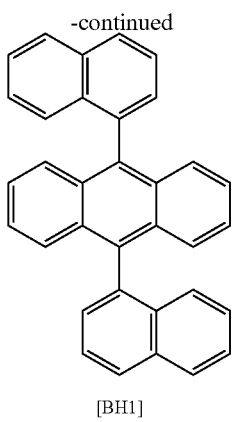

[BH1]

Comparative Examples 1-3

Organic electroluminescent devices were fabricated in the same manner as in Examples 1-10, except that BD1, BD2 or BD3 was used instead of the inventive compound. The luminescent properties of the organic electroluminescent devices were measured at 0.4 mA. The structures of BD1 to BD3 are as follow:

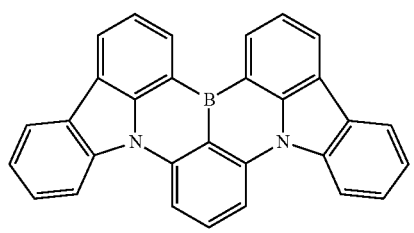

[BD1]

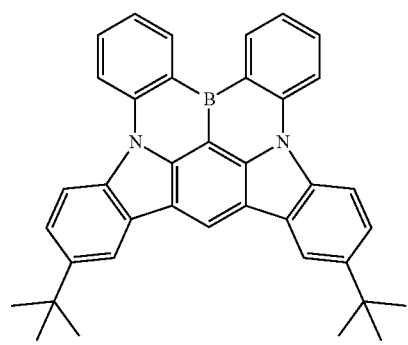

[BD2]

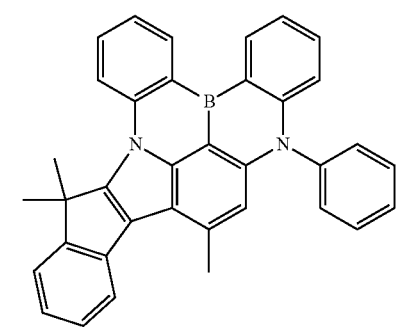

[BD3]

The organic electroluminescent devices of Examples 1-10 and Comparative Examples 1-3 were measured for voltage, efficiency, and lifetime. The results are shown in Table 1.

TABLE 1

| Example No. | Dopant | Driving voltage (V) | Efficiency (Cd/A) | LT97 (hr) |
|---|---|---|---|---|
| Example 1 | Compound 1 | 3.9 | 6.7 | 157 |
| Example 2 | Compound 4 | 3.9 | 6.8 | 141 |
| Example 3 | Compound 10 | 3.9 | 6.6 | 145 |
| Example 4 | Compound 11 | 3.9 | 7.5 | 120 |
| Example 5 | Compound 21 | 4.0 | 7.3 | 160 |
| Example 6 | Compound 30 | 4.1 | 7.0 | 155 |
| Example 7 | Compound 33 | 3.9 | 6.8 | 170 |
| Example 8 | Compound 49 | 4.0 | 7.7 | 160 |
| Example 9 | Compound 60 | 3.9 | 7.0 | 153 |
| Example 10 | Compound 61 | 3.9 | 7.1 | 124 |
| Comparative Example 1 | BD1 | 4.1 | 6.3 | 50 |
| Comparative Example 2 | BD2 | 4.3 | 6.2 | 35 |
| Comparative Example 3 | BD3 | 4.1 | 6.2 | 25 |

As can be seen from the results in Table 1, the organic electroluminescent devices of Examples 1-10, each of which employed the inventive compound, had high efficiencies and particularly showed significantly improved life characteristics compared to the devices of Comparative Examples 1-3.

INDUSTRIAL APPLICABILITY

The polycyclic compound of the present invention can be employed in an organic layer of an organic electroluminescent device to achieve high efficiency and long lifetime of the device. Due to these advantages, the organic electroluminescent device can find useful industrial application in various displays.

The invention claimed is:

1. An organic electroluminescent compound represented by Formula A:

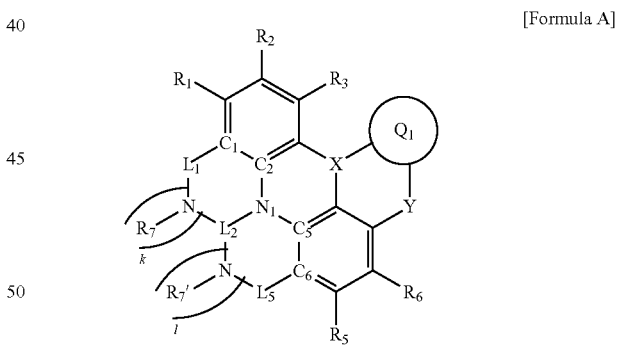

[Formula A]

wherein X is selected from B, N, $CR_8$, $SiR_9$, P, P=O, and P=S, Y is a single bond or a divalent group selected from the following structures Y-1 to Y-11:

(Y-1)

(Y-2)

-continued

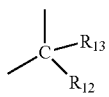 (Y-3)

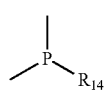 (Y-4)

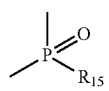 (Y-5)

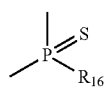 (Y-6)

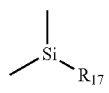 (Y-7)

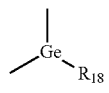 (Y-8)

 (Y-9)

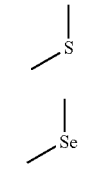 (Y-10)

 (Y-11)

$Q_1$ is a 3-to 8-membered monocyclic or polycyclic aliphatic, aromatic or non-aromatic ring optionally containing at least one hydrocarbon or heteroatom, $C_1$, $C_2$, $C_5$, and $C_6$ are carbon atoms (C), $N_1$ is a nitrogen atom (N), L1, L2, and L5 are identical to or different from each other and are single bonds or substituted or unsubstituted aliphatic linkers connecting $C_1$ to N-$R_7$, $N_1$ to N-$R_7$ and N-$R_7'$, and $C_6$ to N-$R_7'$, respectively, that optionally contain at least one hydrocarbon or heteroatom, each of k and l is an integer of 0 or 1, with the proviso that k and l are not simultaneously zero, and $R_1$ to $R_{18}$ and $R_7'$ are identical to or different from each other and are each independently selected from hydrogen, deuterium, substituted or unsubstituted $C_1$-$C_{30}$ alkyl, $C_2$-$C_{24}$ alkenyl, $C_2$-$C_{24}$ alkynyl, substituted or unsubstituted $C_6$-$C_{50}$ aryl, substituted or unsubstituted $C_3$-$C_{30}$ cycloalkyl, substituted or unsubstituted $C_1$-$C_{30}$ heterocycloalkyl, substituted or unsubstituted $C_1$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, substituted or unsubstituted $C_6$-$C_{30}$ arylsilyl, nitro, cyano, halogen, and substituted or unsubstituted $C_1$-$C_{30}$ non-aromatic rings, with the proviso that each of $R_1$ to $R_{18}$, $R_7'$, $L_1$, $L_2$, $L_5$, $Q_1$, and their substituents optionally forms a substituted or unsubstituted ring with an adjacent substituent.

2. The organic electroluminescent compound according to claim 1, wherein $R_3$ and $Q_1$ are bonded together to form a substituted or unsubstituted aliphatic, aromatic or non-aromatic ring containing at least one hydrocarbon or heteroatom.

3. The organic electroluminescent compound according to claim 1, wherein the compound represented by Formula A is selected from the group consisting of the following compounds 1 to 156:

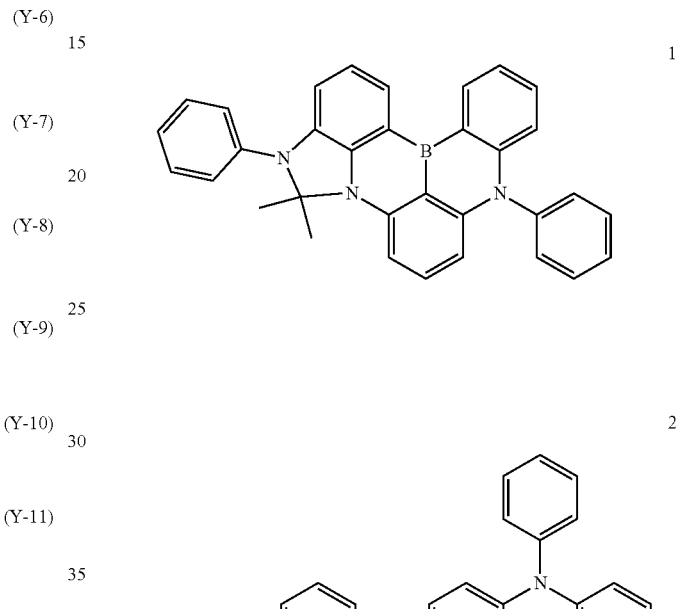

1

2

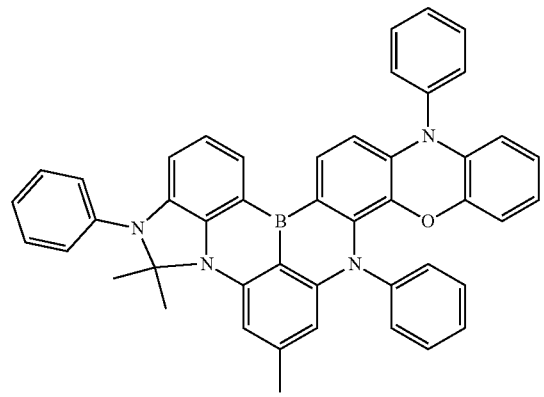

3

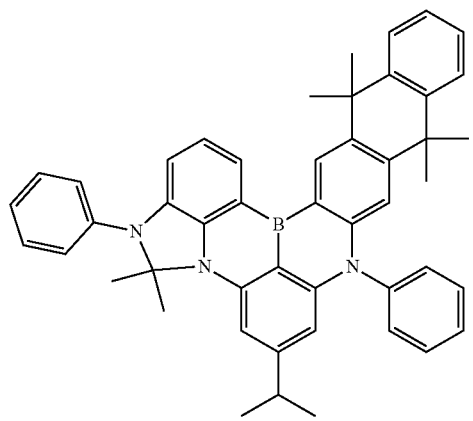

81
-continued
4
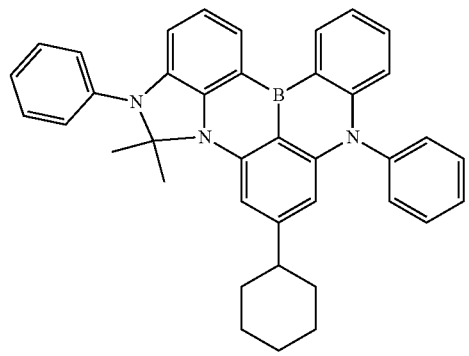
5
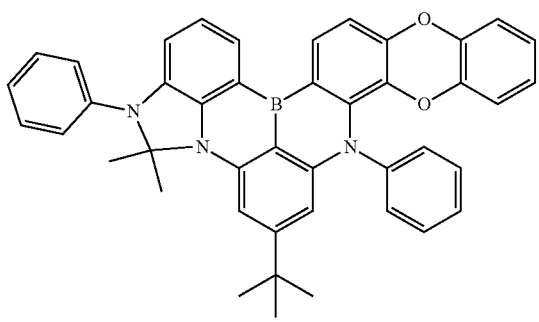
6
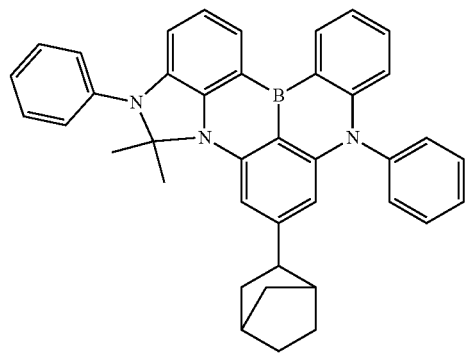
7
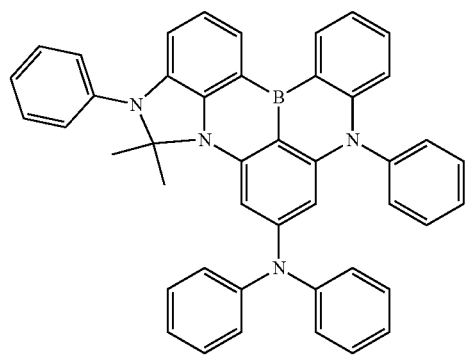
82
-continued
8
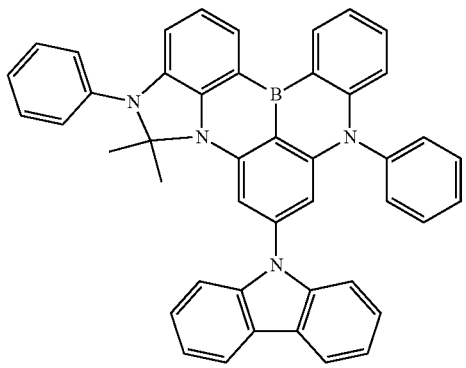
9
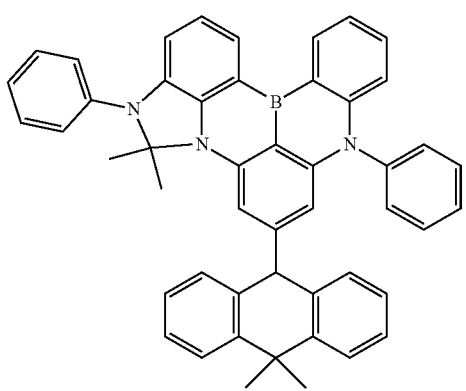
10
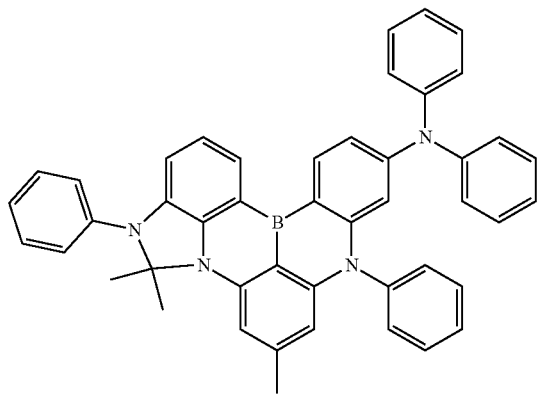
11
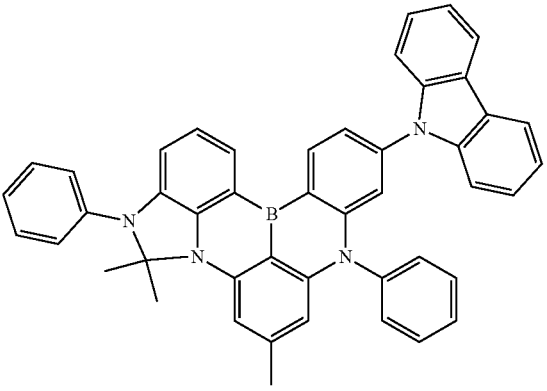

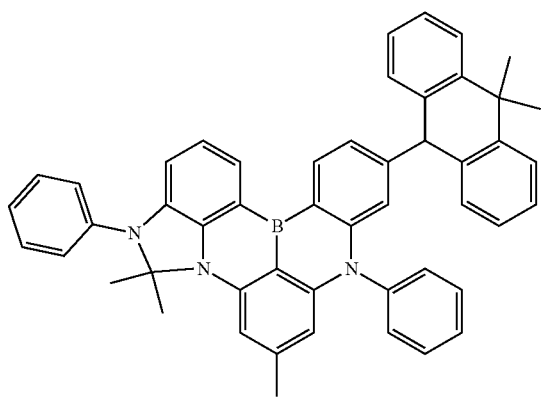
12
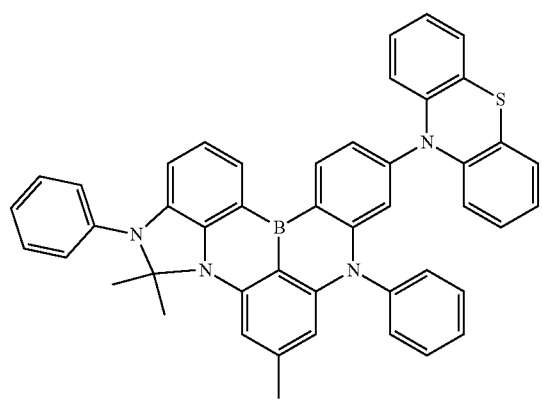
13
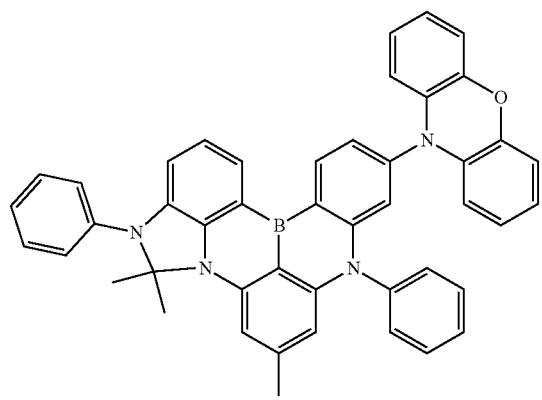
14
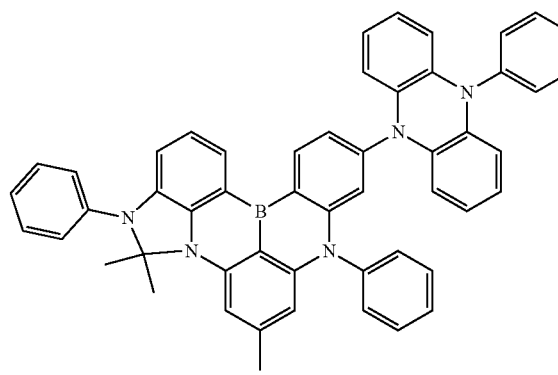
15
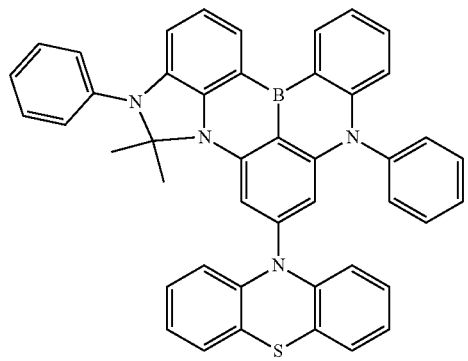
16
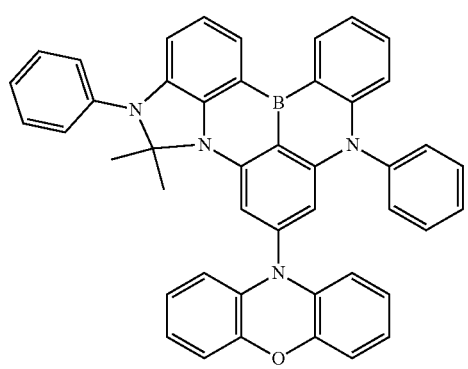
17
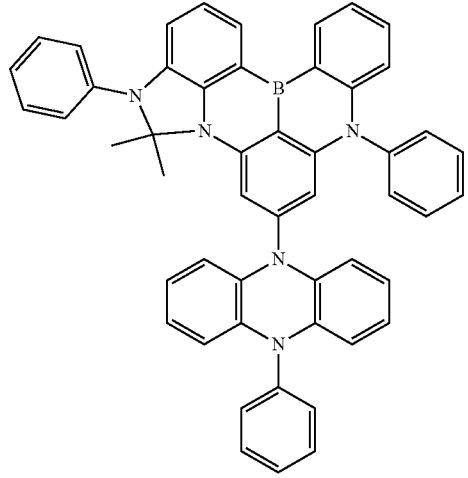
18
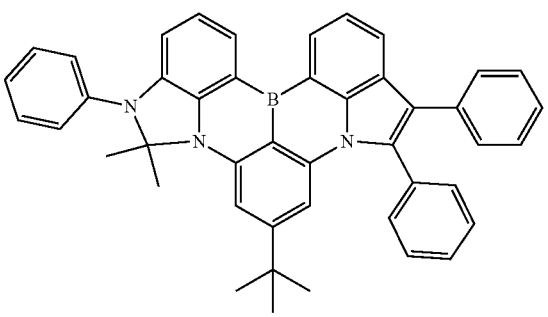
19

-continued
20
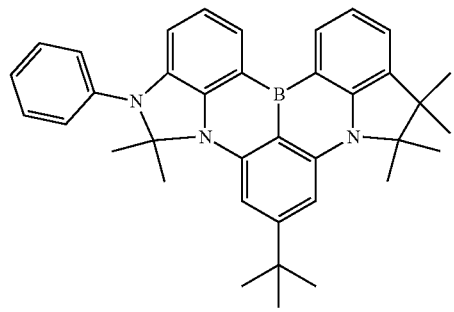
21
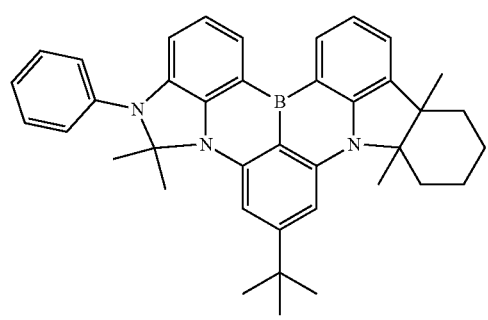
22
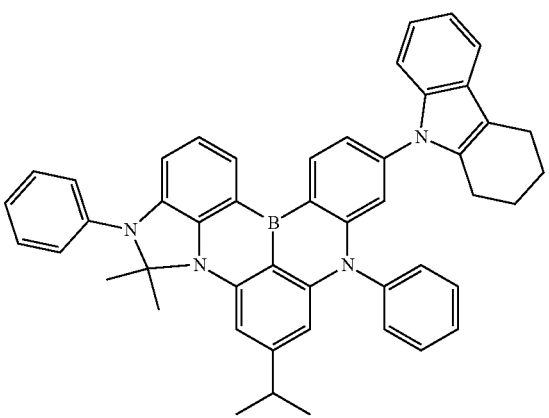
23
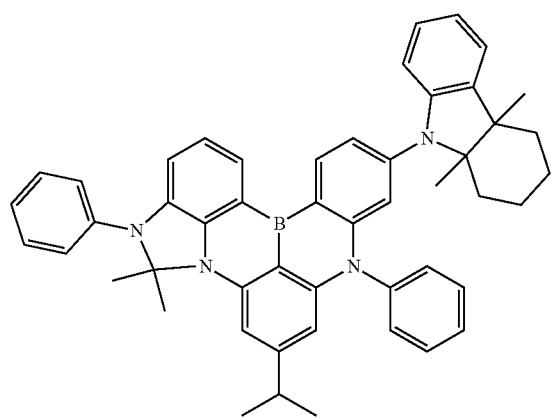
-continued
24
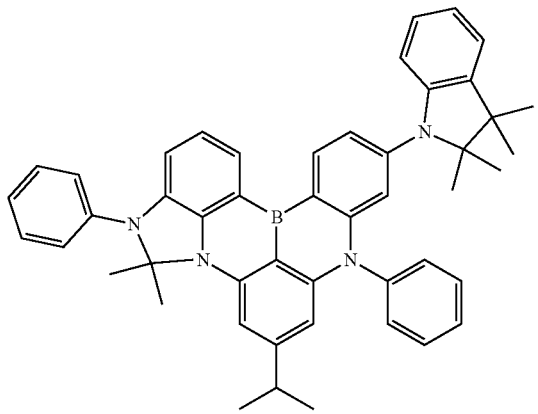
25
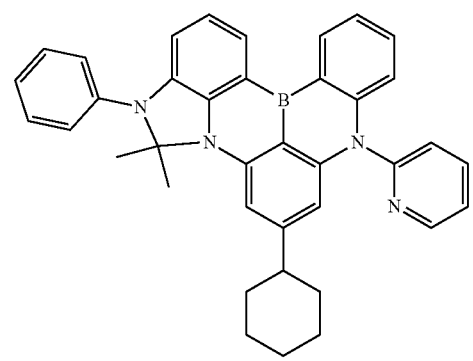
26
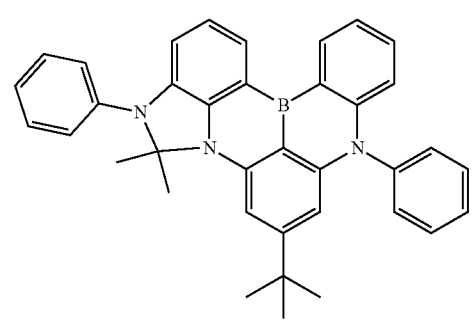
27
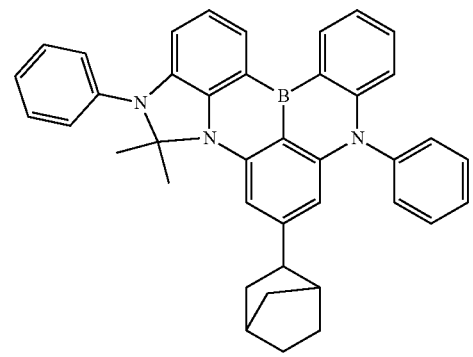

28
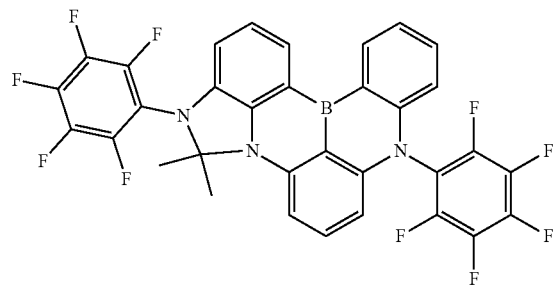
29
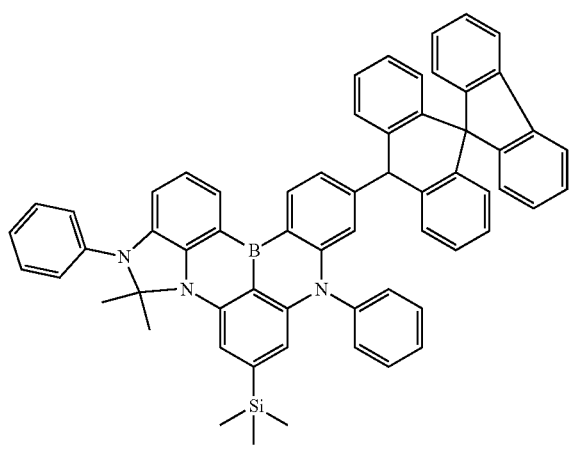
30
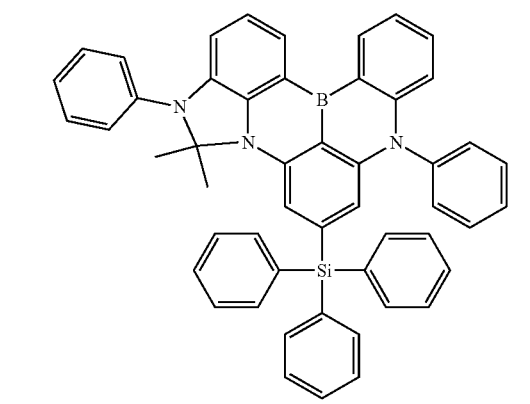
31
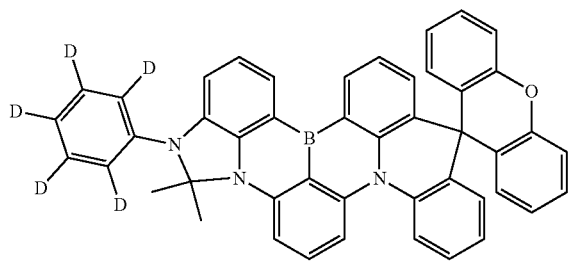
32
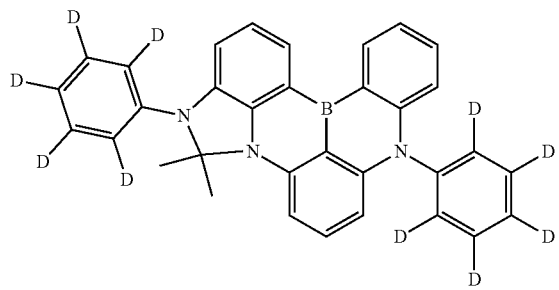
33
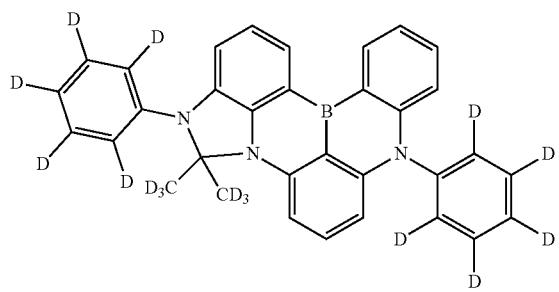
34
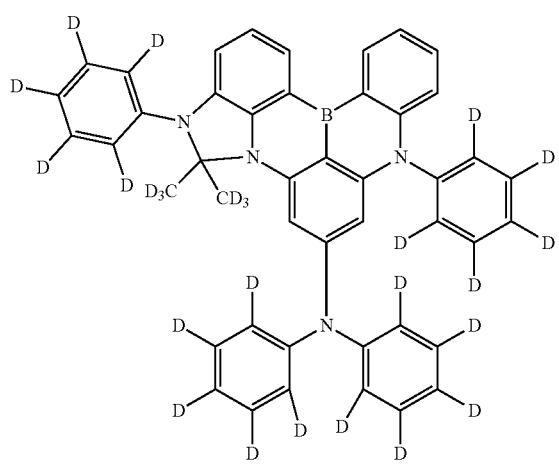
35
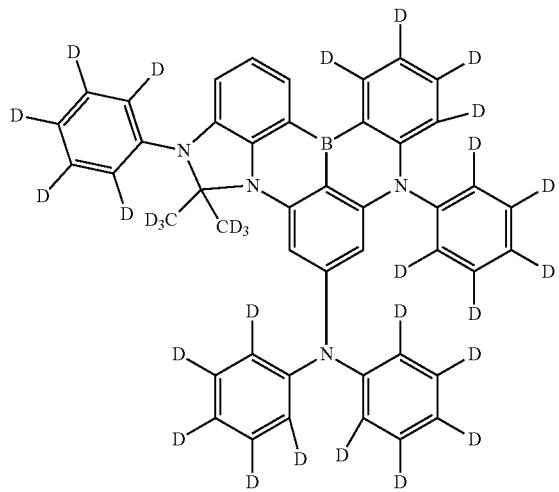

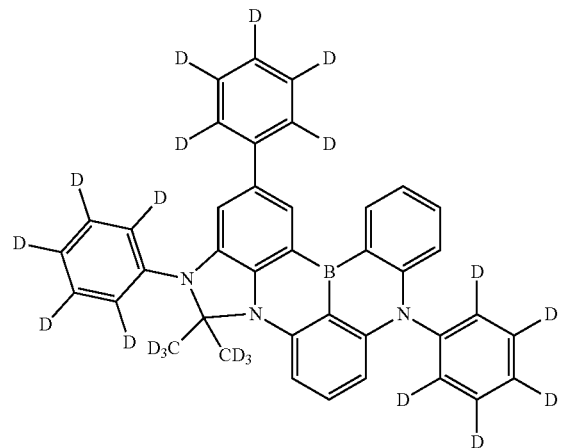
36
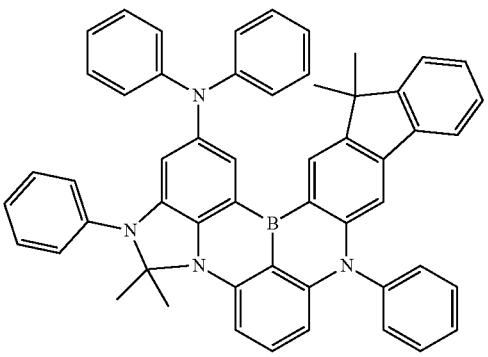
37
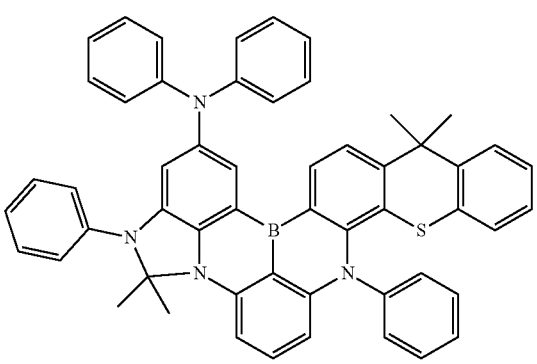
38
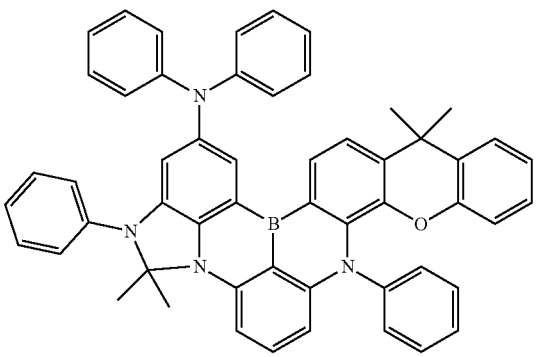
39
40
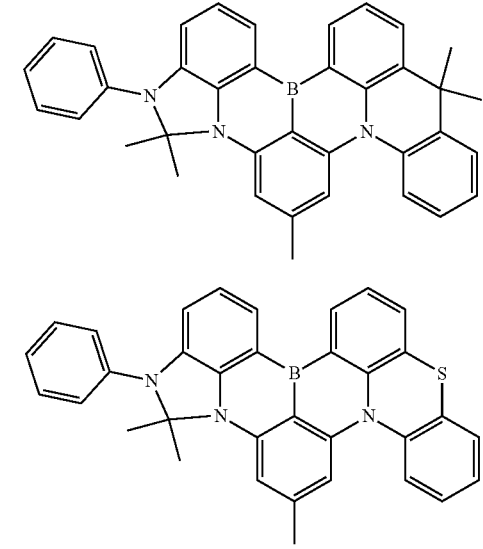
41
42
43
44

45
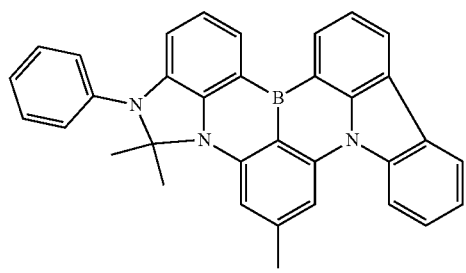
46
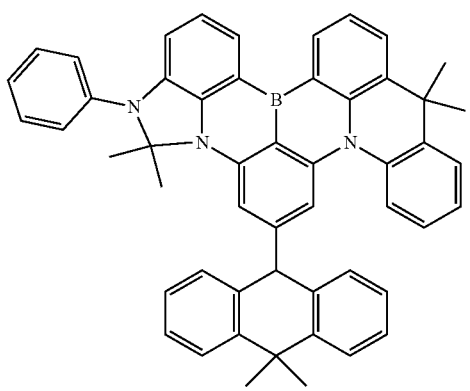
47
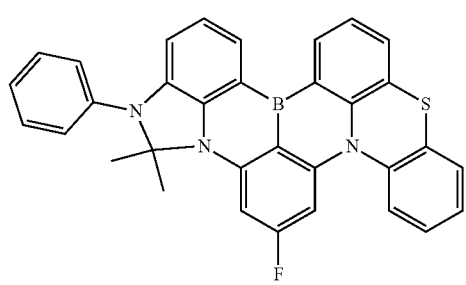
48
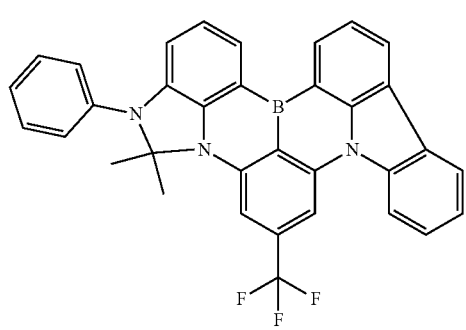
49
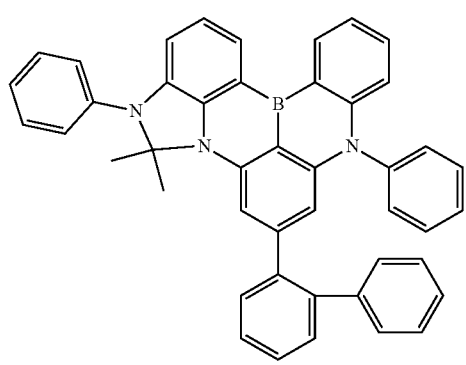
50
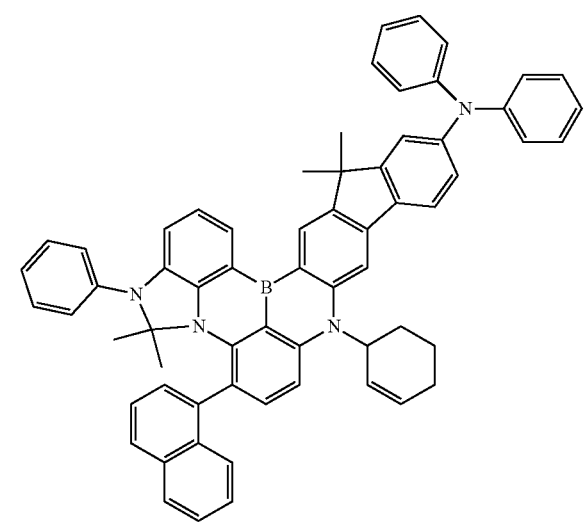
51
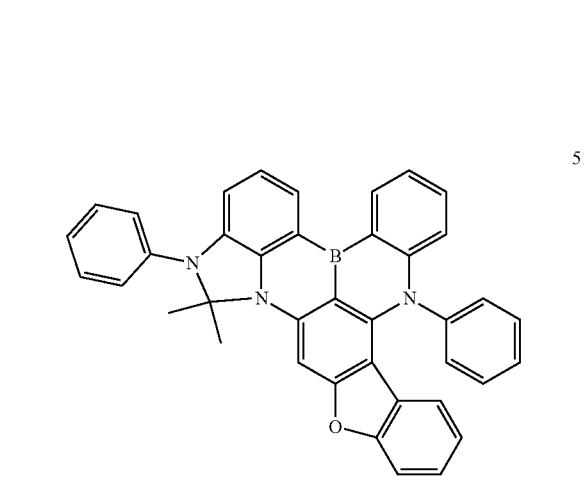
52
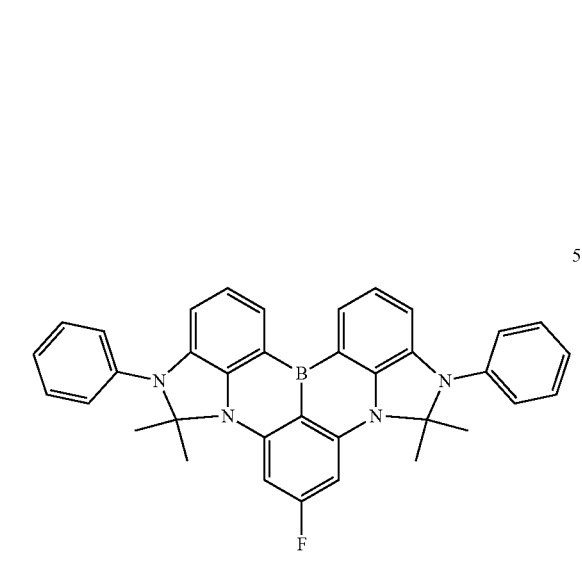

53
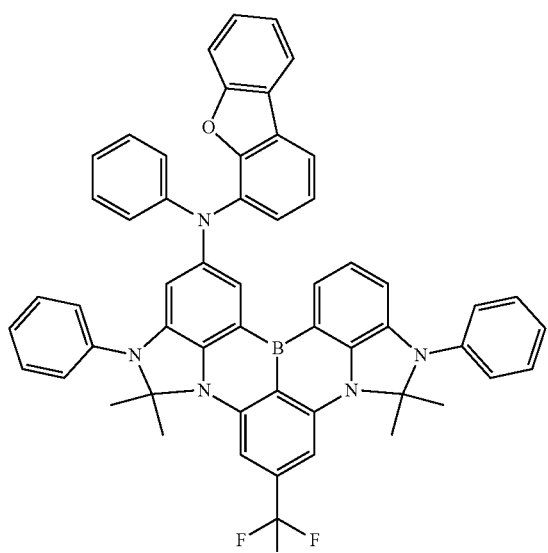
54
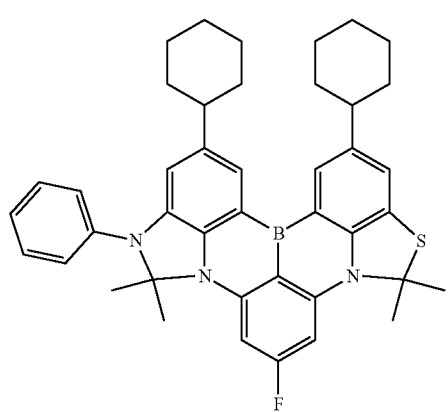
55
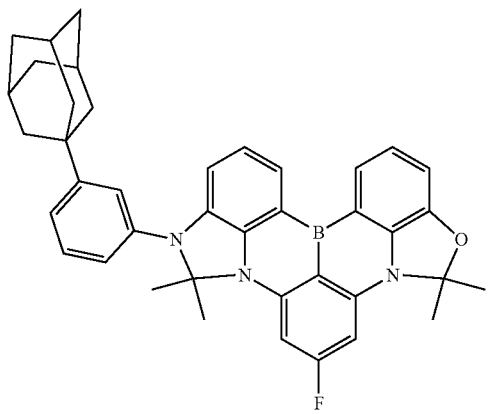
56
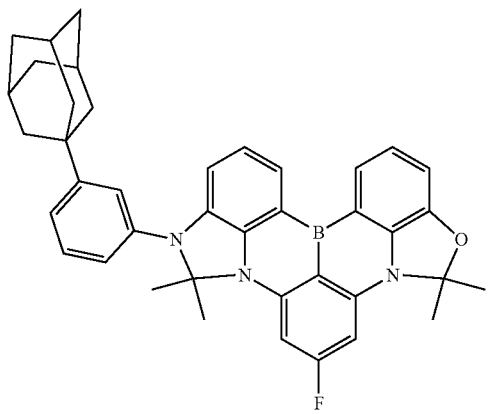
57
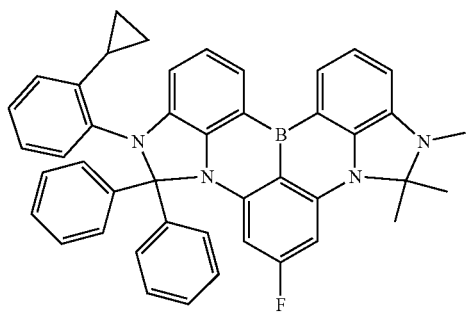
58
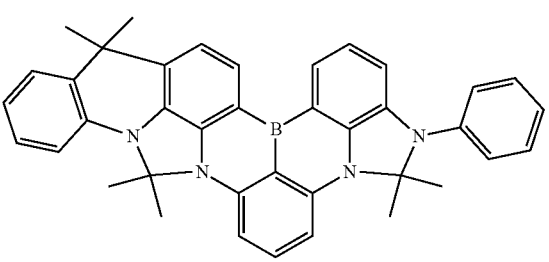
59
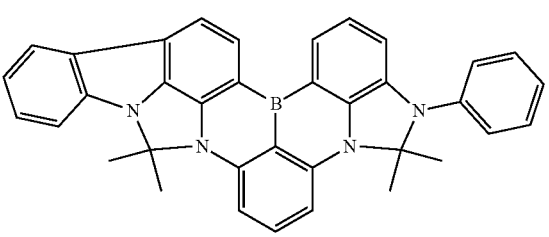
60
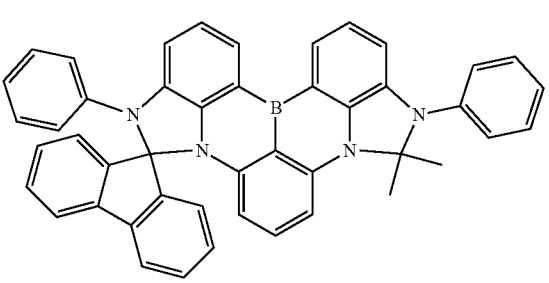

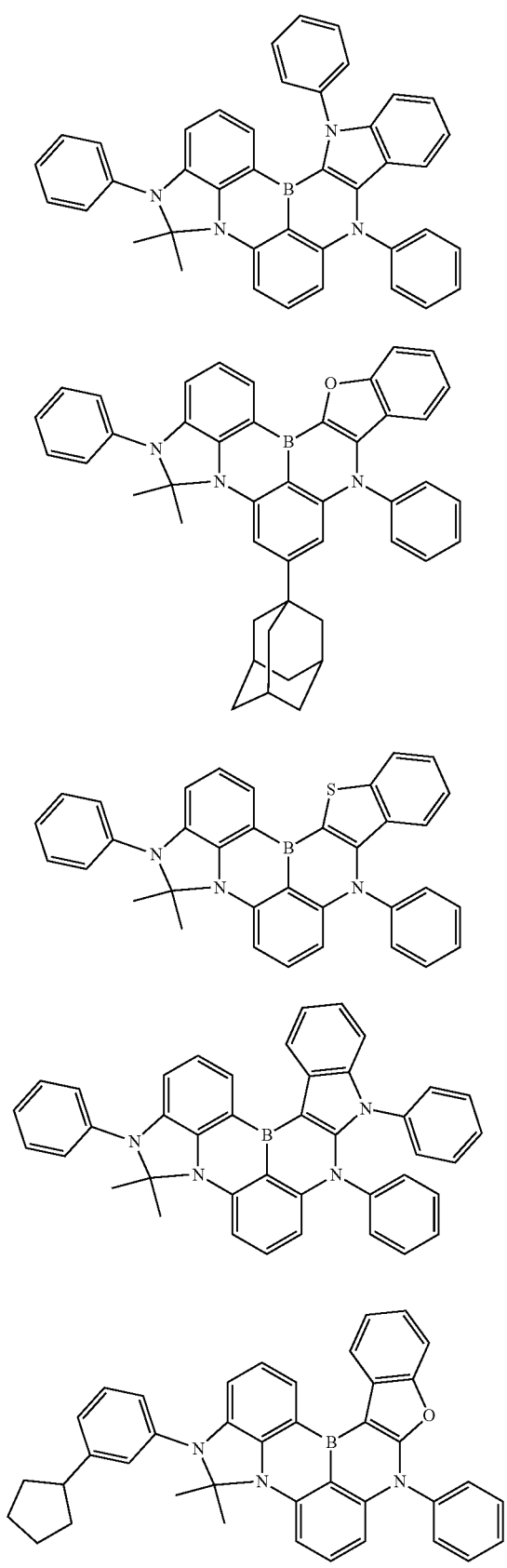
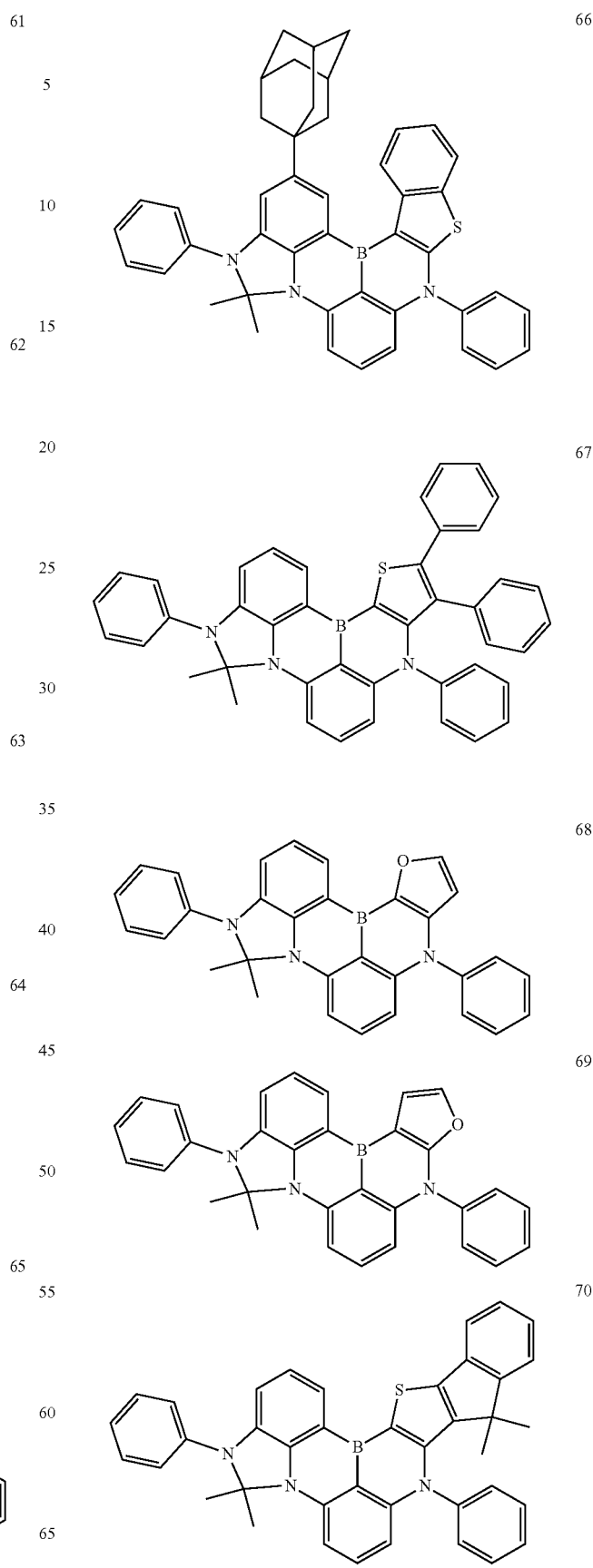

71
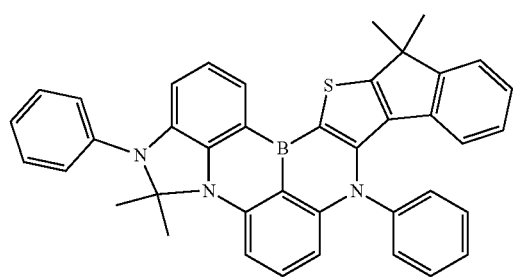
72
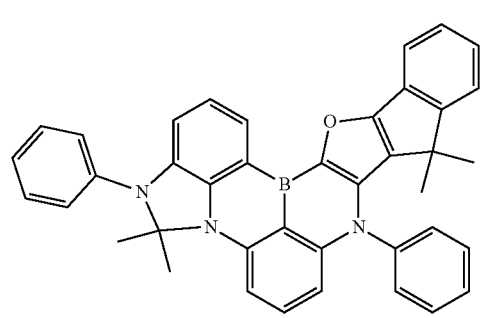
73
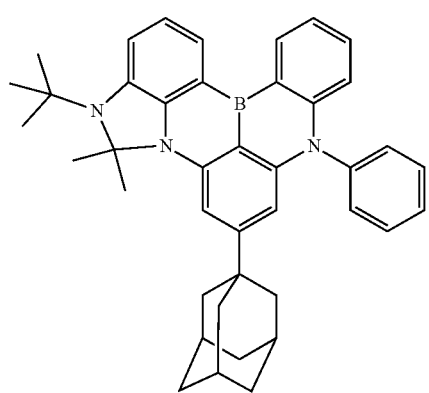
74
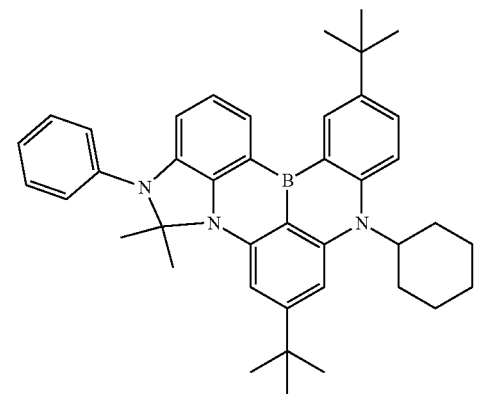
75
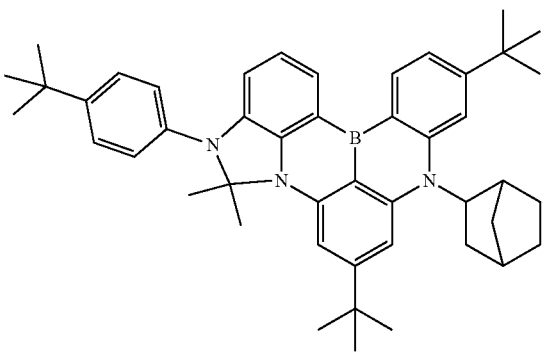
76
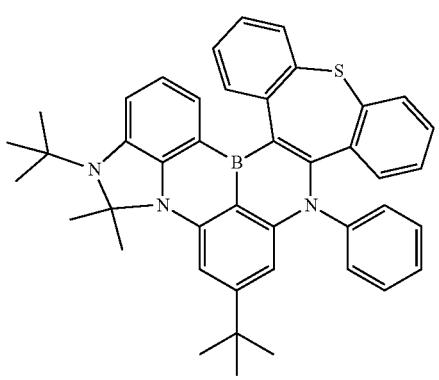
77
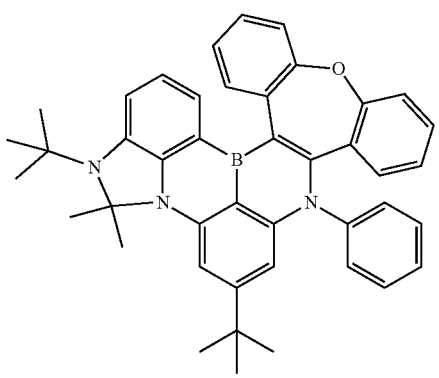
78
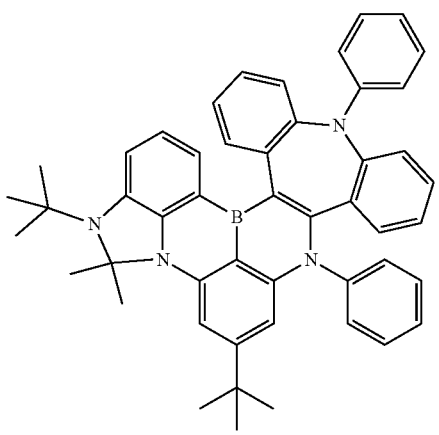

-continued
79
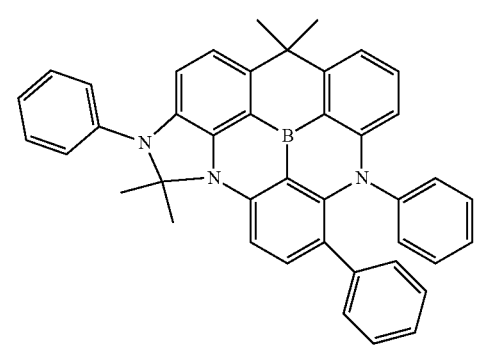
80
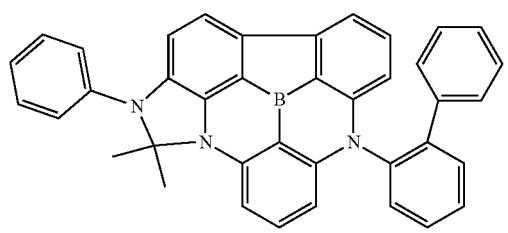
81
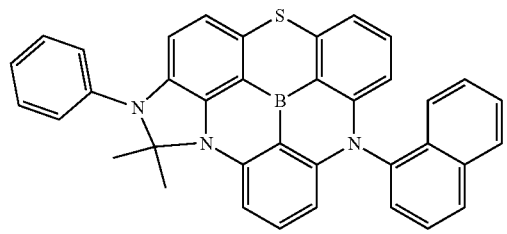
82
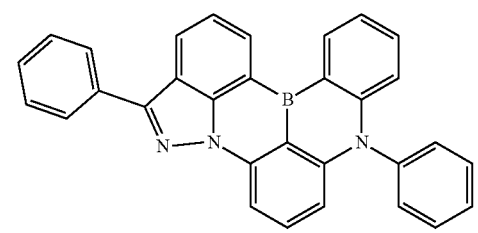
83
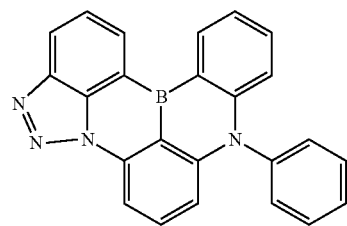
84
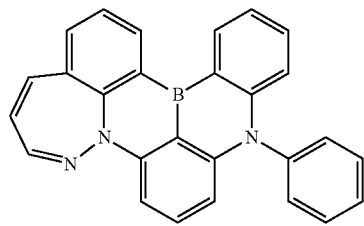
-continued
85
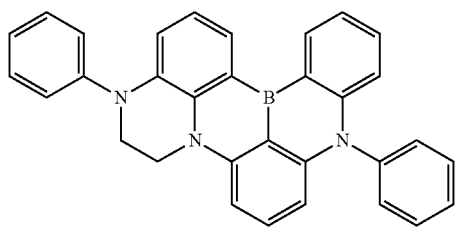
86
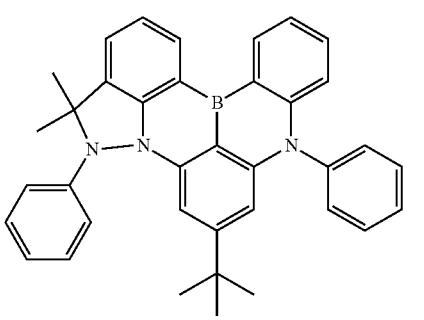
87
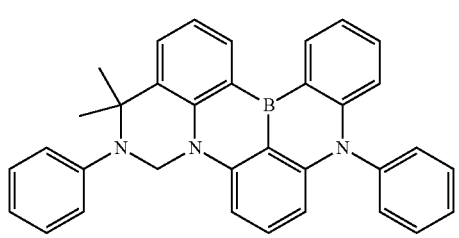
88
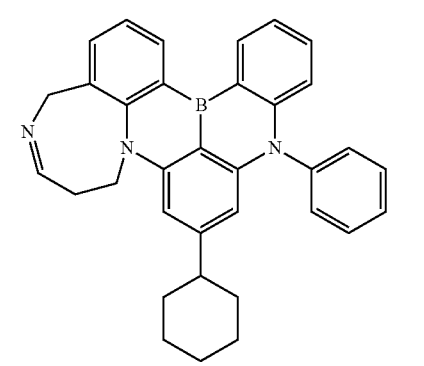
89
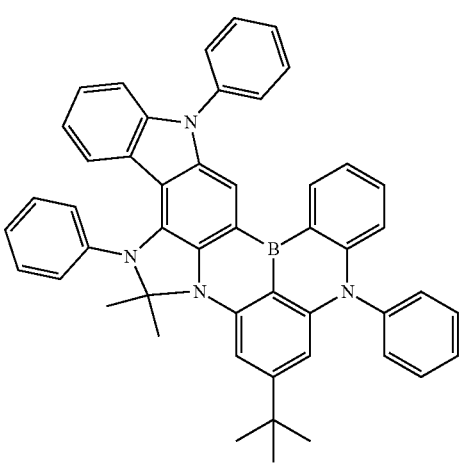

-continued
90
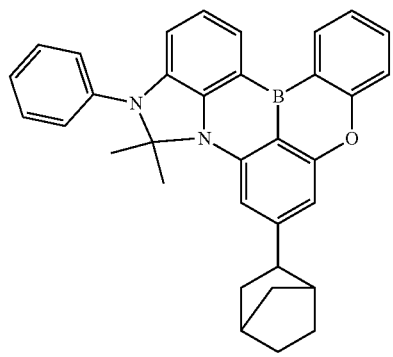
91
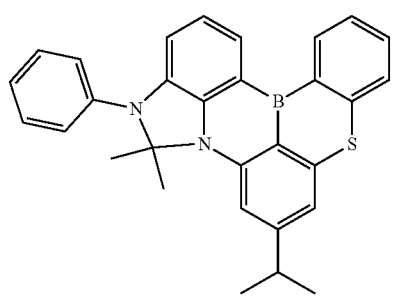
92
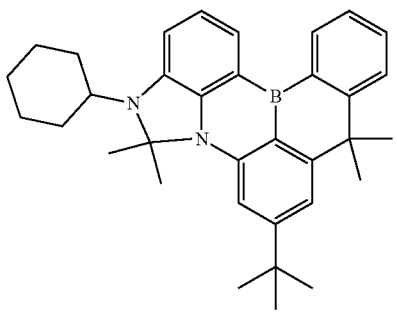
93
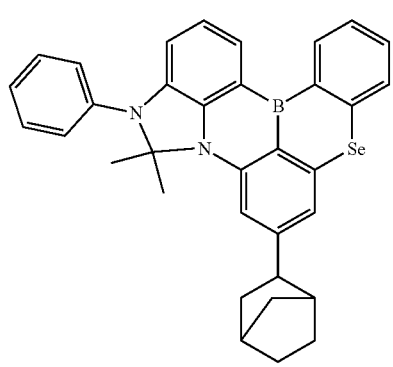
94
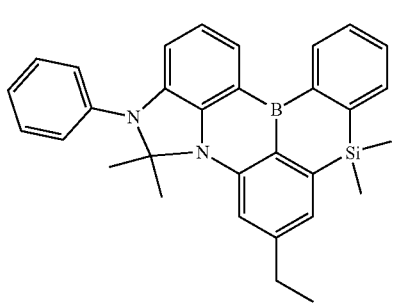
-continued
95
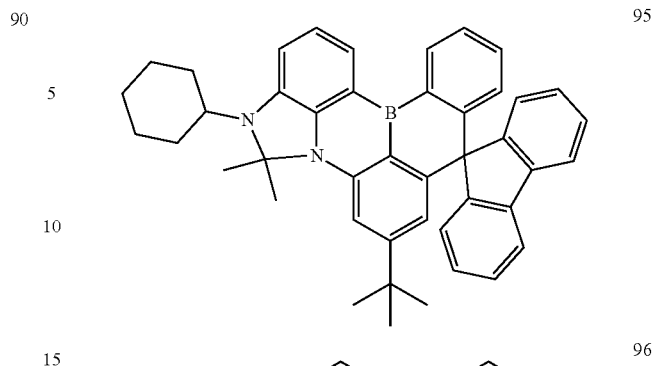
96
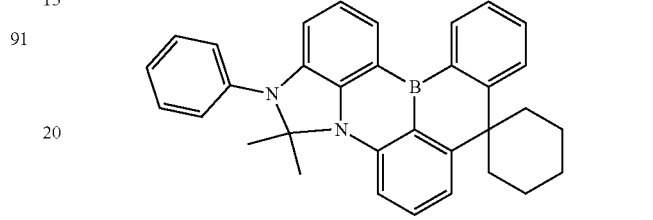
97
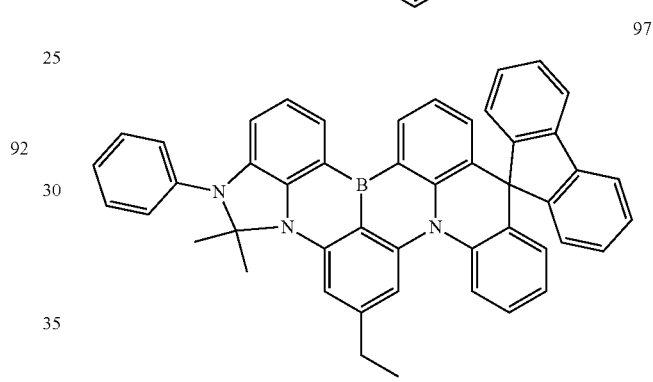
98
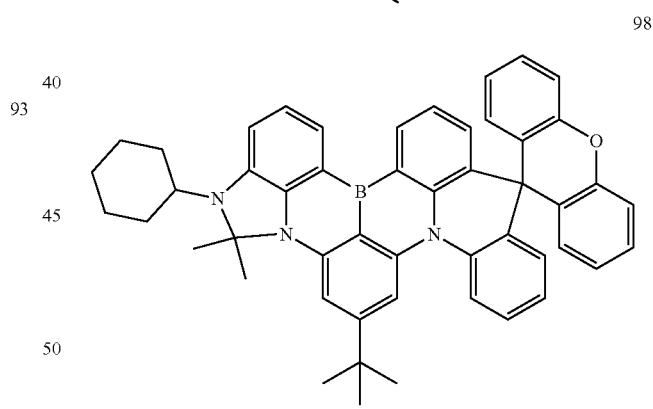
99
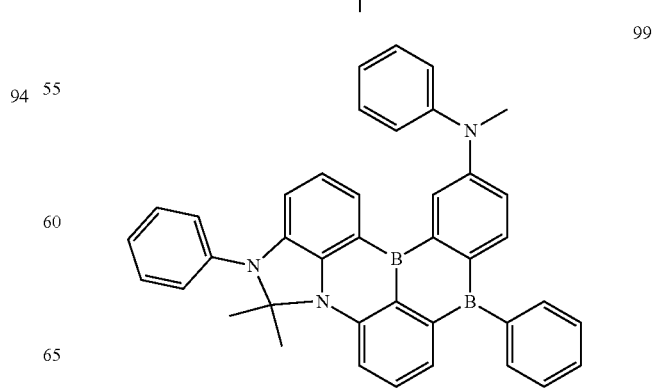

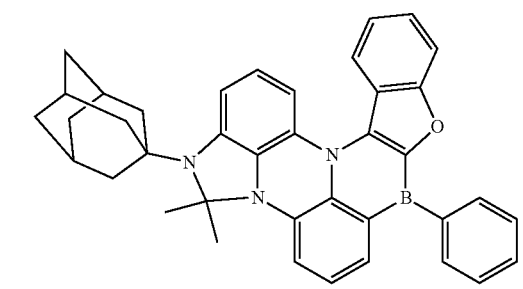
100
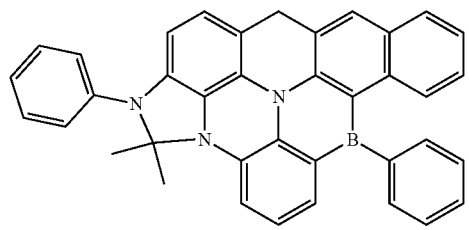
105
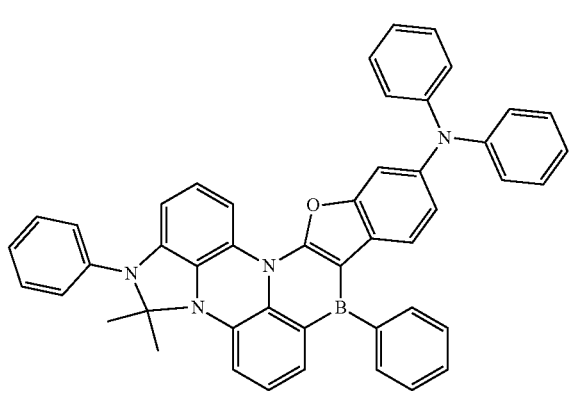
101
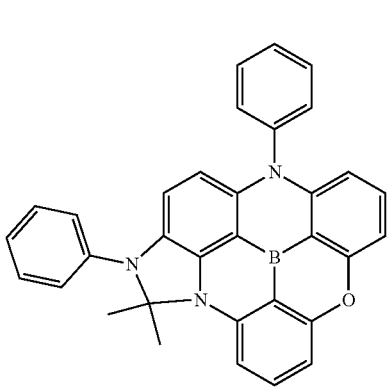
106
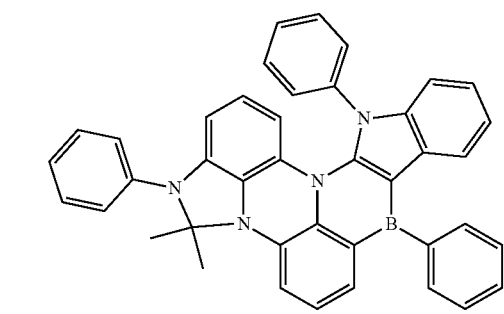
102
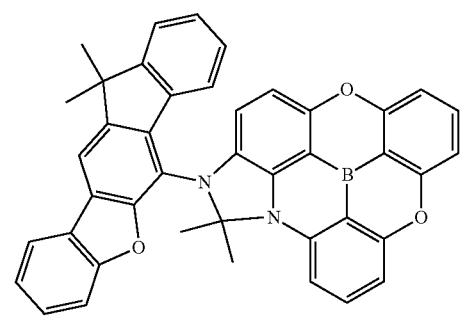
107
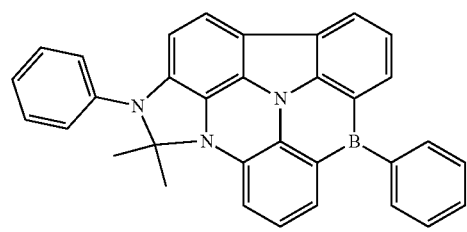
103
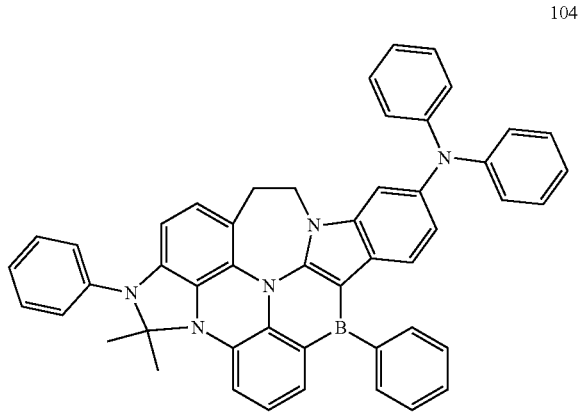
104
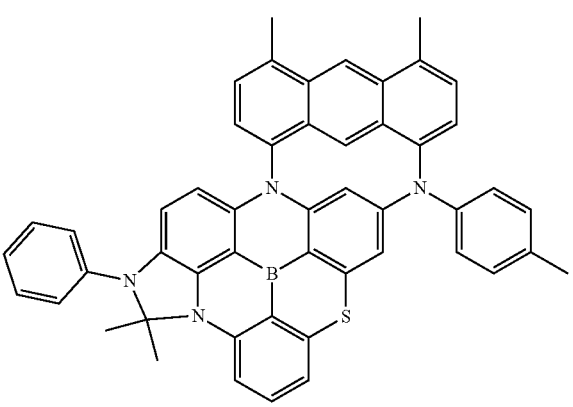
108

109
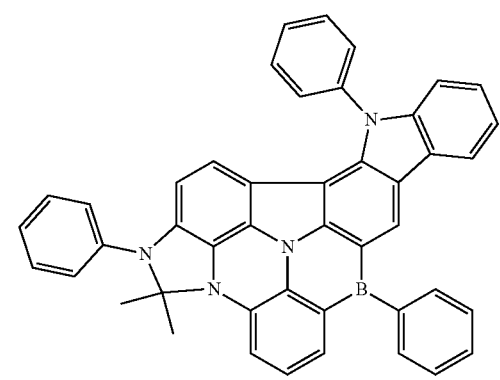
110
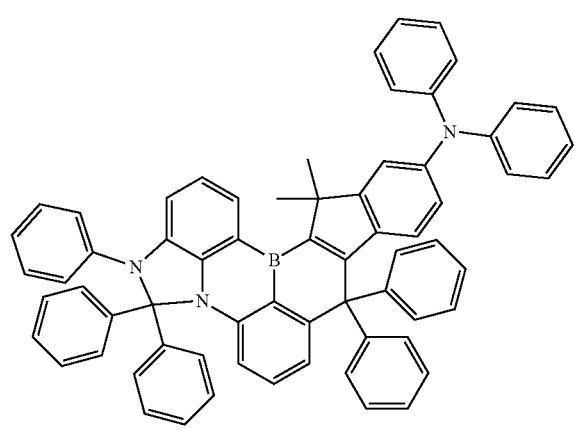
111
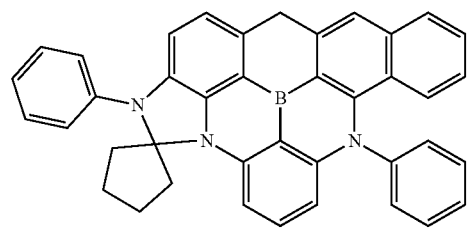
112
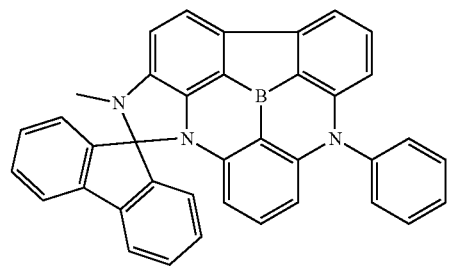
113
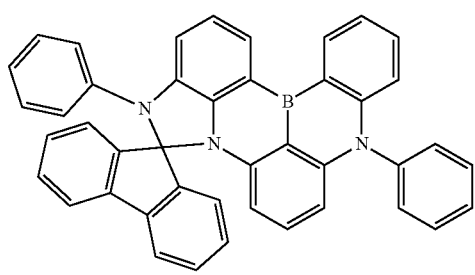
114
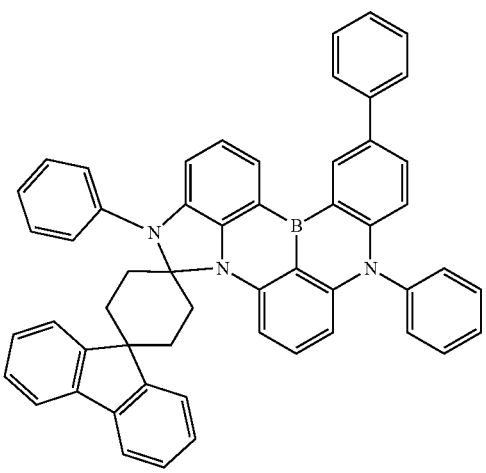
115
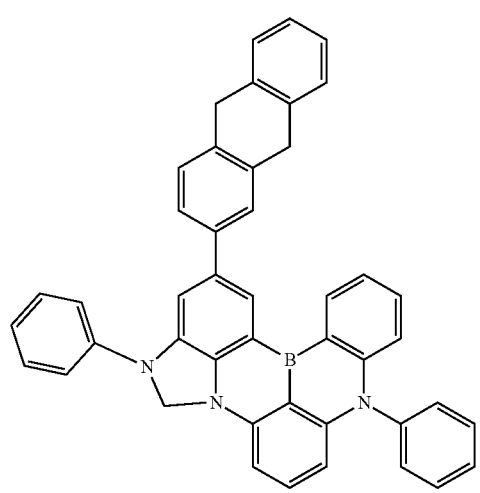
116
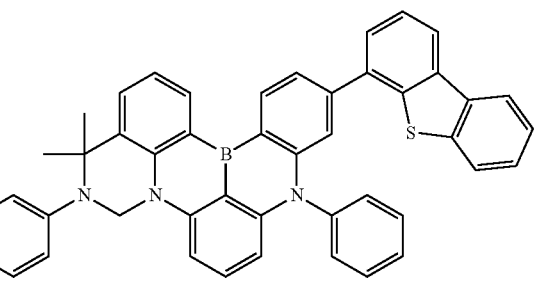
117
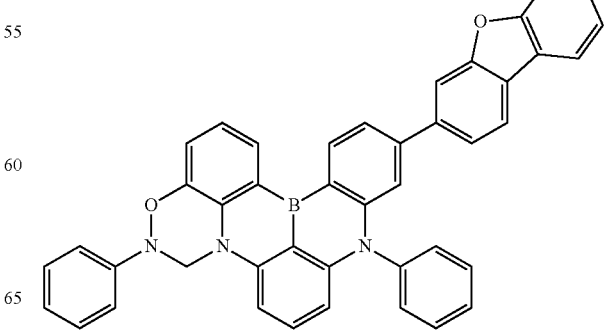

107
-continued
118
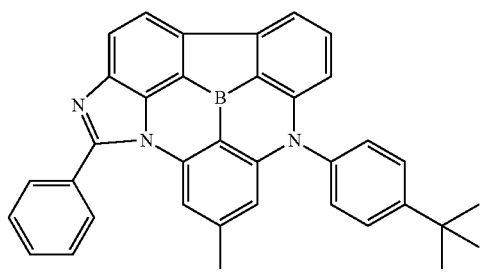
119
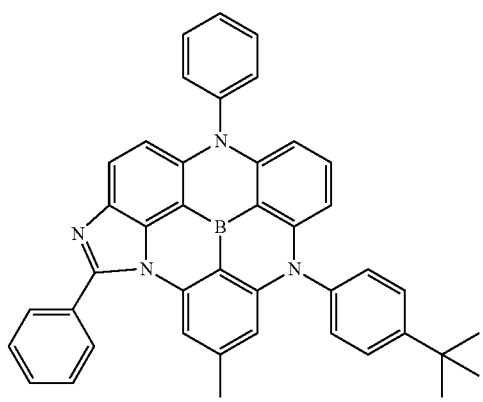
120
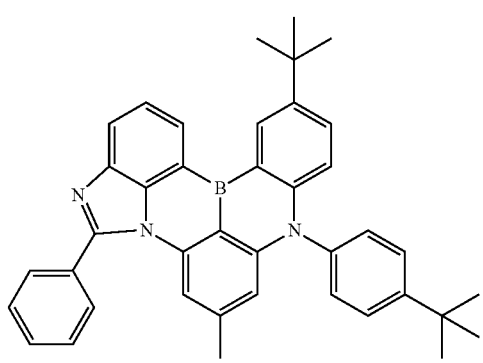
121
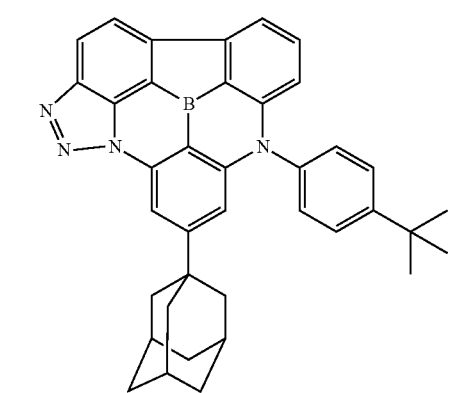
108
-continued
122
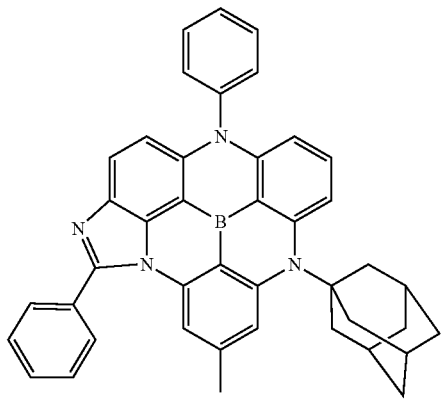
123
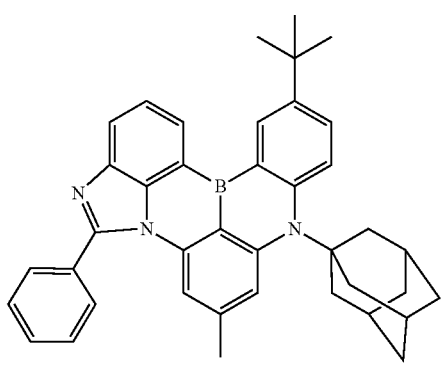
124
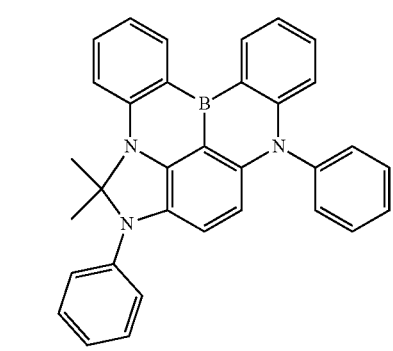
125
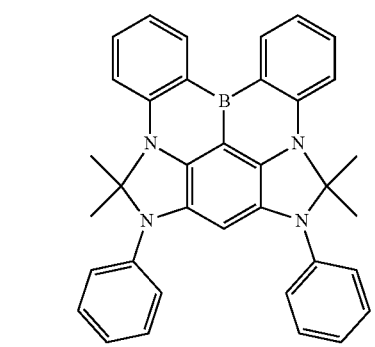

126
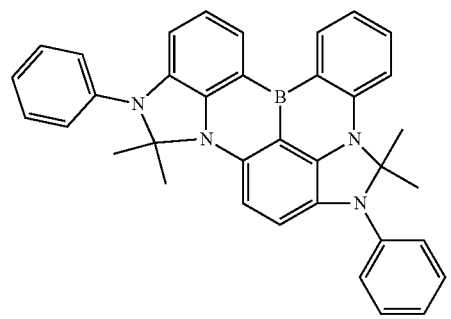
127
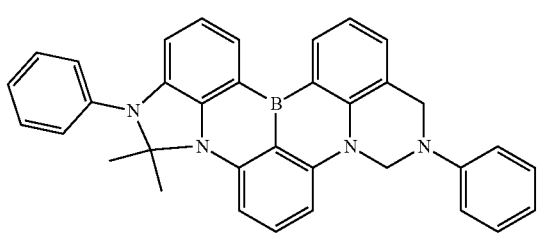
128
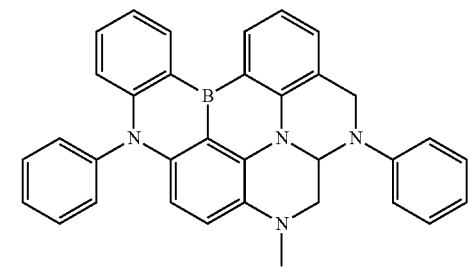
129
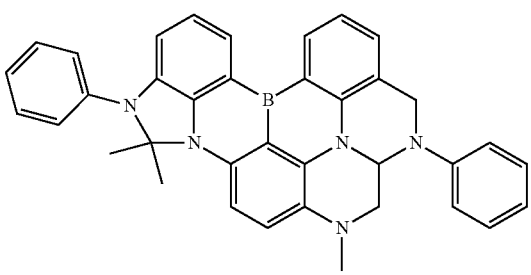
130
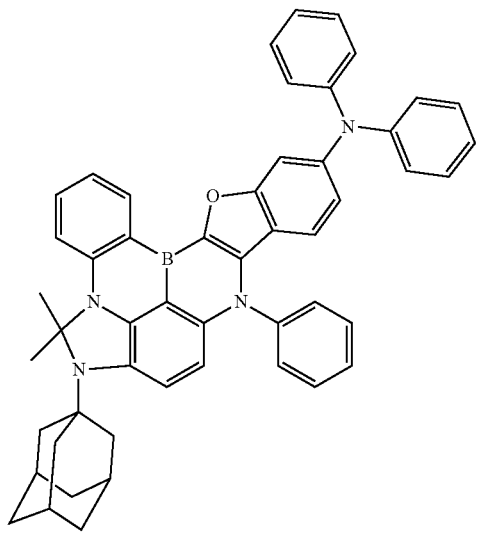
131
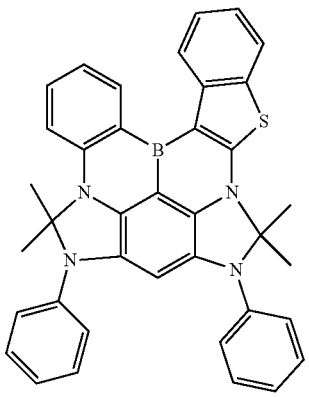
132
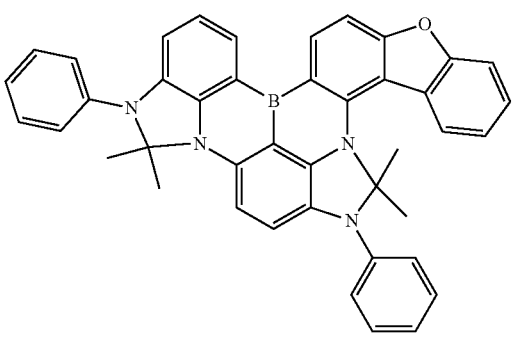

133 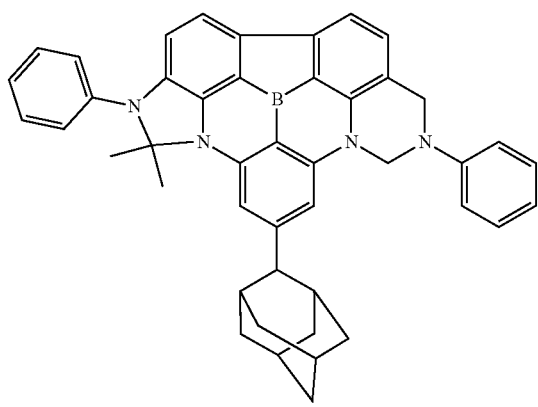
137 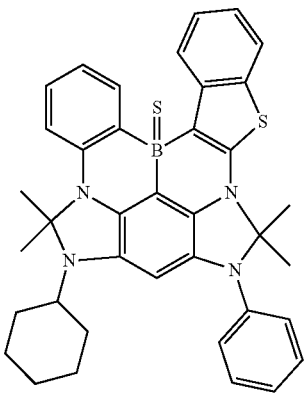
134 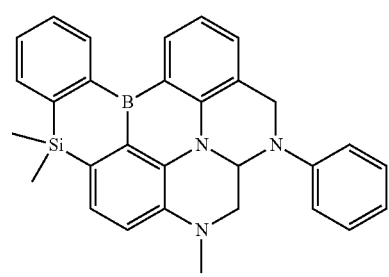
138 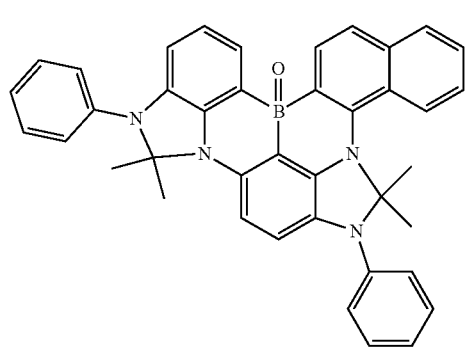
139 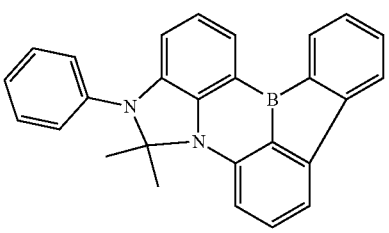
135 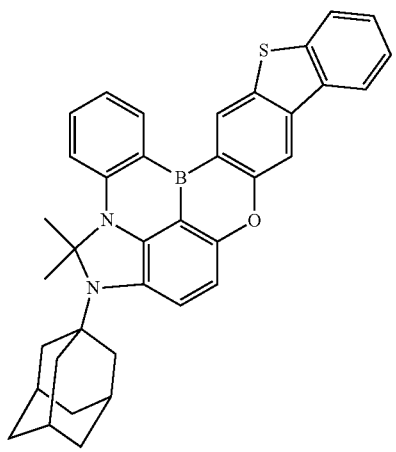
140 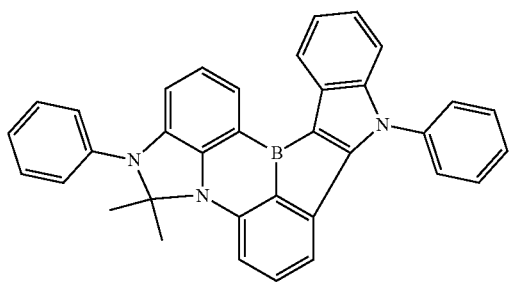
136 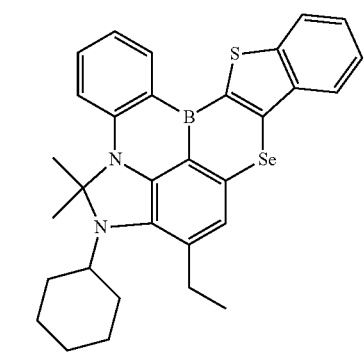
141 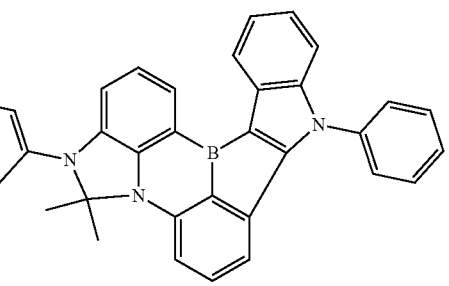

142
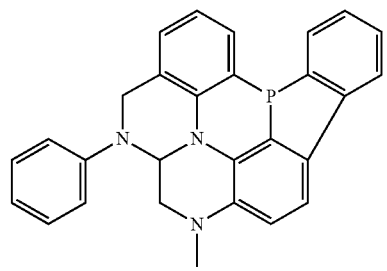
143
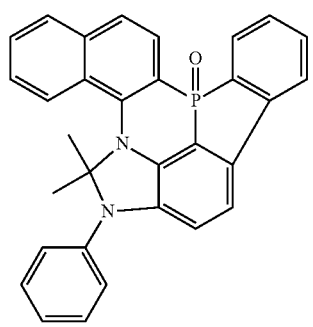
144
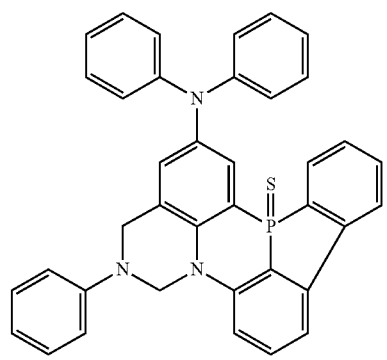
145
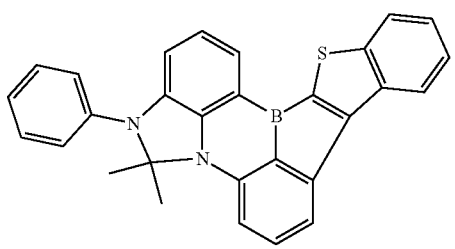
146
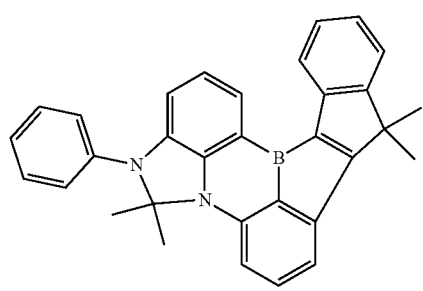
147
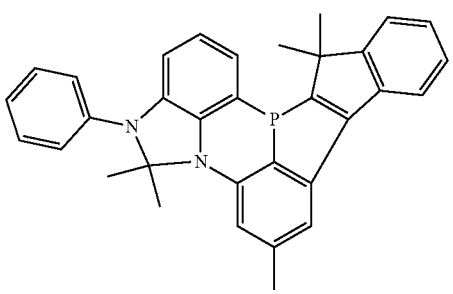
148
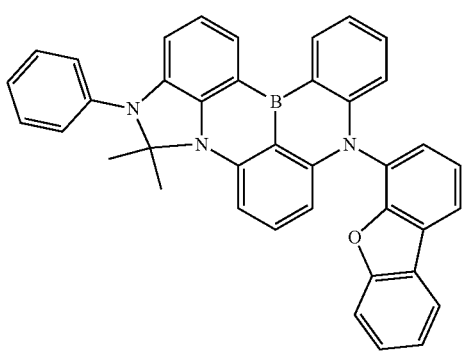
149
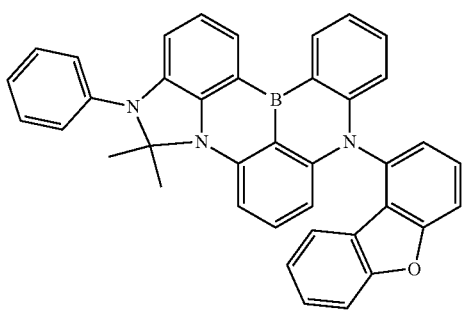
150
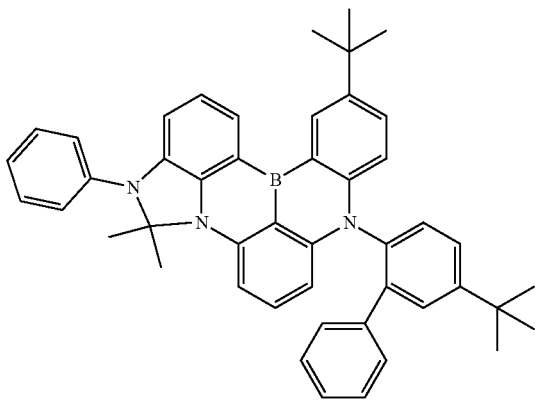

151

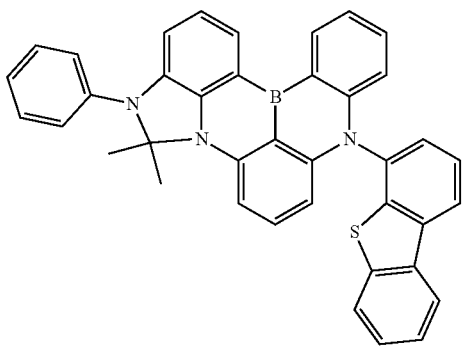

152

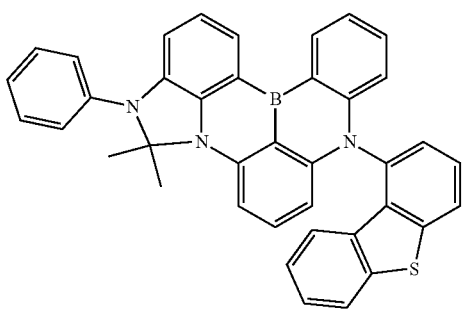

153

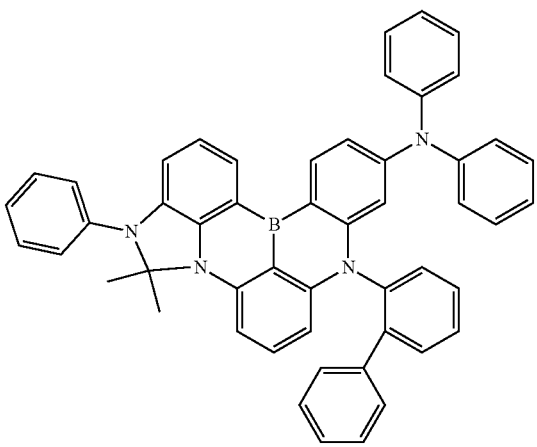

154

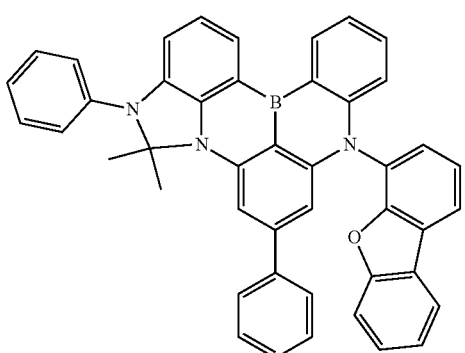

155

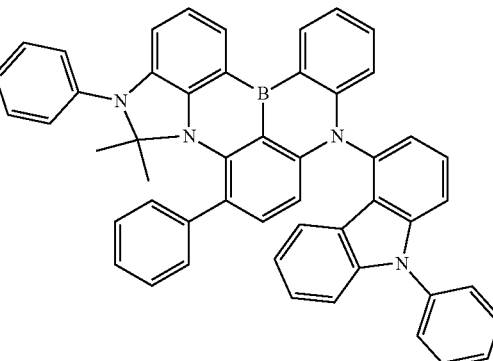

156

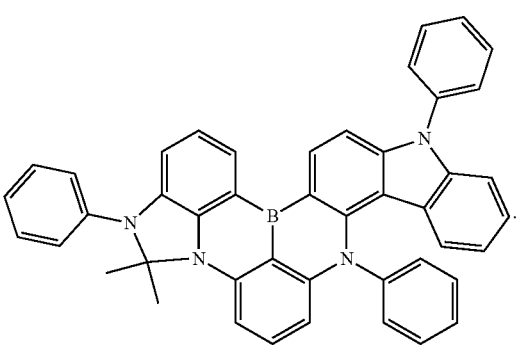

4. An organic electroluminescent device comprising a first electrode, a second electrode, and one or more organic layers interposed between the first and second electrodes wherein one of the organic layers comprises the compound represented by Formula A according to claim 1.

5. The organic electroluminescent device according to claim 4, wherein the organic layers comprise an electron injecting layer, an electron transport layer, a hole injecting layer, a hole transport layer, an electron blocking layer, a hole blocking layer, and a light emitting layer, at least one of which comprises the organic electroluminescent compound represented by Formula A.

6. The organic electroluminescent device according to claim 5, wherein the light emitting layer comprises the organic electroluminescent compound represented by Formula A.

7. The organic electroluminescent device according to claim 4, further comprising a capping layer formed on at least one of the upper and lower surfaces of the first electrode and the second electrode that are opposite to the organic layers, wherein the capping layer comprises the compound represented by Formula A.

8. The organic electroluminescent device according to claim 7, wherein the capping layer is formed on at least one of the lower surface of the first electrode and the upper surface of the second electrode.

9. The organic electroluminescent device according to claim 7, wherein one or more of the layers are formed by a deposition or solution process.

10. The organic electroluminescent device according to claim 4, wherein the organic electroluminescent device is used in a display or lighting system selected from flat panel displays, flexible displays, monochromatic flat panel lighting systems, white flat panel lighting systems, flexible monochromatic lighting systems, and flexible white lighting systems.

11. An organic electroluminescent compound represented by Formula B:

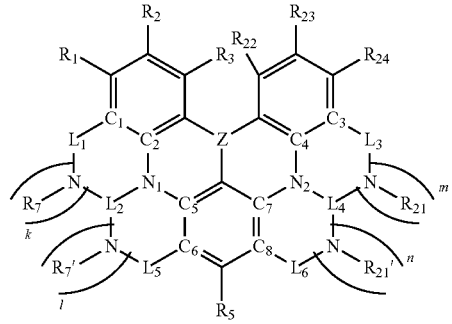

[Formula B]

wherein Z is selected from B, P, P=O, and P=S, $C_1$, $C_2$, $C_3$, $C_4$, $C_5$, $C_6$, $C_7$, and Cs are carbon atoms (C), $N_1$ and $N_2$ are nitrogen atoms (N), $L_1$, $L_2$, and Ls are identical to or different from each other and are single bonds or substituted or unsubstituted aliphatic linkers connecting $C_1$ to N-$R_7$, $N_1$ to N-$R_7$ and N-$R_7$', and Co to N-$R_7$', respectively, that optionally contain at least one hydrocarbon or heteroatom, $L_3$, $L_4$, and Le are identical to or different from each other and are single bonds or substituted or unsubstituted aliphatic linkers connecting $C_3$ to N-$R_{21}$, $N_2$ to N-$R_{21}$ and N-$R_{21}$', and Cs to N-$R_{21}$', respectively, that optionally contain at least one hydrocarbon or heteroatom, each of k, l, m, and n is an integer of 0 or 1, with the proviso that k, I, m, and n are not simultaneously zero, and $R_1$ to $R_7$, $R_7$', $R_{21}$', and $R_{21}$ to $R_{24}$ are identical to or different from each other and are each independently selected from hydrogen, deuterium, substituted or unsubstituted $C_1$-$C_{30}$ alkyl, $C_2$-$C_{24}$ alkenyl, $C_2$-$C_{24}$ alkynyl, substituted or unsubstituted $C_6$-$C_{50}$ aryl, substituted or unsubstituted $C_3$-$C_{30}$ cycloalkyl, substituted or unsubstituted $C_1$-$C_{30}$ heterocycloalkyl, substituted or unsubstituted $C_1$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, substituted or unsubstituted $C_6$-$C_{30}$ arylsilyl, nitro, cyano, halogen, and substituted or unsubstituted $C_1$-$C_{30}$ non-aromatic rings, with the proviso that each of $R_1$ to $R_7$, $R_7$', $R_{21}$', $R_{21}$ to $R_{24}$, $L_1$, $L_2$, $L_3$, $L_4$, $L_5$, $L_6$, and their substituents optionally forms a substituted or unsubstituted ring with an adjacent substituent.

12. The organic electroluminescent compound according to claim 11, wherein $R_3$ and $R_{22}$ are bonded together to form a substituted or unsubstituted aliphatic, aromatic or non-aromatic ring containing at least one hydrocarbon or heteroatom.

13. The organic electroluminescent compound according to claim 11, wherein the compound represented by Formula B is selected from the group consisting of the following compounds 1 to 156:

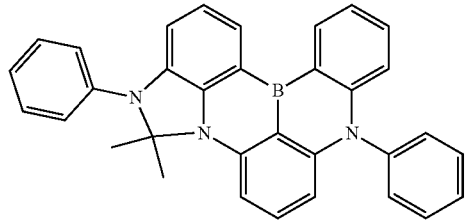

1

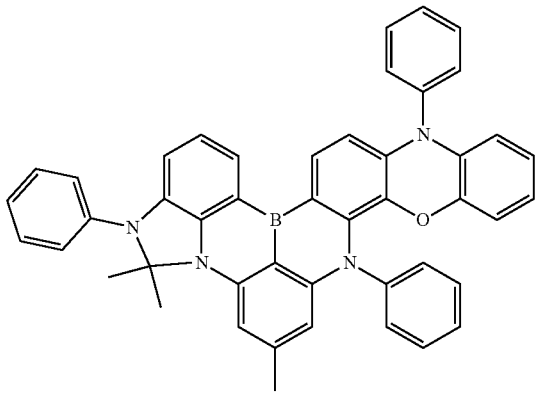

2

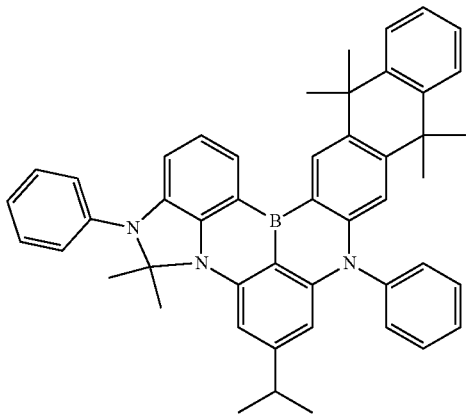

3

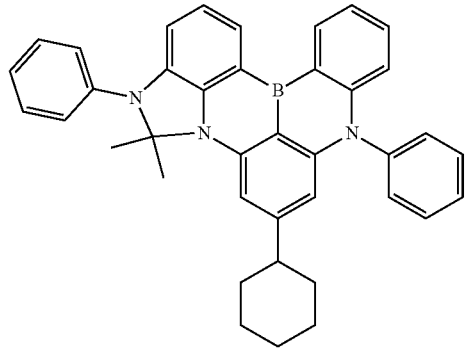

4

119
-continued
5
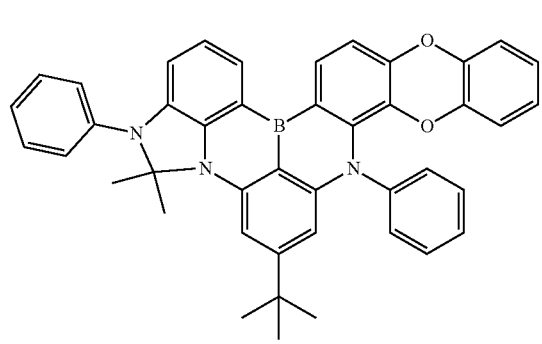
6
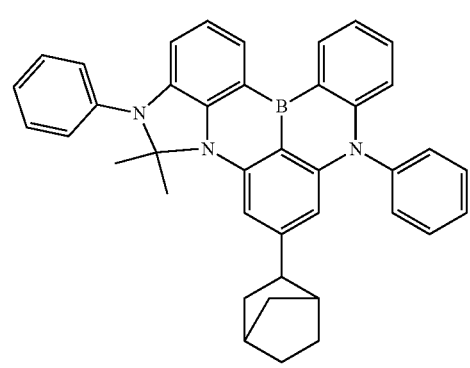
7
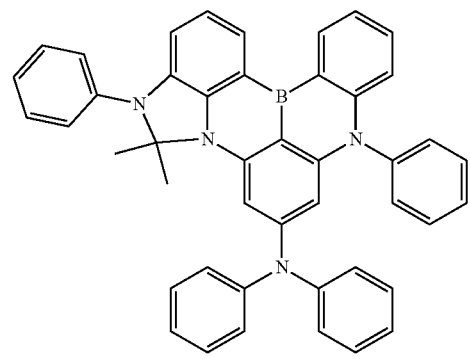
8
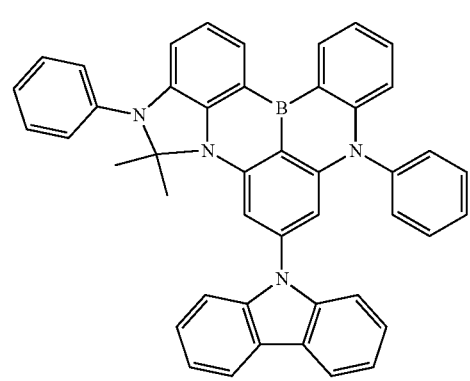
120
-continued
9
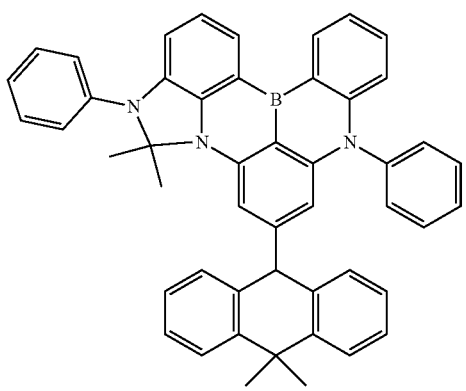
10
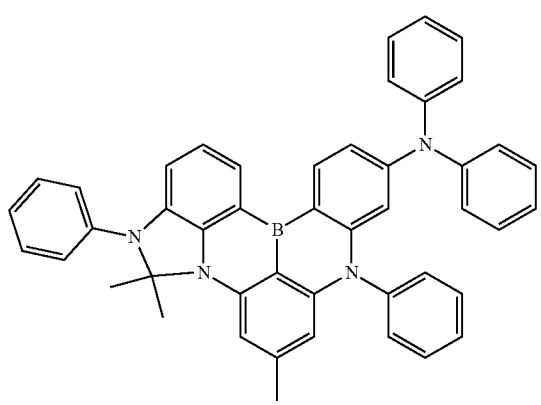
11
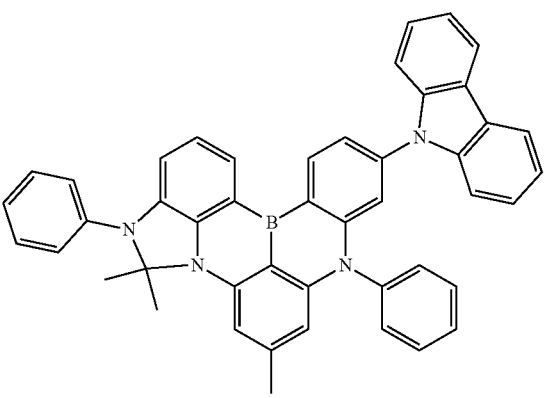
12
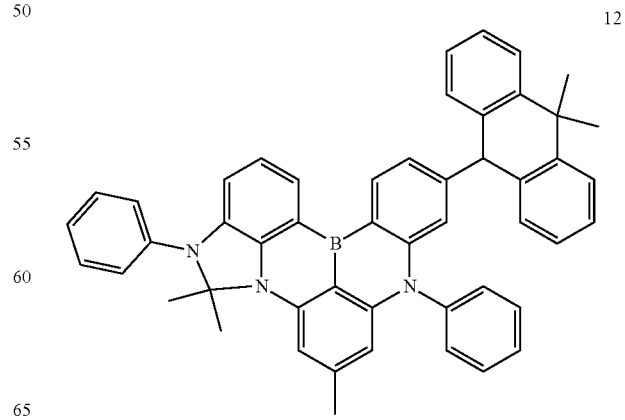

121
-continued
13
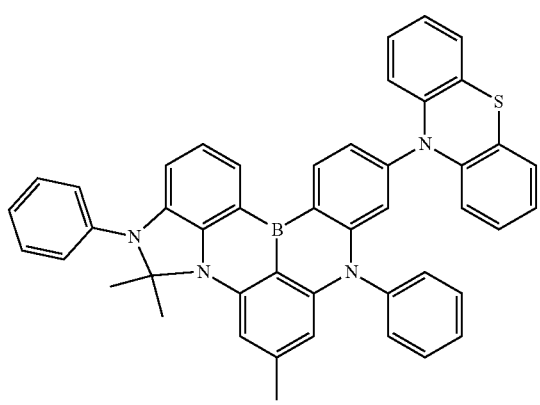
14
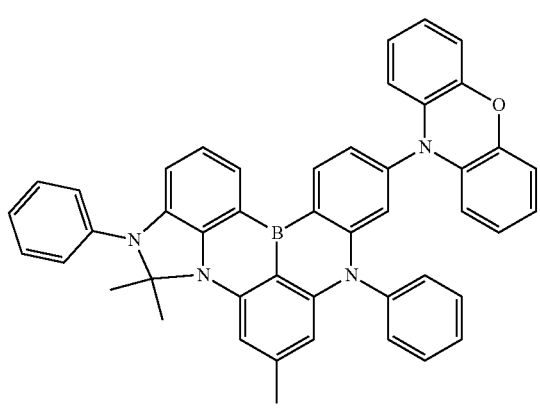
15
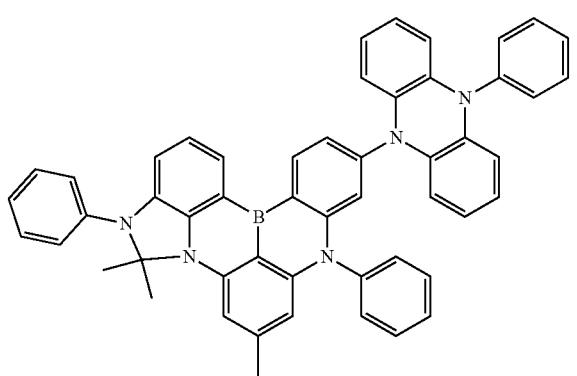
16
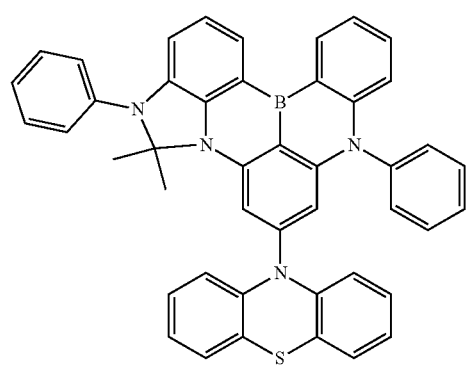
122
-continued
17
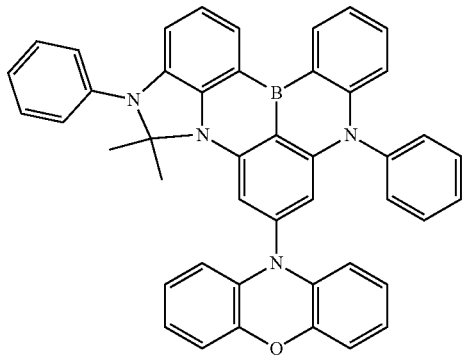
18
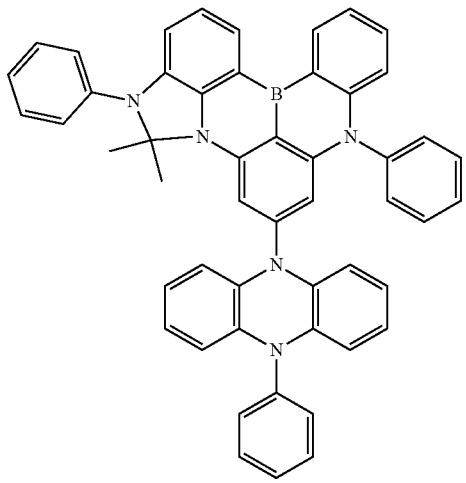
19
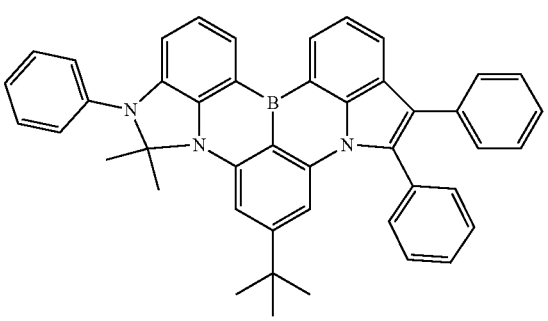
20
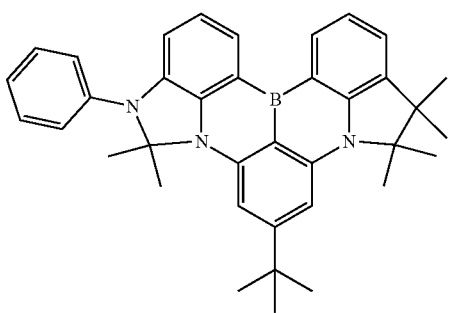

123
-continued
21
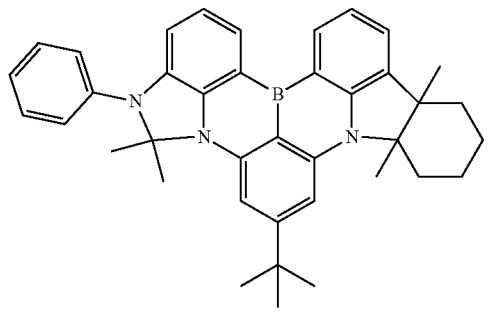
22
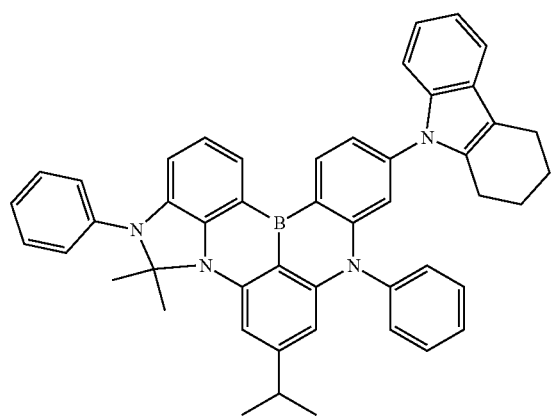
23
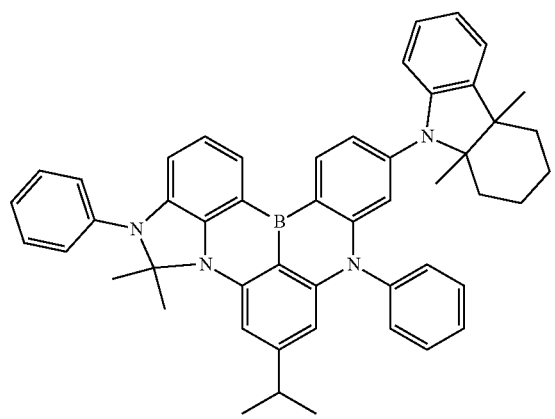
24
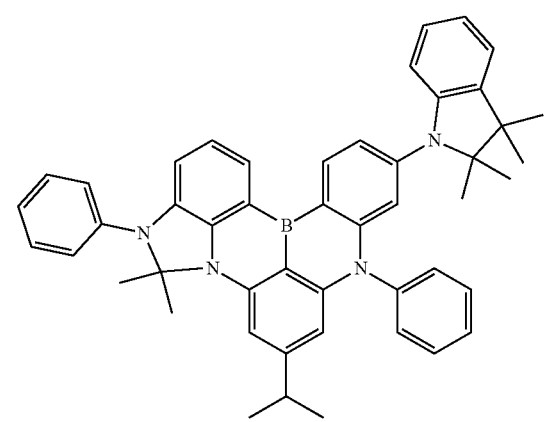
124
-continued
25
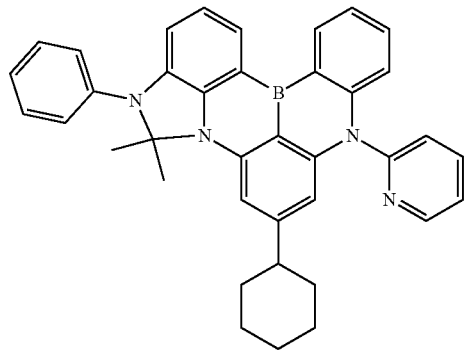
26
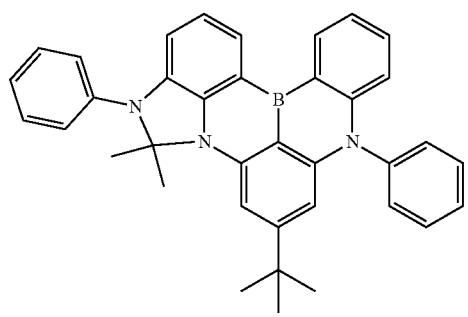
27
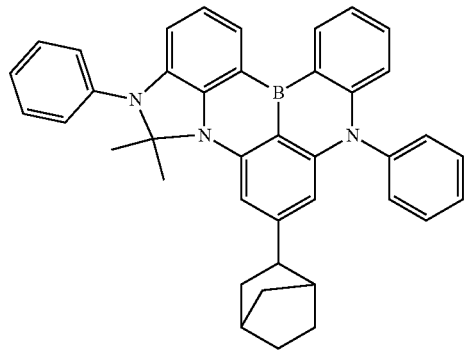
28
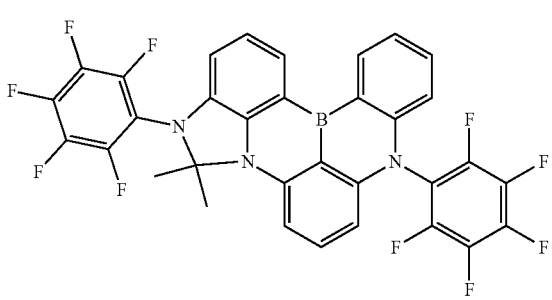

29
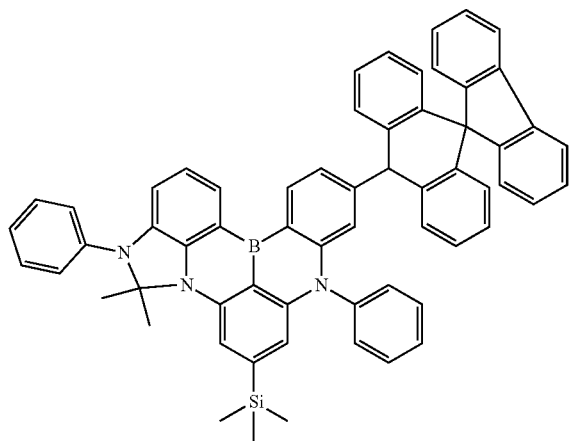
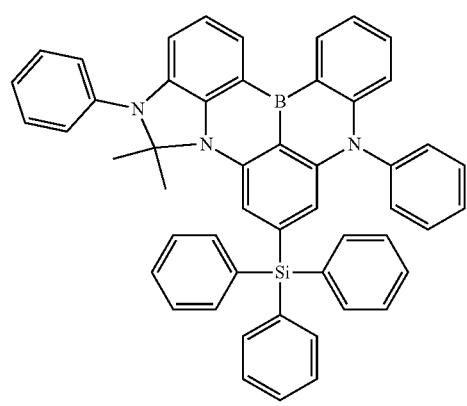
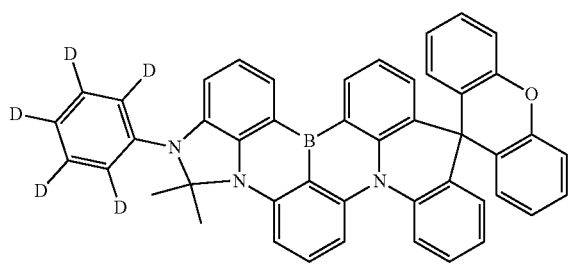
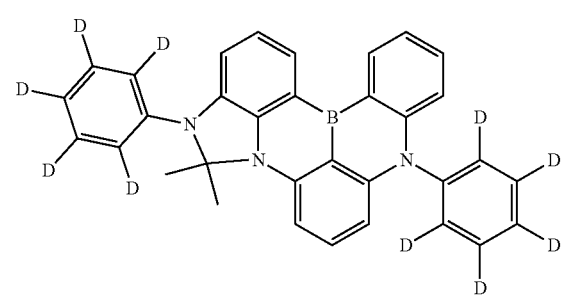
30
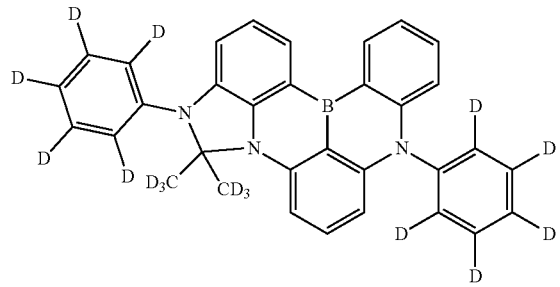
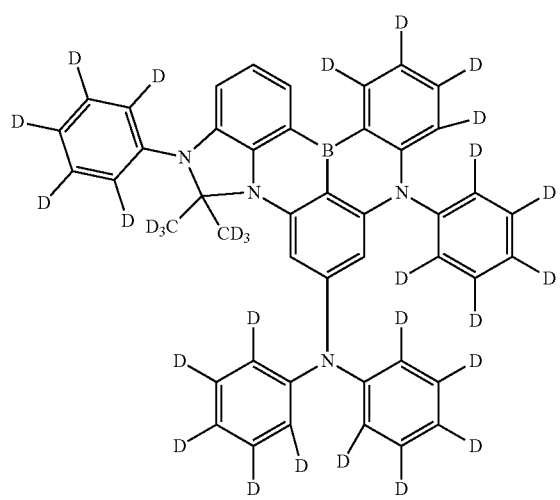

36
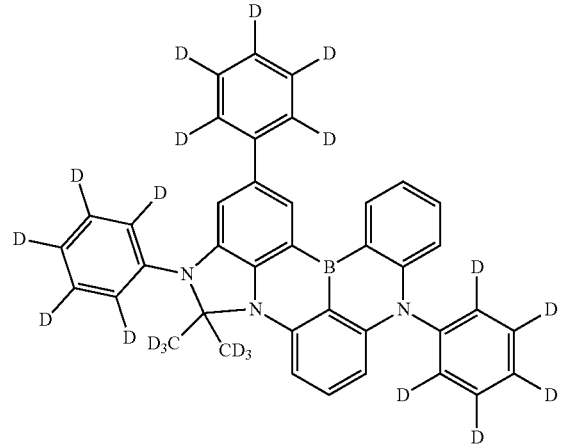
37
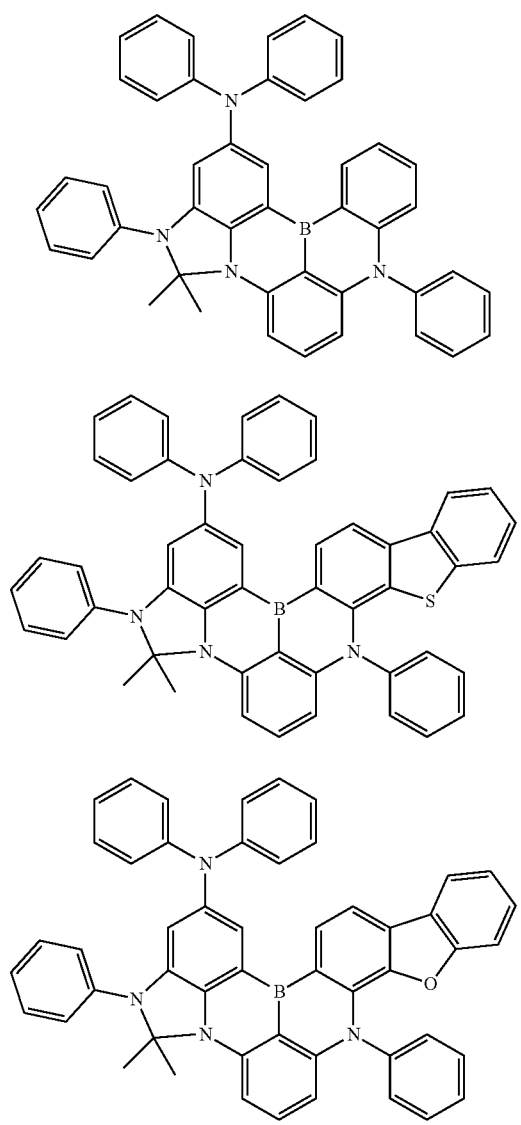
38
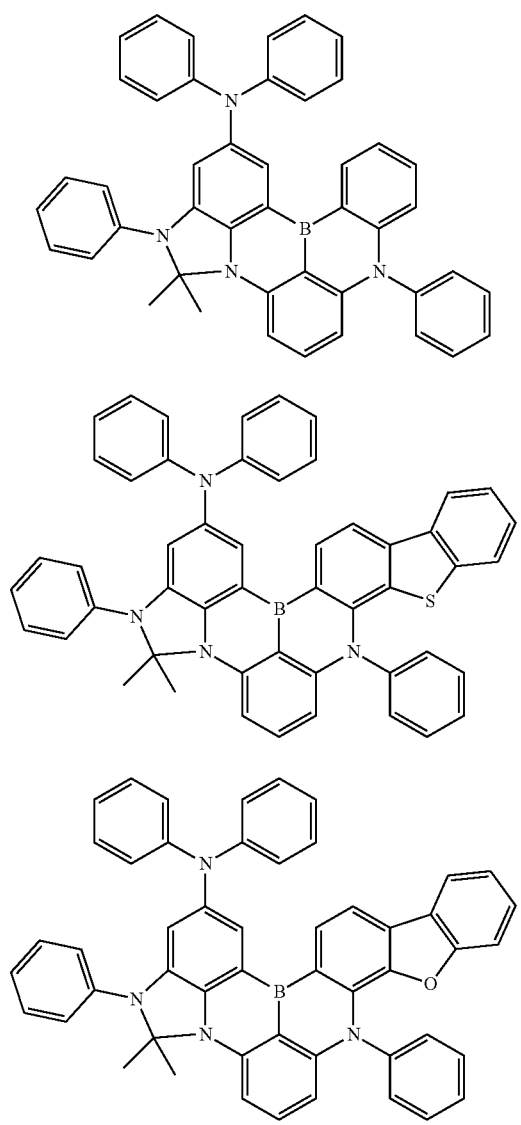
39
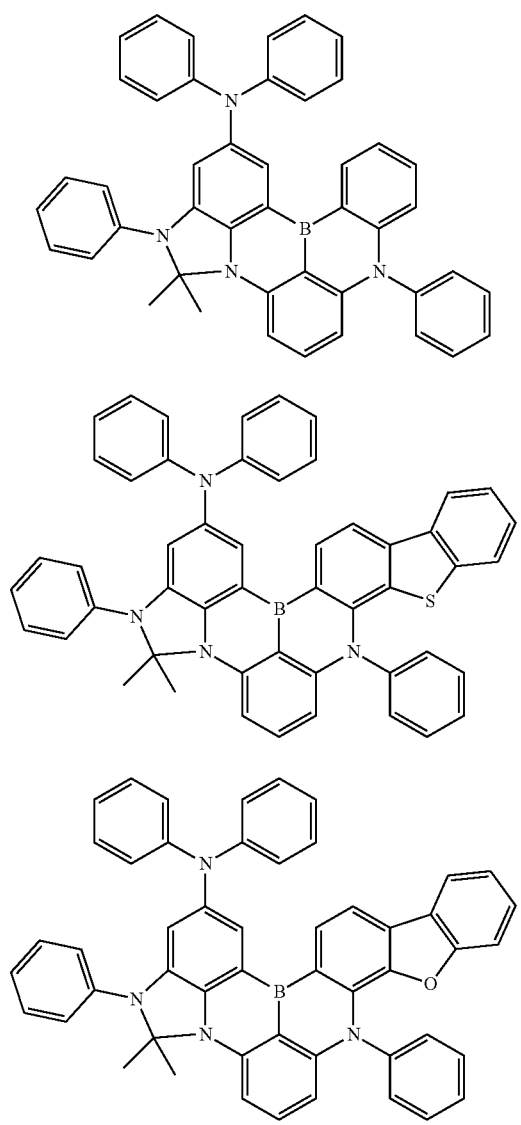
40
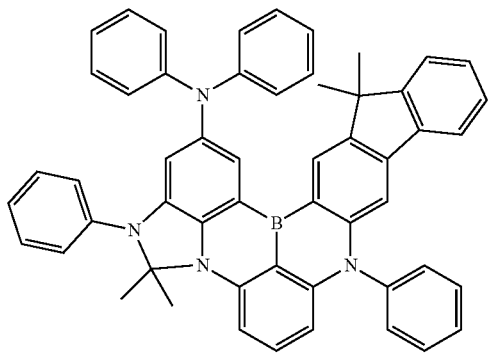
41
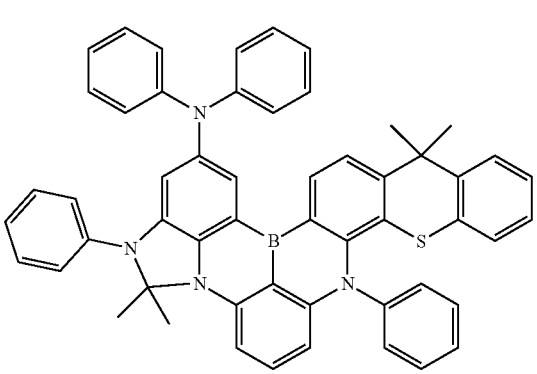
42
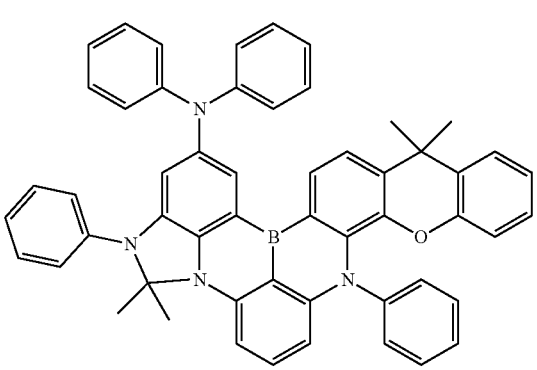
43
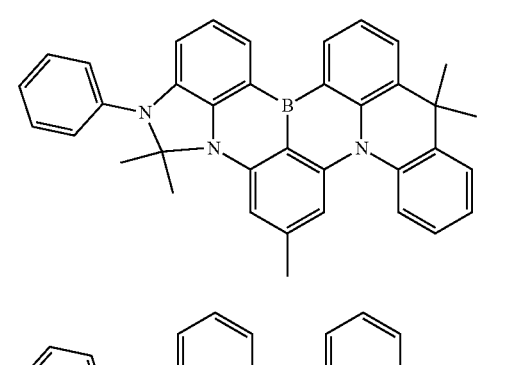
44
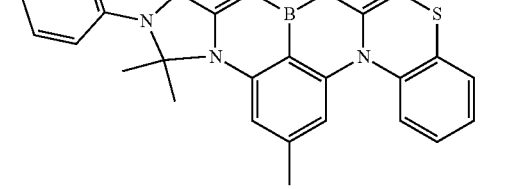

45
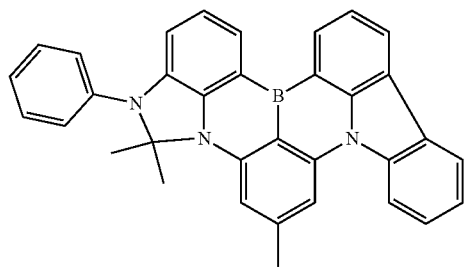
46
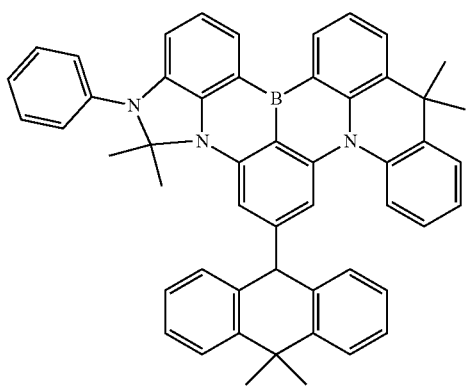
47
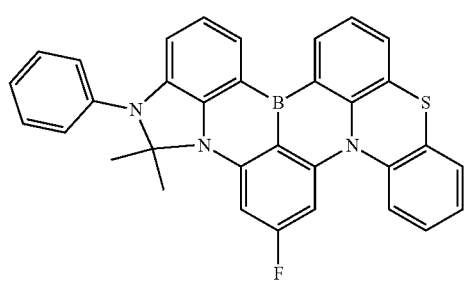
48
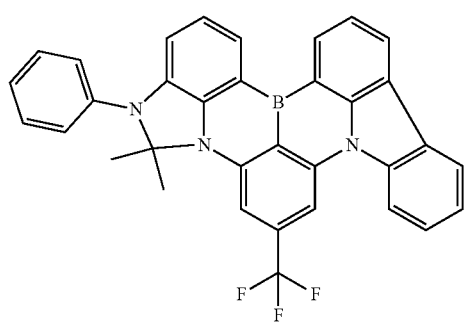
49
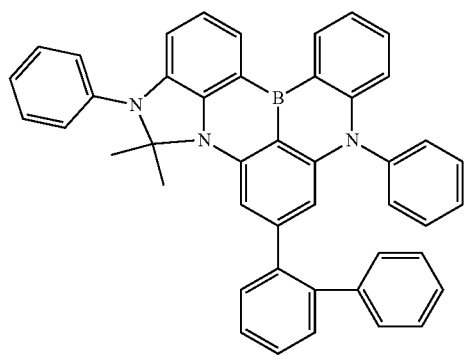
50
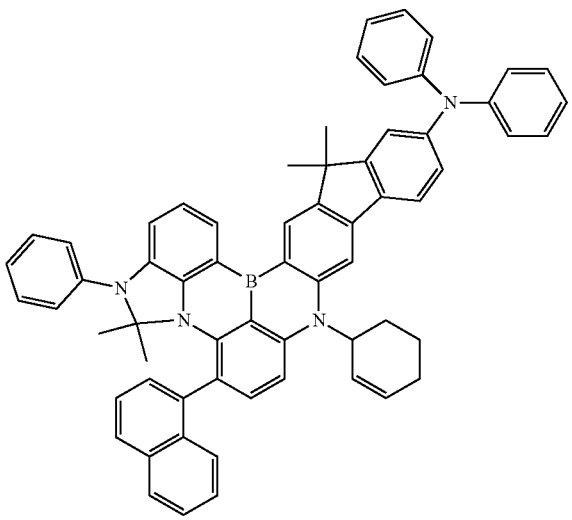
51
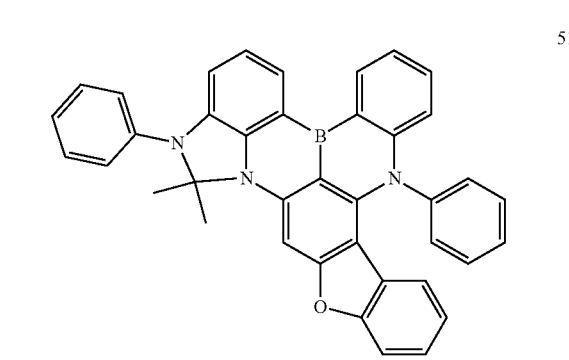
52
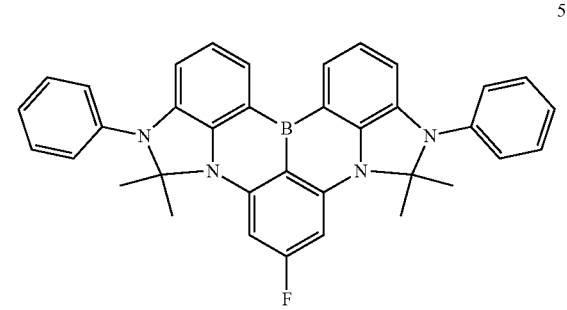

53
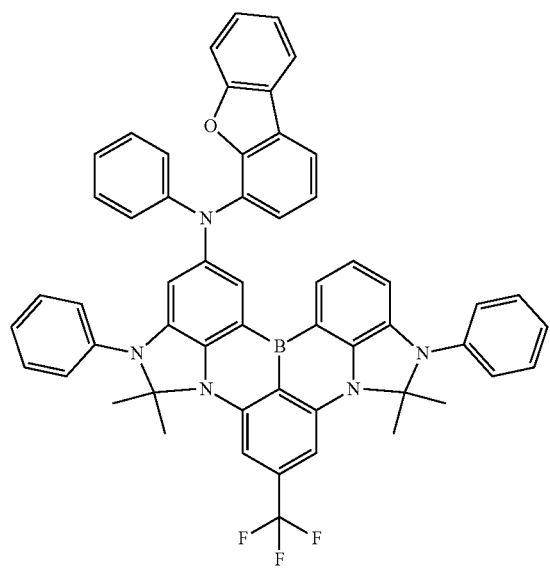
54
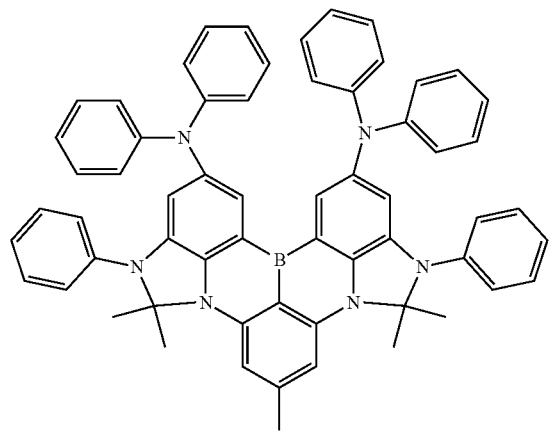
55
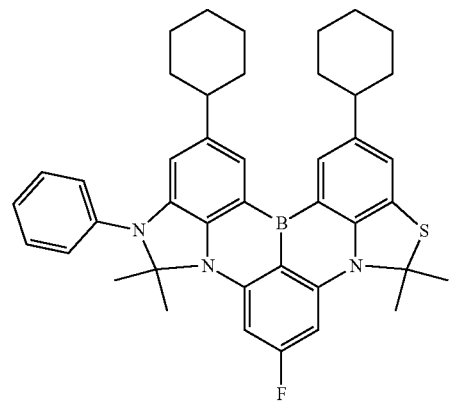
56
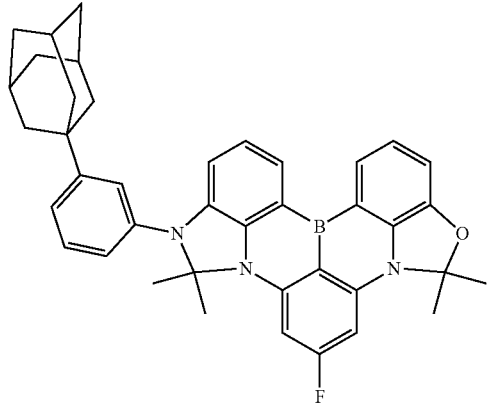
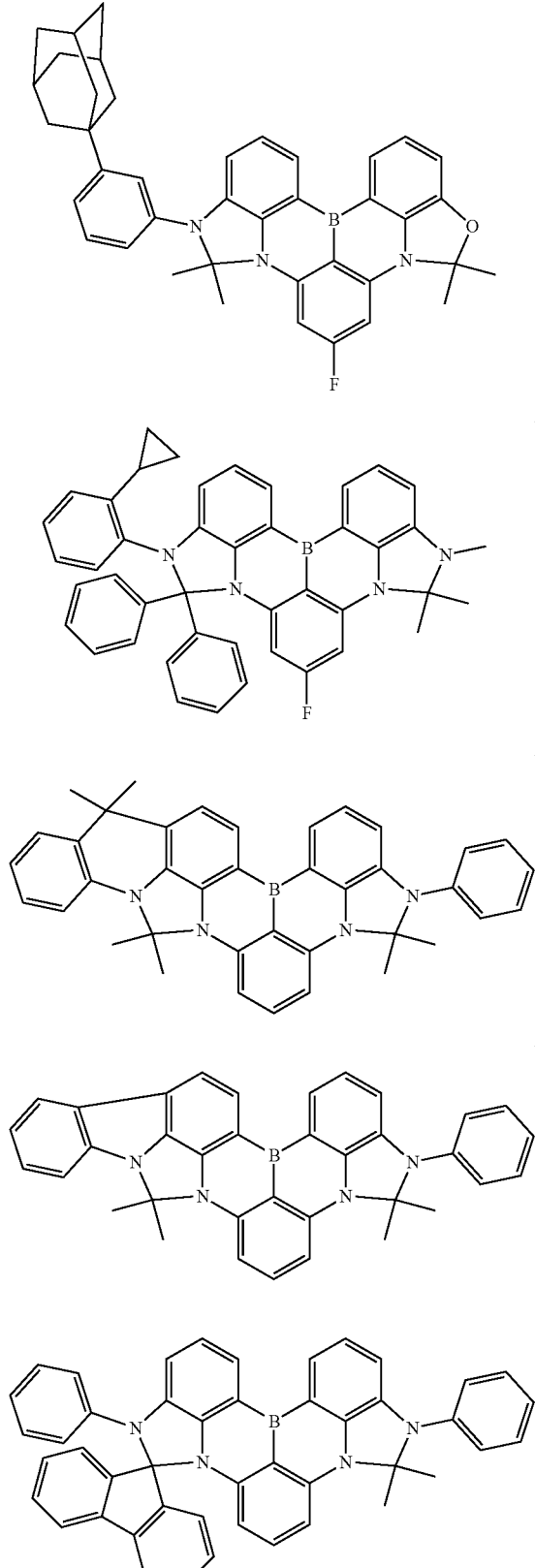

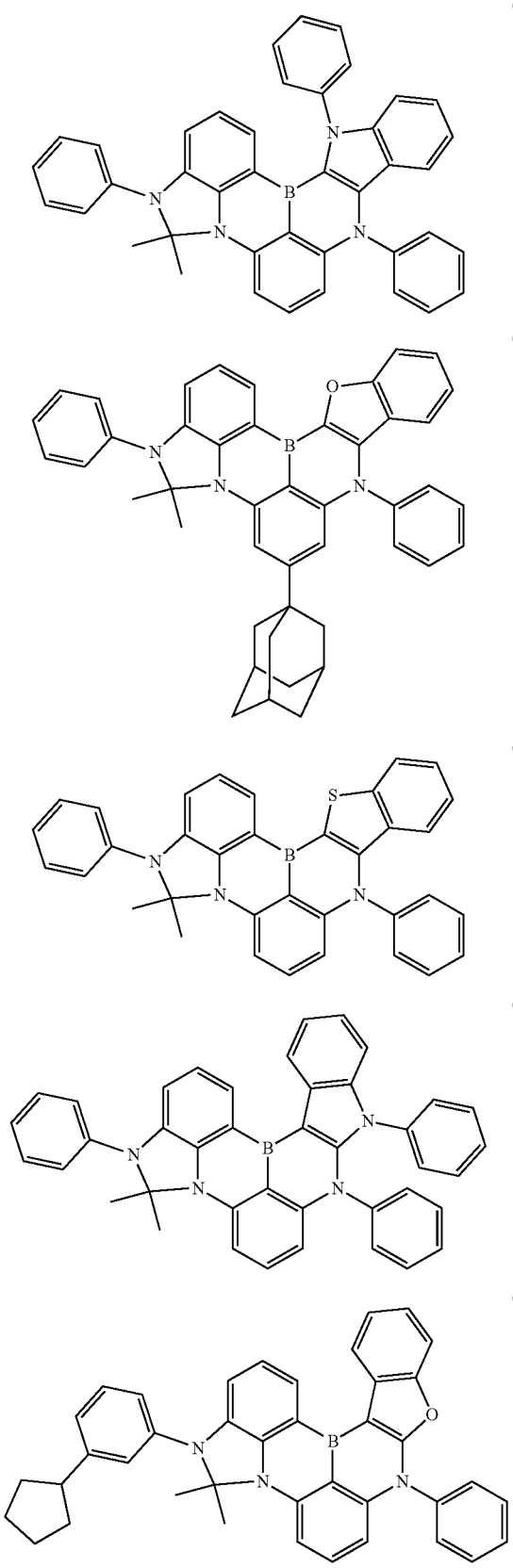
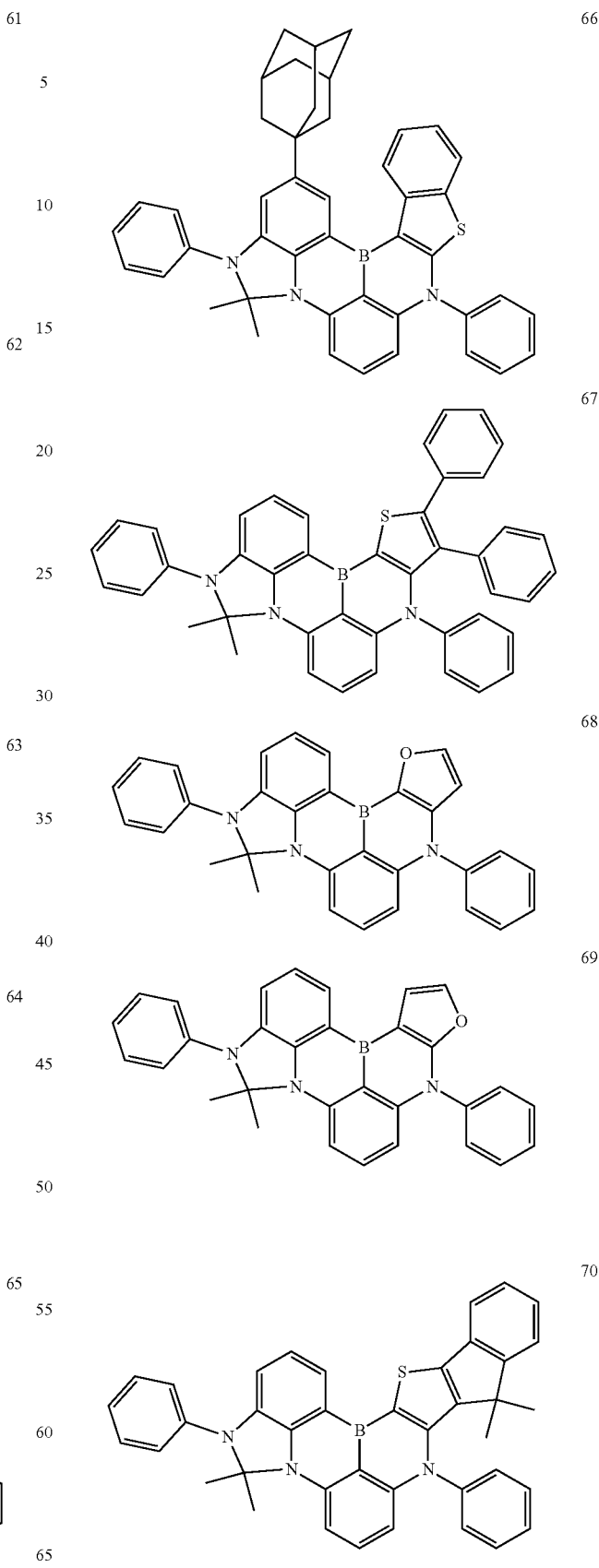

71
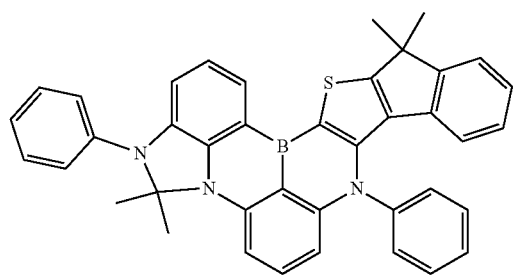
72
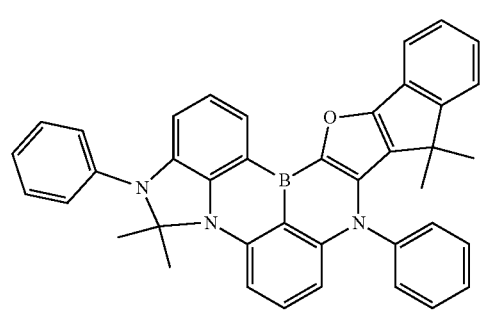
73
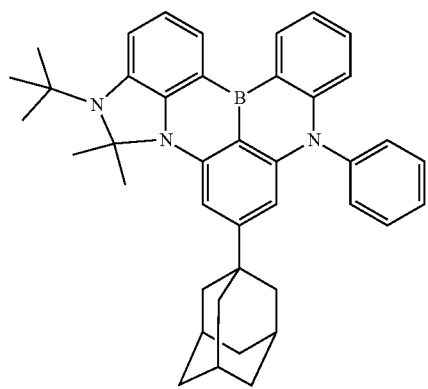
74
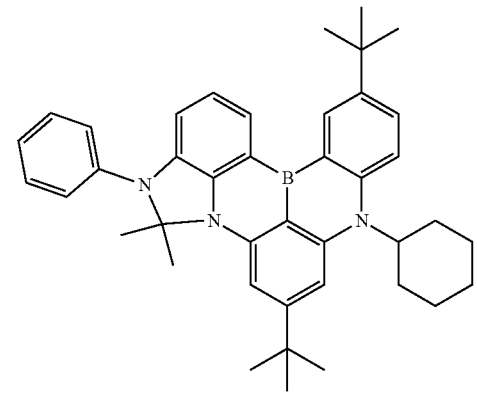
75
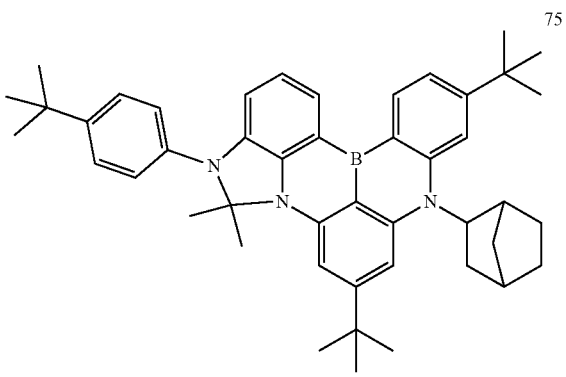
76
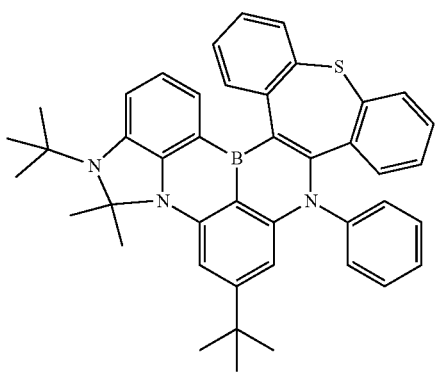
77
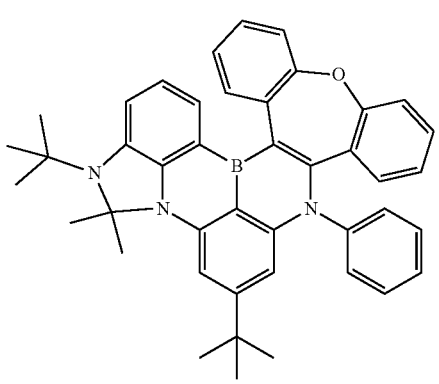
78
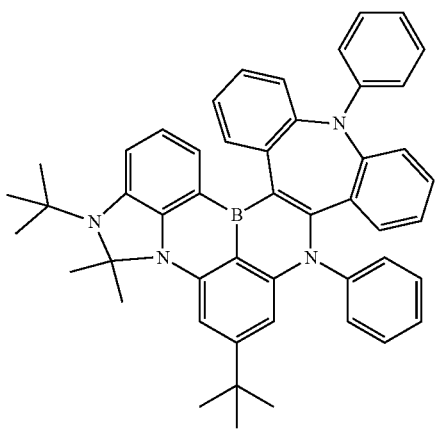

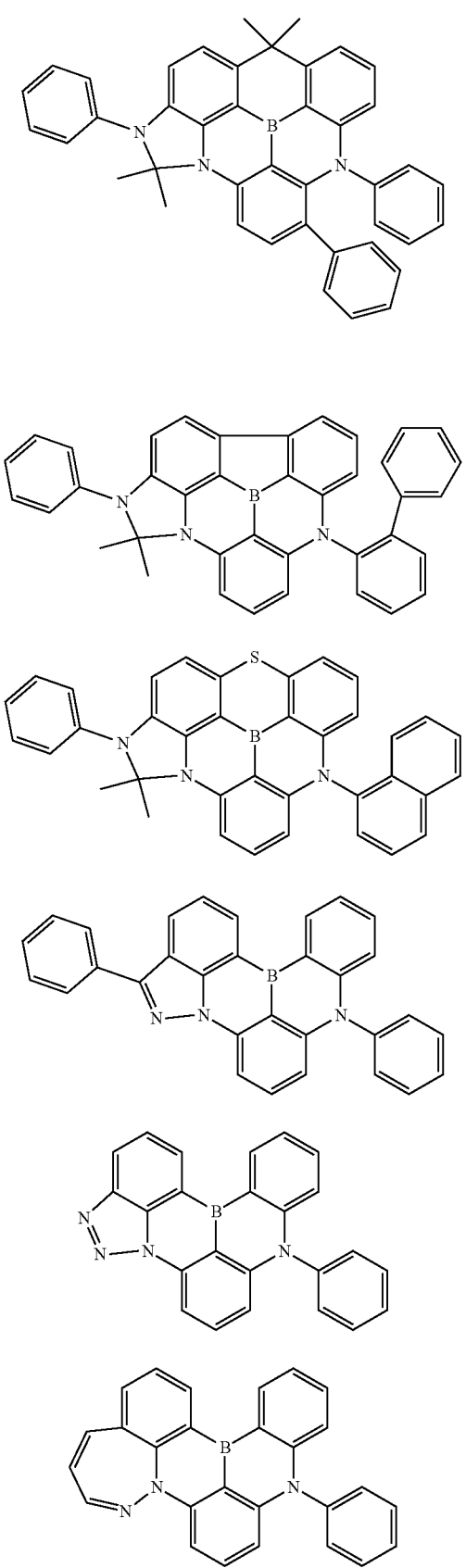
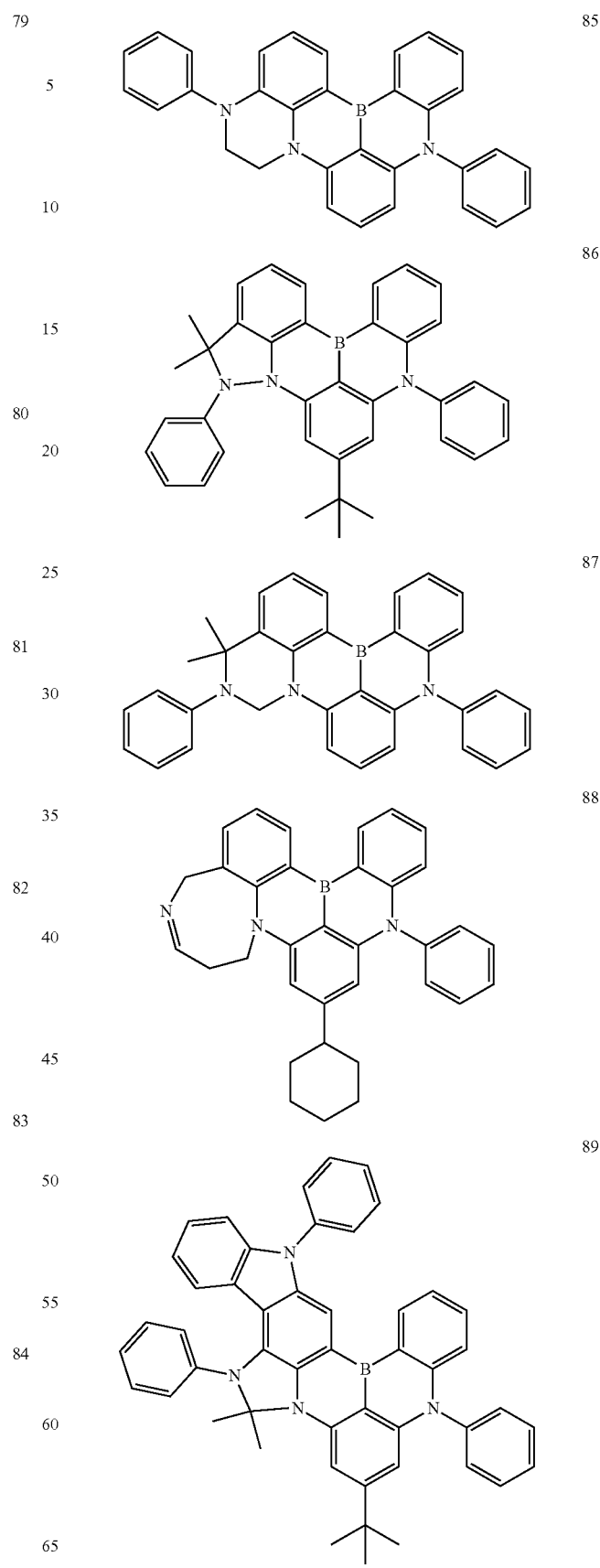

90
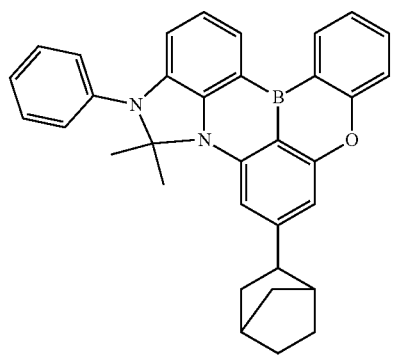
91
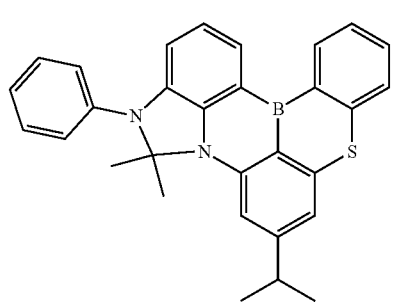
92
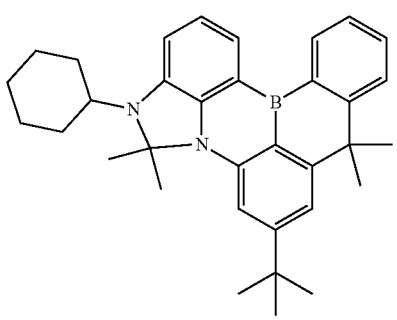
93
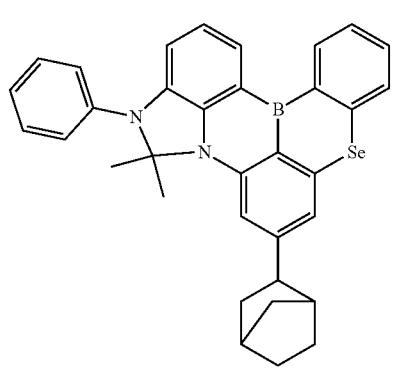
94
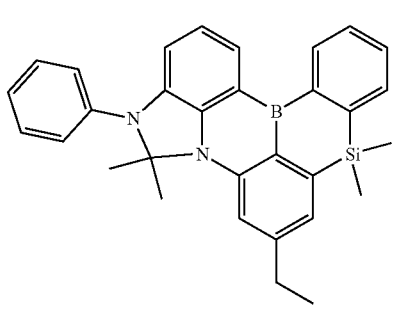
95
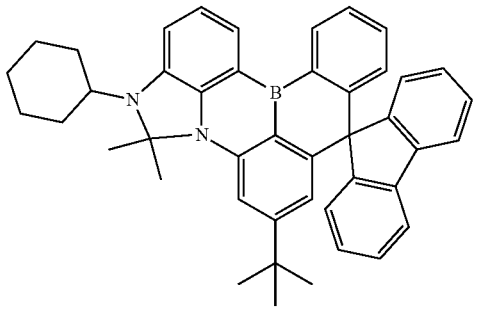
96
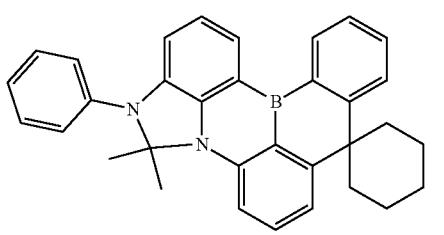
97
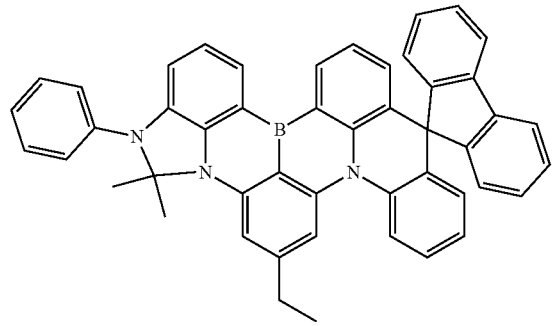
98
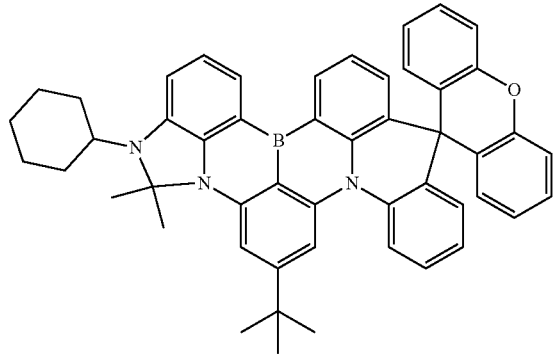
99
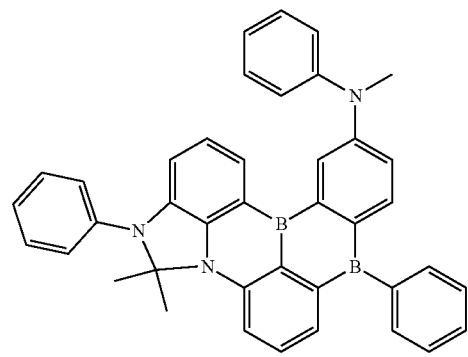

-continued
100
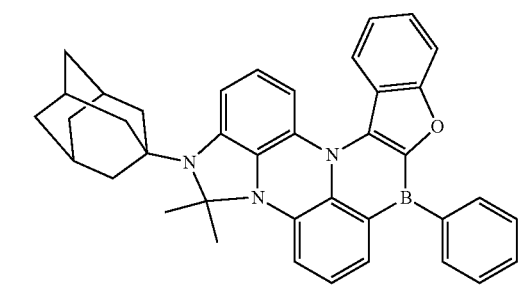
101
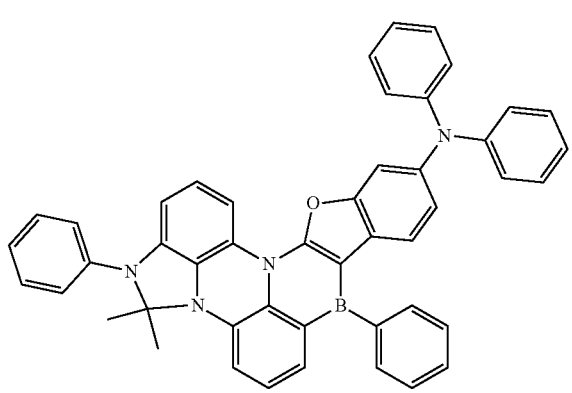
102
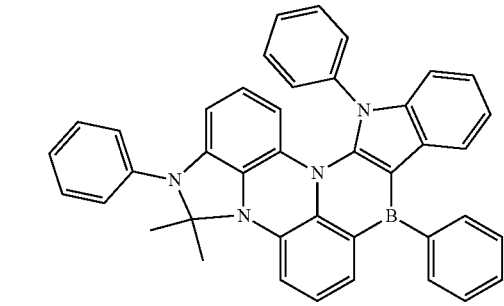
103
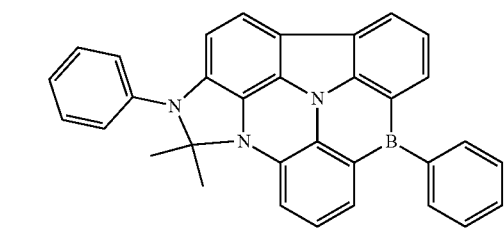
104
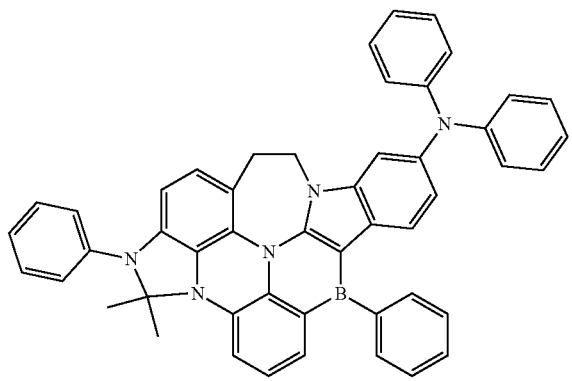
-continued
105
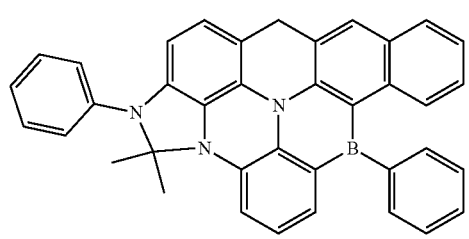
106
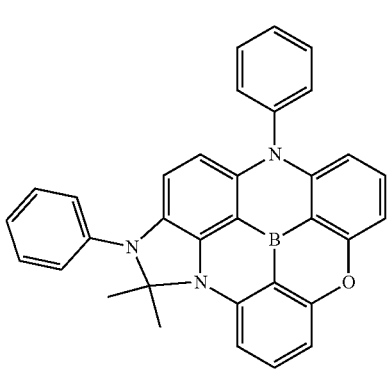
107
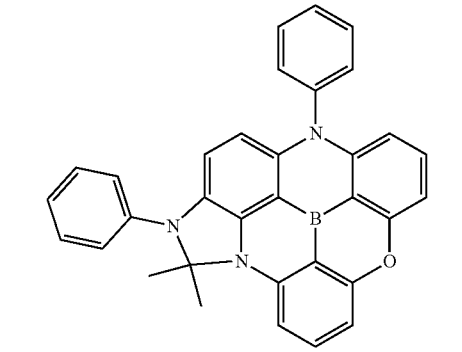
108
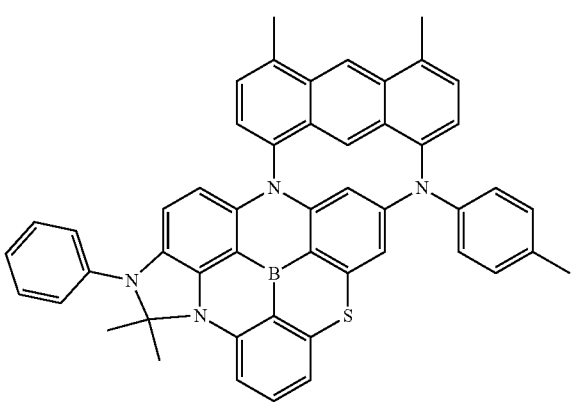

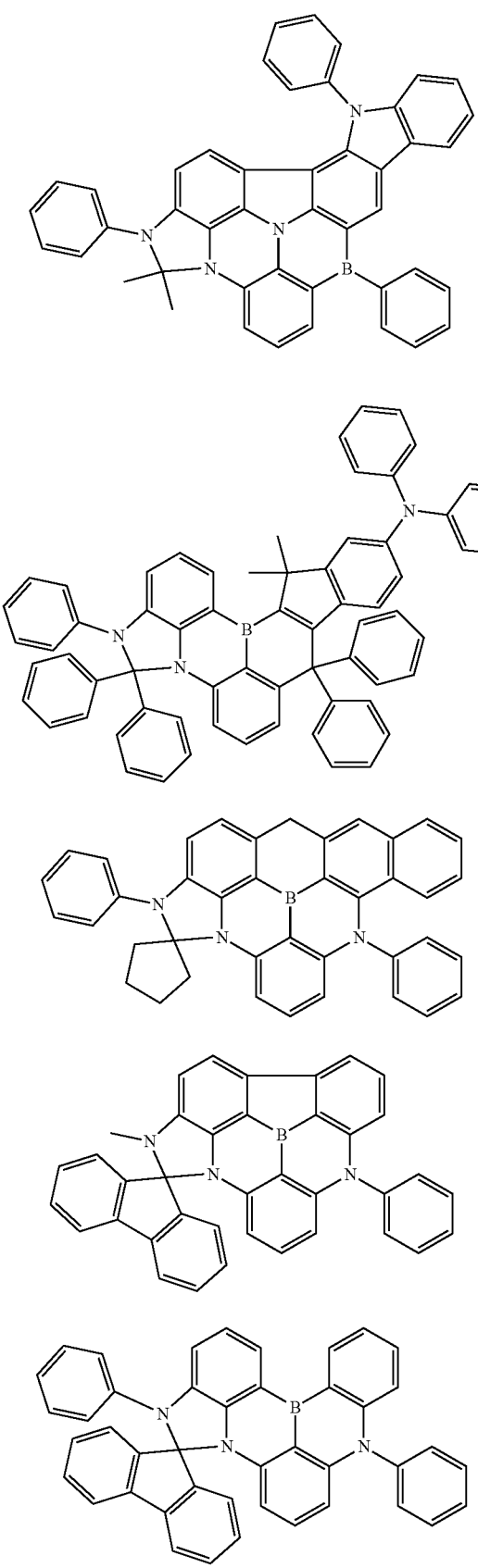
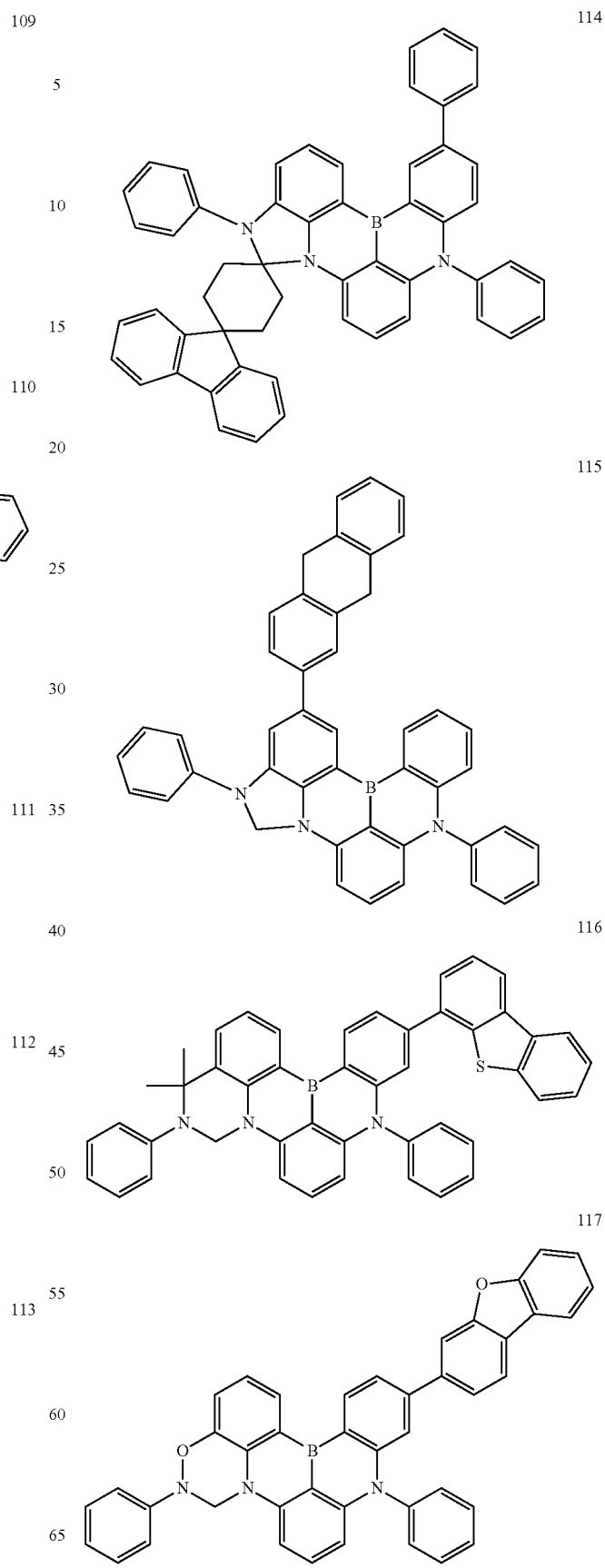

118
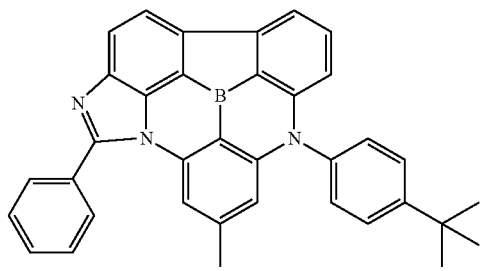
119
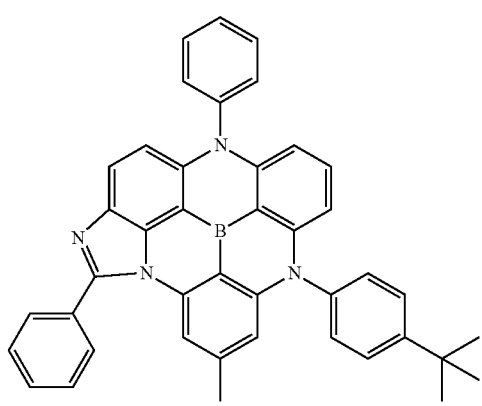
120
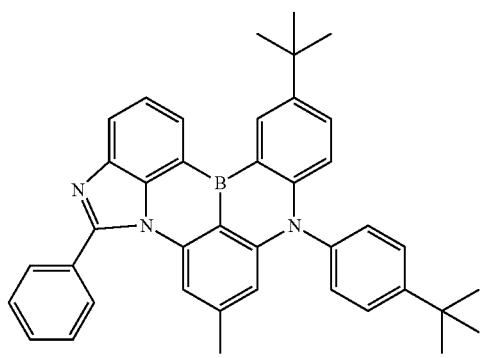
121
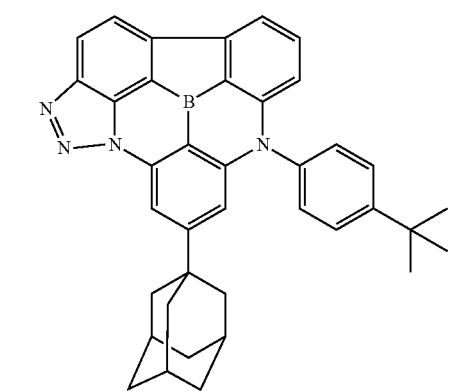
122
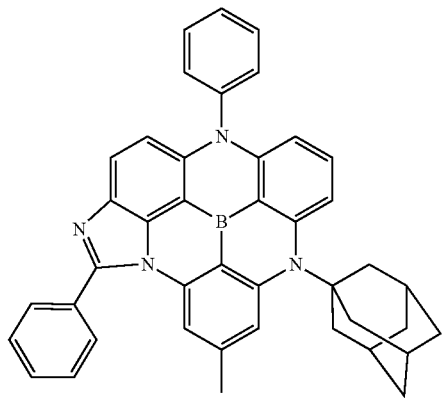
123
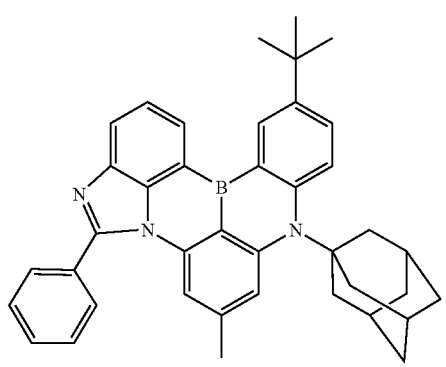
124
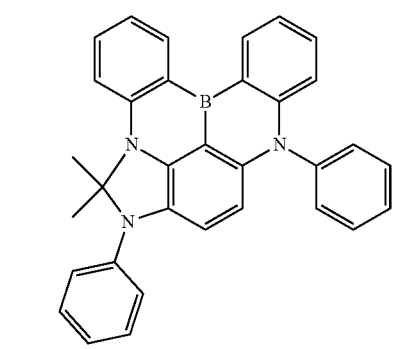
125
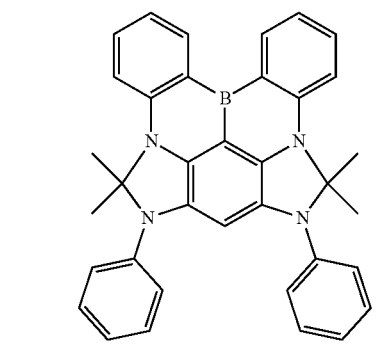

126 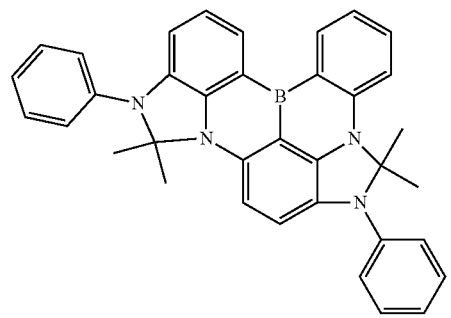
127 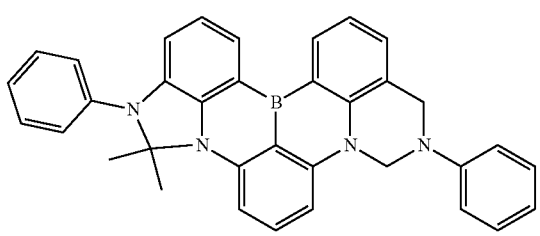
128 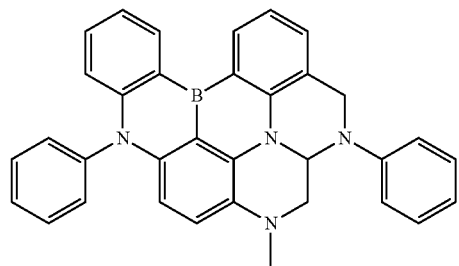
129 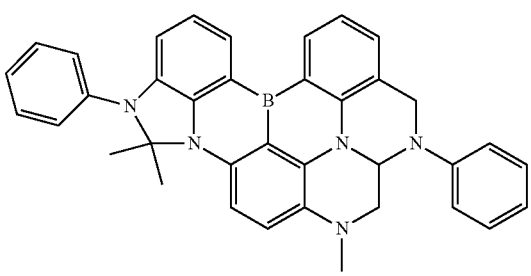
130 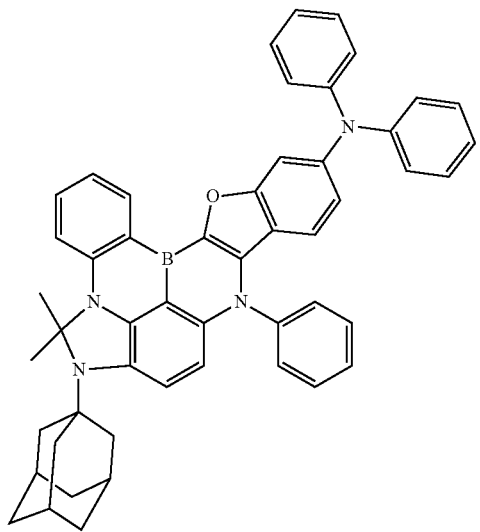
131 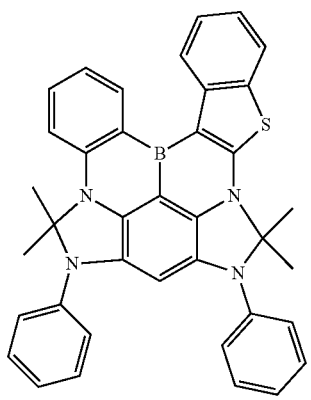
132 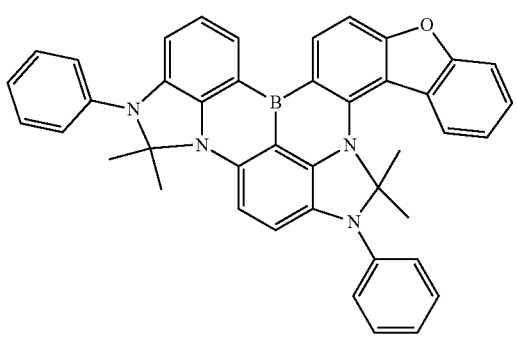

-continued
133
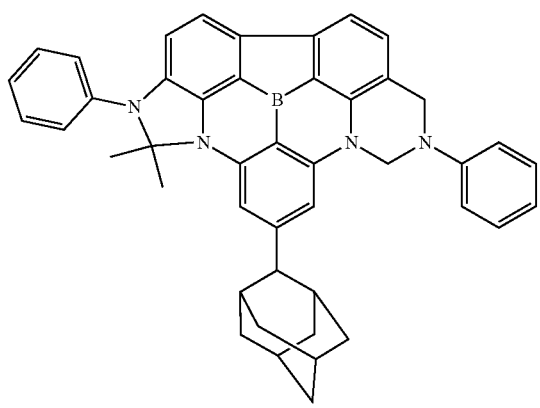
134
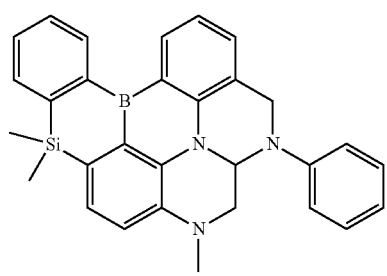
135
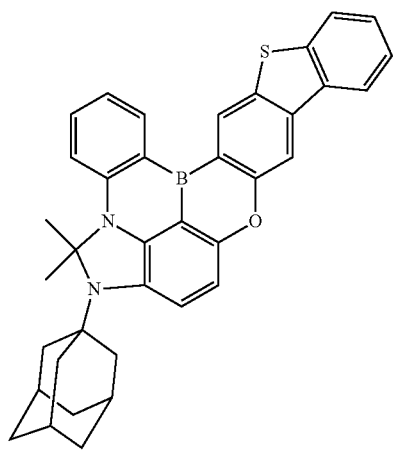
136
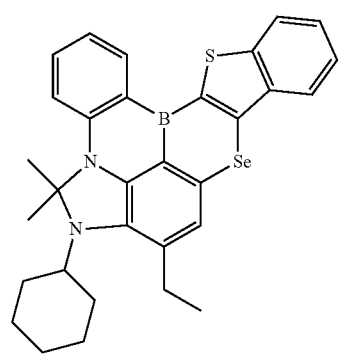
-continued
137
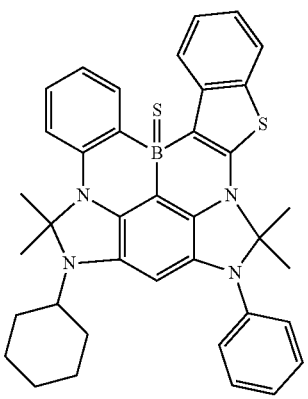
138
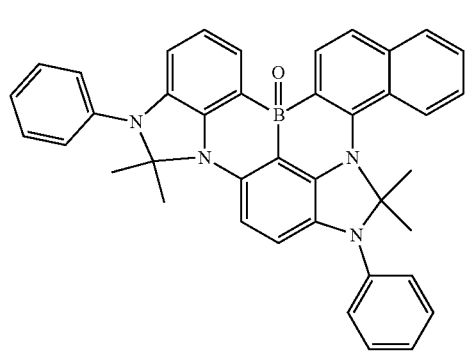
139
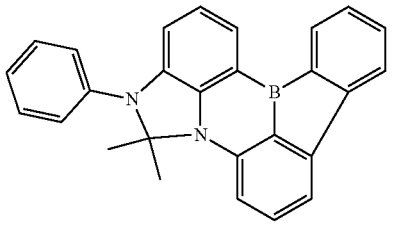
140
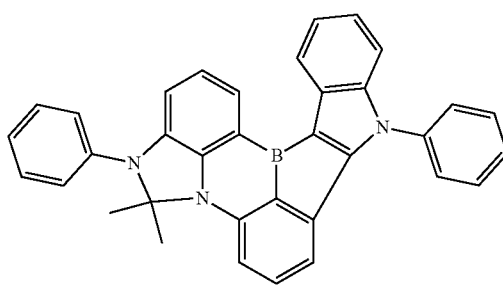
141
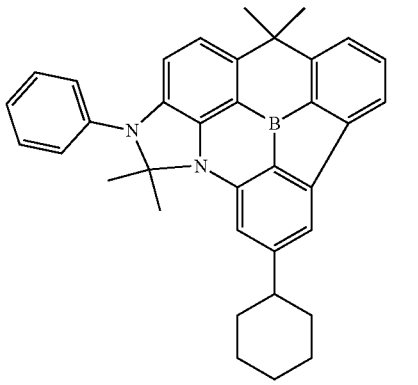

142
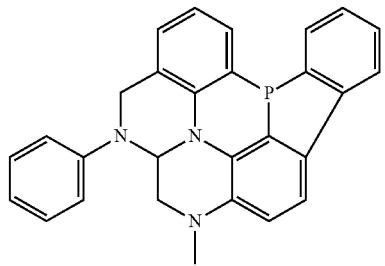
143
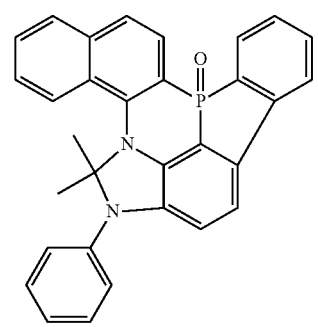
144
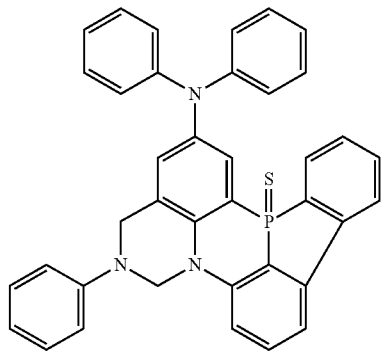
145
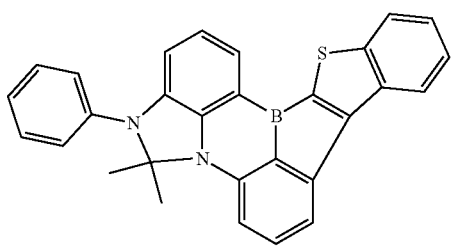
146
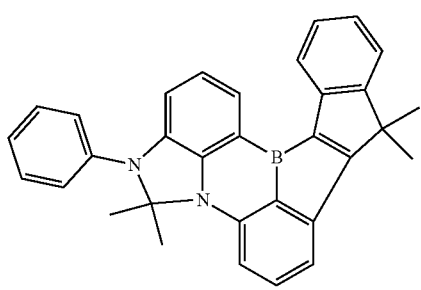
147
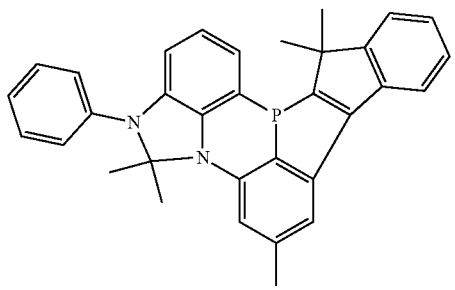
148
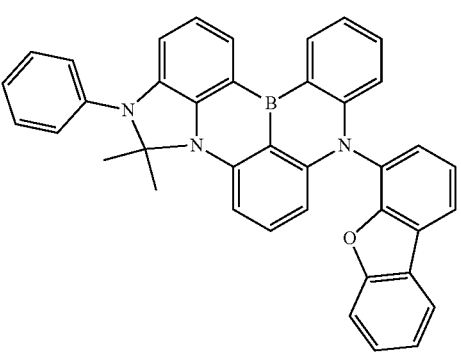
149
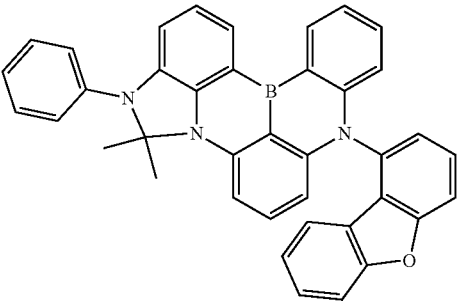
150
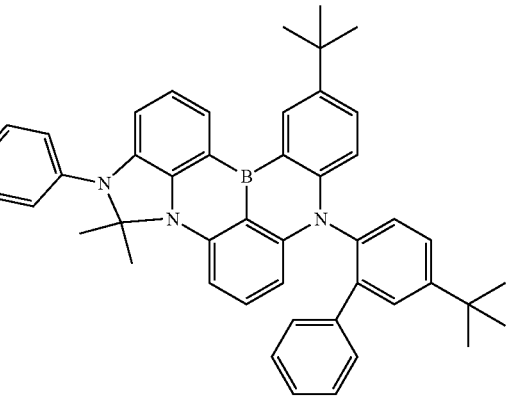

151

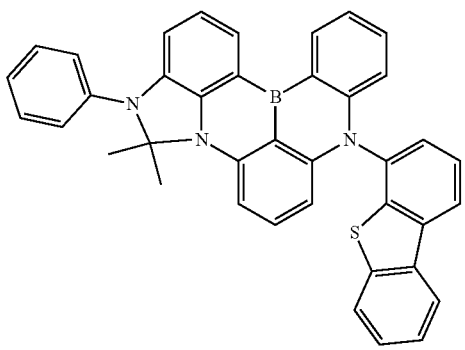

152

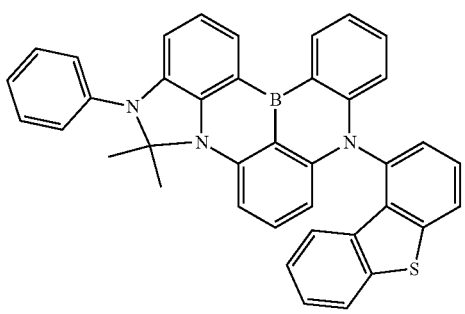

153

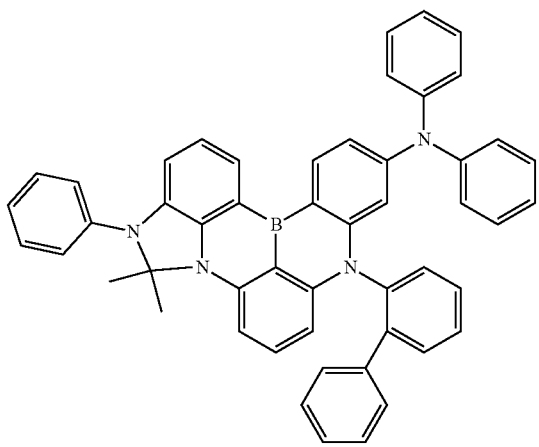

154

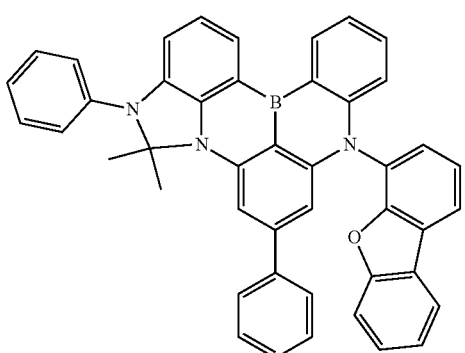

155

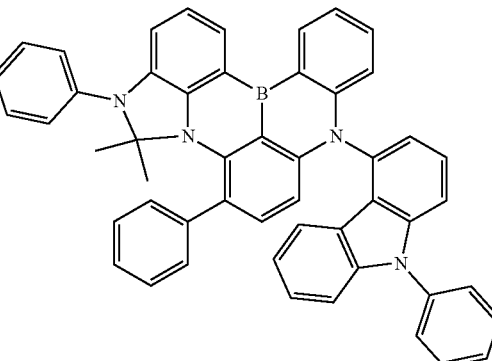

156

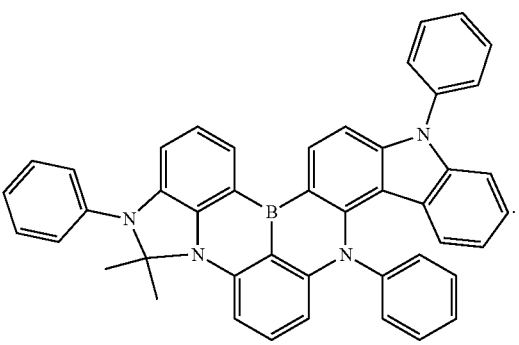

14. An organic electroluminescent device comprising a first electrode, a second electrode, and one or more organic layers interposed between the first and second electrodes wherein one of the organic layers comprises the compound represented by Formula B according to claim 11.

15. The organic electroluminescent device according to claim 14, wherein the organic layers comprise an electron injecting layer, an electron transport layer, a hole injecting layer, a hole transport layer, an electron blocking layer, a hole blocking layer, and a light emitting layer, at least one of which comprises the organic electroluminescent compound represented by Formula B.

16. The organic electroluminescent device according to claim 15, wherein the light emitting layer comprises the organic electroluminescent compound represented by Formula B.

17. The organic electroluminescent device according to claim 14, further comprising a capping layer formed on at least one of the upper and lower surfaces of the first electrode and the second electrode that are opposite to the organic layers, wherein the capping layer comprises the compound represented by Formula B.

18. The organic electroluminescent device according to claim 17, wherein the capping layer is formed on at least one of the lower surface of the first electrode and the upper surface of the second electrode.

19. The organic electroluminescent device according to claim 17, wherein one or more of the layers are formed by a deposition or solution process.

20. The organic electroluminescent device according to claim 14, wherein the organic electroluminescent device is used in a display or lighting system selected from flat panel displays, flexible displays, monochromatic flat panel lighting systems, white flat panel lighting systems, flexible monochromatic lighting systems, and flexible white lighting systems.

* * * * *